United States Patent [19]

Ip et al.

[11] Patent Number: 5,550,997
[45] Date of Patent: Aug. 27, 1996

[54] IN AN INTERACTIVE NETWORK BOARD, A METHOD AND APPARATUS FOR PREVENTING INADVERTENT LOADING OF A PROGRAMMABLE READ ONLY MEMORY

[75] Inventors: Tony K. Ip, Lake Forest; Walter D. Kuver, Laguna Hills, both of Calif.

[73] Assignee: Canon Kabushiki Kaisha, Tokyo, Japan

[21] Appl. No.: 978,491

[22] Filed: Nov. 18, 1992

[51] Int. Cl.$^6$ ........................................... G06F 12/16
[52] U.S. Cl. ...................... 395/430; 364/DIG. 2; 364/965.76; 395/113; 395/200.02; 395/309; 395/490
[58] Field of Search ...................... 395/400, 425, 395/311, 186, 187.01, 200.1, 200.11, 200.06, 113, 200.02, 309, 490, 750, 430; 364/200 MS File, 900 MS File

[56] References Cited

U.S. PATENT DOCUMENTS

| | | | |
|---|---|---|---|
| 4,441,162 | 4/1984 | Lillie | 395/425 |
| 4,751,648 | 6/1988 | Sears, III et al. | 364/422 |
| 4,794,558 | 12/1988 | Thompson | 395/425 |
| 4,797,881 | 1/1989 | Ben-Artzi | 370/88 |
| 5,197,034 | 3/1993 | Fandrich et al. | 365/227 |

*Primary Examiner*—Eddie P. Chan
*Assistant Examiner*—Hiep T. Nguyen
*Attorney, Agent, or Firm*—Fitzpatrick, Cella, Harper & Scinto

[57] ABSTRACT

Method and apparatus for loading a ROM image into PROM comprises loading a ROM image into a dynamic random access memory, verifying the accuracy of the ROM image in the dynamic random access memory, and receiving a command to flash EPROM with the stored ROM image. A hardware interlock mechanism is deactivated by a two-step command procedure so as to enable flashing the EPROM. Specifically, a predetermined bit pattern is written to a first predetermined address on an address bus, one bit being latched to cause a flash signal to be output to a transistor switch and to be pre-loaded at a flip flop. A second predetermined address is read from so as to clock the flip flop. The output of the flip flop closes the transistor switch allowing the flash enable signal to reach the EPROM. The EPROM is erased, after which the ROM image is loaded into the PROM.

27 Claims, 31 Drawing Sheets

IN AN INTERACTIVE NETWORK BOARD, A METHOD AND APPARATUS FOR PREVENTING INADVERTENT LOADING OF A PROGRAMMABLE READ ONLY MEMORY

BACKGROUND OF THE INVENTION

1. Field Of The Invention

The present invention relates generally to a circuit board which is coupled to a local area network peripheral (e.g. a printer) and which allows the peripheral to be an intelligent, interactive network member eliminating the necessity of dedicating a personal computer to manage the peripheral. More particularly, the present invention relates to a method and apparatus for providing an interlock mechanism for preventing inadvertent application of a load enable signal to a PROM, such as when power is applied or disconnected from the board.

2. Related Art

Local Area Networks ("LANs") are known for coupling together a plurality of personal computers with peripheral devices such as printers, copiers, etc., to provide for enhanced communication and shared resources. Heretofore, peripherals such as printers coupled to a LAN were rather unintelligent, merely accepting information from the LAN and printing such information on a hard copy. Moreover, such printers usually required a host personal computer ("PC") to effectively manage the flow of data to the printer, i.e., to act as a "server" for the printer. This almost always required that the host PC be dedicated solely to the printer server task.

A number of products have recently appeared which ostensibly eliminate the need for such a dedicated PC by incorporating hardware and software into a circuit board which may be coupled into the peripheral in order to perform limited server functions. For example, ASP Computer Products, Inc. provides a device known as "JetLAN/P" which acts as a stand-alone print server for Novell networks. The JetLAN/P® device couples to a LAN using a 10Base-2 thin coaxial cable or a 10Base-T twisted-pair cable. However, the JetLAN/P® couples to the printer only through the printer's parallel port. Thus, while print information can be sent to the printer, the amount of printer status information which can be returned from the printer is severely restricted. For example, such a device may obtain "off-line" and "out of paper" status from the printer, but little else. Such a device does very little toward making the printer a truly intelligent, responsive member of the network.

Other known devices for coupling a printer to a LAN include the Hewlett-Packard Jet Direct® C2071A/B and C2059A, the Extended Systems EtherFlex®, the Intel NetPort® and NetPort II®, the Castelle LANPress® and JetPress®, and the MILAN FastPort®. However, all of these devices suffer from the same disadvantages as the ASP JetLAN in that they do not allow the printer to transmit sufficient amounts of data to the LAN to enable the printer to be an effective and intelligent member of the network.

Interactive peripheral devices, as discussed above, may include a processor, a random access memory (RAM) and a programmable read only memory (PROM). Due to recent developments in ROM technology, it is possible to provide interactive peripheral devices with an EPROM which can be electrically erased and electrically reprogrammed. The ability to electrically erase and electrically reprogram is a distinct advantage over the previous technology since PROMs had to be removed from a board, erased with ultra-violet rays and then reprogrammed from a separate programming station.

This advantage of electrically erasing and electrically reprogramming a PROM while on a board has not been entirely welcome. That is, an EPROM can be easily altered by corrupt data sent from a processor during power-up or power-down. That is, since most processors utilized today have a CMOS technology design, these processors continue to process as power dissipates upon power-down or starts to process during power-up with very little power. Because of this, transient data bursts may be sent to the EPROM during either an abrupt power-on or power-down. These transient data bursts can easily corrupt a program stored in an EPROM.

Heretofore, it has not been possible to prevent an EPROM from being loaded with corrupt data. Consequently, when power is removed or applied to a board, a program within an EPROM can be easily altered.

SUMMARY OF THE INVENTION

The present invention overcomes the drawbacks noted above by providing structure and function on a circuit board coupled to a peripheral which will permit the peripheral to be a responsive, intelligent member of a network.

In one aspect, the present invention provides a method for providing a hardware interlock system for preventing inadvertent application of a load enable signal to a PROM. The load enable signal is applied only after a two-step hardware enabling procedure is performed. In the first step, a predetermined bit pattern is written to a first address, and in the second step a read is performed from a second address. According to this aspect of the invention, a method for loading a ROM image into PROM comprises the steps of loading a ROM image into a DRAM disposed on an interactive network board, verifying the integrity of the ROM image in DRAM, receiving a command to load the PROM, writing a predetermined bit pattern to a first address and reading from a second address so as to enable a write signal on the PROM, erasing the PROM, and loading the ROM image into the PROM.

According to another aspect of the invention, an apparatus for loading a ROM image into a PROM comprises an address bus, a data bus, and a PROM connected to the address bus and the data bus, the PROM including a load enable input. A transistor switch switchably provides a load enable signal to the load enable input of the PROM. A flip flop controls switching actuation of the transistor switch. In response to a first address on the address bus, a latch latches at least one bit from the data bus, the latch pre-loading the flip flop with the latched bit. A DC/DC converter which is responsive to the latch latching a predetermined bit pattern provides a load enable signal to the transistor switch. A decoder responsive to a second predetermined address on said address bus clocks the flip flop. A processor outputs the predetermined bit pattern to the first output address, accesses the second output address, erases the PROM, and loads the ROM image into the PROM.

BRIEF DESCRIPTION OF THE DRAWINGS

The above-noted advantages and features of the present invention will become more readily apparent from the following detailed description of the preferred embodiments when taken in conjunction with the Drawings in which.

DETAILED DESCRIPTION OF THE PREFERRED EMBODIMENTS

In its general aspects, the present invention provides hardware and software solutions for making a network peripheral, such as a printer, an interactive network member capable not only of receiving and processing data received from the network, but of transmitting to the network significant amounts of data such as detailed status information, operational parameters, and even data input to the peripheral through other modalities such as scanning, facsimile reception, etc. By integrating such hardware and software with the peripheral, it is possible to eliminate the requirement for dedicating a personal computer to the peripheral to act as a peripheral server.

1. ARCHITECTURE

Figure 1:
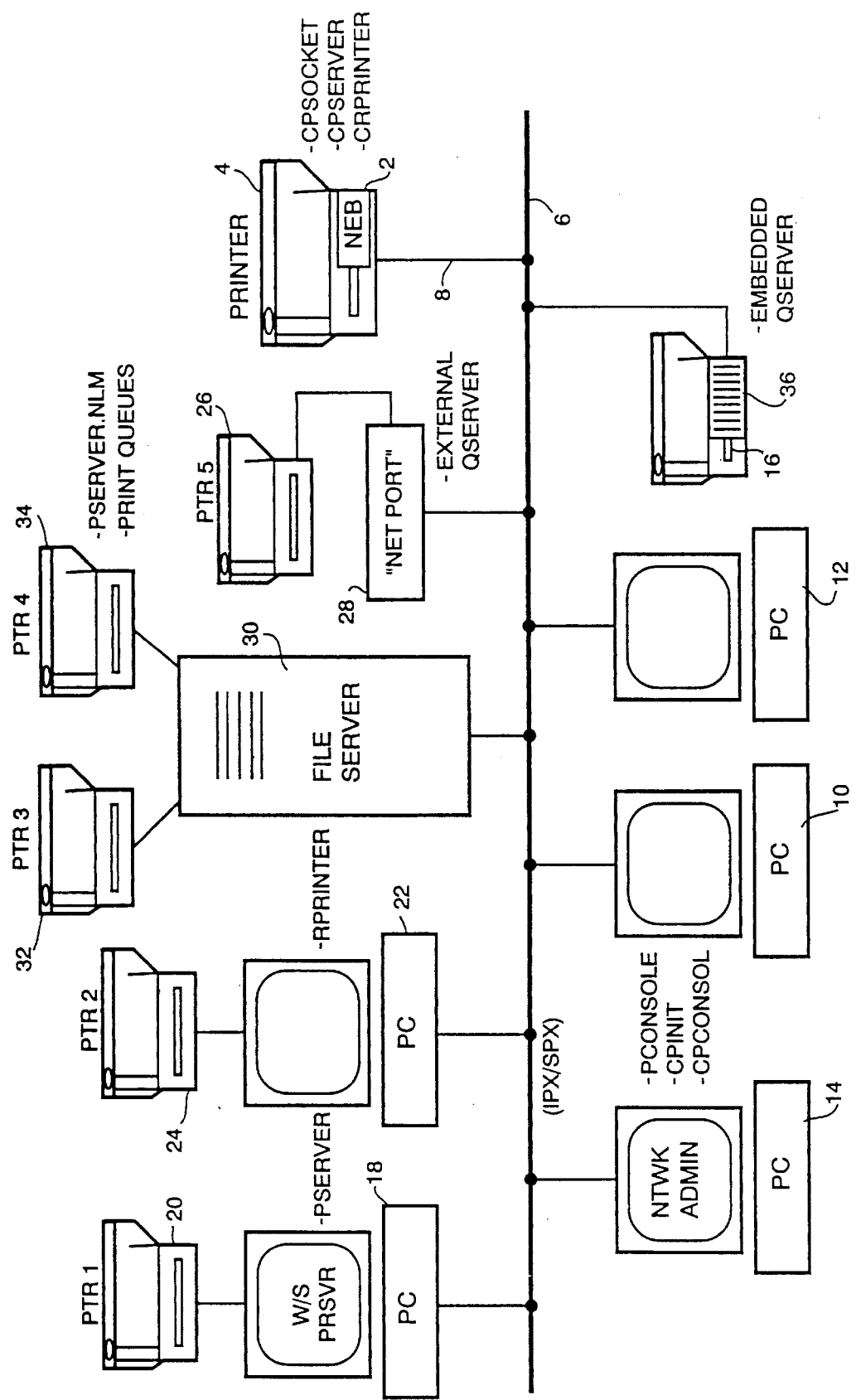
FIG. 1 is a block diagram of a Local Area Network according to the present invention.

FIG. 1 is a block diagram showing the present invention incorporated into a Network Expansion Board ("NEB") 2 coupled to a printer 4 which has an open architecture (to be discussed below). The NEB 2 is coupled to the LAN bus 6 through a LAN interface 8, for example, Ethernet interfaces 10Base-2, 10Base-T, or 10Base-5, respectively, with a Coax connector, an RJ45 connector, or a DB15 connector (AUI). Also coupled to the LAN 6 may be such network members as PC 10, PC 12, PC 14 (which in this case acts as the network administrator if the administrator has logged in at that PC; to be discussed below), and a printer 16 (with embedded QSERVER functionality; also to be discussed below). Other LAN members may include PC 18 (acting as a print server; to be discussed below) with attached printer 20, PC 22 (acting as an RPRINTER; to be discussed below) with attached printer 24, and printer 26 which is coupled to the LAN 6 through a NetPort device 28 (discussed in the Background of the Invention above). A file server 30 is coupled to the LAN 6 and serves as a "library" for files to be transmitted and processed on the LAN. The file server 30 may have attached printers 32 and 34.

In more detail, the network depicted in FIG. 1 may utilize any network software such as Novell or Unix software in order to effect communication among the various network members. The present embodiments will be described with respect to a LAN utilizing Novell NetWare® software (to be discussed in greater detail in section 3a below) although any network software may be used. A detailed description of this software package may be. found in the publications "NetWare® User's Guide" and the "NetWare® Supervisor's Guide" by M&T Books, copyrighted 1990, incorporated herein by reference. See also the "NetWare® Print Server" by Novell, March 1991 edition, Novell Part No. 100-000892-001. Briefly, the file server 30 acts as a file manager, receiving, storing, queuing, caching, and transmitting files of data between LAN members. For example, data files created respectively at the PCs 10 and 12 may be routed to the file server 30 which may order those data files and then transfer the ordered data files to a printer 24 upon command from a print server in PC 18. The file server 30 may include or may be coupled to a large capacity storage member such as a 10 Gigabyte hard disk subsystem. Furthermore, the printers 32 and 34 may be coupled to the file server 30 to provide additional printing stations, if desired.

While personal computer equipment is illustrated in FIG. 1, other computer equipment may also be included, as appropriate to the network software being executed. For example, Unix workstations may be included in the network when Unix software is used, and those workstations may be used in conjunction with the illustrated PC's under appropriate circumstances.

PCs 10 and 12 may each comprise a standard work station PC capable of generating data files, transmitting them onto the LAN, receiving files from the LAN, and displaying and/or processing such files at the work station. The PCs 10 and 12, however, are not capable of exercising control over LAN peripherals (unless the network administrator is logged into that PC).

A PC capable of exerting limited control over LAN peripherals is PC 22 which includes an embedded RPRINTER program. The RPRINTER program is a MS-DOS Terminate and Stay Resident ("TSR") program which runs on a work station to allow users to share the printer 24 connected to the work station. RPRINTER is a relatively unintelligent program that does not have the ability to search printer queues for work. RPRINTER gets its work from a PSERVER (to be discussed below) that is running elsewhere in the network. Because they communicate with the attached printer over the printer's parallel port, RPRINTERs are able to obtain only limited status and to return that status information to the responsible PSERVER over the LAN 6. From a control standpoint, an RPRINTER allows stopping of a print job and little more. Some printers include RPRINTER features by offering internal or external circuit boards that provide the same limited features of the RPRINTER TSR program running in a personal computer.

Another network entity capable of exercising limited control over LAN peripherals is a printer 16 with attached circuit board 36 having an embedded QSERVER program. Here, the QSERVER program runs inside an HP LaserJet III® SI printer, and has the capability of searching the file server 30 print queues for eligible print files. The QSERVER's search queues cannot be dynamically altered nor does the QSERVER respond to any form of status inquiry. The benefit of the QSERVER is its ability to autonomously search for work. The QSERVER does not require a PSERVER running elsewhere in the system to feed it work. Since the QSERVER does not have a corresponding PSERVER and it does not itself have any status and control capabilities, it offers less control than even the RPRINTER. A QSERVER also differs from a PSERVER in that it has extremely limited notification features and cannot print banners at the beginning of each print job.

Another network member having a QSERVER capability is printer 26 which is coupled to the LAN 6 through an external NetPort device 28.

Other peripheral server programs may be executed to service various peripherals, such as scanners, copiers, facsimiles etc., and servers may also be provided based on network software protocol such as a Unix-compatible Line Printer Remote server ("LPR").

A LAN member capable of exercising significant control over LAN peripherals is the PC 18 having a PSERVER program embedded therein. PSERVER has the ability to service multiple user-defined print queues, perform dynamic search queue modification, and provide defined notification procedures for exception (failure) conditions and status and control capabilities. PSERVER is provided in several forms. PSERVER.EXE is a program that runs dedicated on a work station and controls both local and remote printers. The local printers can be connected to either serial or parallel ports, and the remote printers are printers running elsewhere in the system. Two other forms of the PSERVER program are the PSERVER.VAP and the PSERVER.NLM. These are PSERVER versions that run on the file server 30 itself. The .VAP version is for NetWare® 286, and the .NLM version is for NetWare® 386. While the PSERVER provides much more capability than the RPRINTER and QSERVER, one of its drawbacks is that the .EXE version requires a dedicated personal computer.

A dedicated personal computer running PSERVER.EXE can control as many as 16 local/remote printers and can request print information from many file server queues. However, there are several drawbacks to relying on PSERVER to control network printing services. The first drawback is that multiple printer streams must all be funnelled through a single network node and personal computer processor. This can become a bottleneck. The second drawback is that for the most efficient operation, the printers should be connected to the computer locally, as with the printer 20. This can be an inconvenience for users since it requires the printers to be clustered around PC 18. The third drawback is that if the controlled printers are remote as in the case of printer 24 which is serviced by RPRINTER, then the print data must make the trip from the file server 30 to the PSERVER PC 18 and then be retransmitted to the printer running RPRINTER. This is inefficient.

The fourth drawback is the limited amount of printer status and control information offered through PSERVER. It has already been stated that RPRINTER does not allow for much more than rudimentary status such as "out of paper" and "off line". PSERVER itself for locally and remotely connected printers does not offer much more than this because it was designed with consideration of the limitations of the personal computer parallel port. The PSERVER program also allows for its own status and control.

The Network Expansion Board 2 installed in the printer 4 provides many advantages and enhanced flexibility over the network peripheral control entities discussed above. In particular, the NEB-embedded controller offers RPRINTER, PSERVER and LPR (Line Printer Remote) functionality (through CRPRINTER, CPSERVER and CLPR programs to be discussed in section 3d below). There is an initialization program named CPINIT (to be discussed in section 4h below) which allows the network administrator's PC 14 complete control over the configuration of NEB features. Due to its embedded nature and the open architecture of printer 4, the NEB will have the ability to offer a wide variety of status and control features to the network. That is, verbose amounts of status information may be provided from the printer 4 to the LAN 6, and a great deal of control information may be provided from the LAN 6 to the printer 4 (for example, exercising printer front panel functions from the PC 14).

To access the extended amount of information available in the NEB, a program called CPCONSOL is resident in the network administrator's PC 14 and allows the system administrator to view all of the printer information which is exported from the printer 4 by the NEB 2. The printer information is available even if the RPRINTER functional configuration (CRPRINTER) of the NEB 2 is selected. The PSERVER functional configuration (CPSERVER) of the NEB 2 will control the printer 4 that contains the board. This option will have all of the standard PSERVER queue search capabilities as well as the notify and status features. All of these features can be dynamically controlled from a remote work station. The NEB environment and its ability to export extended status and control information from the printer 4 makes the combination of the NEB 2 and the printer 4 much more powerful than the standard RPRINTER, QSERVER, or PSERVER print methodologies currently available.

The CPCONSOL program (to be discussed in greater detail in section 4i below) provided in the network administrator's PC 14 is capable of interfacing with the NEB 2 (and other network members) to perform such functions as displaying current information for a selected network device (interface information, control information, font information, layout information, quality and common environment information, duplex information, and miscellaneous information). CPCONSOL is also capable of setting or modifying the safe (default) condition of a network device. CPCONSOL may also activate or deactivate applications of the NEB 2 such as CPSERVER or CRPRINTER (to be discussed below, but generally similar to the PSERVER and RPRINTER software packages discussed above). Furthermore, the CPCONSOL enables the PC 14 to display a log file, clear the log file, or write the log file to memory such as a local or a file system disk. CPCONSOL can also display such printer-related information on PC 14 as the number of jobs, the number of pages per job, the number of pages per minute, the time per job, the number of total pages per day, the number of total jobs per day, and the number of days. The CPCONSOL program is also capable of displaying on the PC 14 such network-related information as media related and non-media related information, and of clearing such network statistics.

The CPINIT program (to be discussed in greater detail in section 4h below) resident in the network administrator's PC 14 can set up application information print services such as CPSERVER and CRPRINTER and configure those applications. CPINIT is also capable of setting and/or displaying device information such as time/date/time zone, buffer size, disk size, logging flag, log limit, and a safe (default) environment flag. CPINIT can also restore default service headings, reset the NEB 2, reboot the NEB 2, command a font download, command an emulation download, display a NEB power-on-self-test ("POST") error, display the NEB 2 firmware level, display the current log file size, etc.

By providing the NEB 2 with PSERVER and RPRINTER capabilities, the present invention achieves, with a single circuit board, enhanced functionality for the printer 4 with respect to the LAN 6. Therefore, the printer 4 is a true "networked" printer and not just a printer connected to a network.

Figure 2:
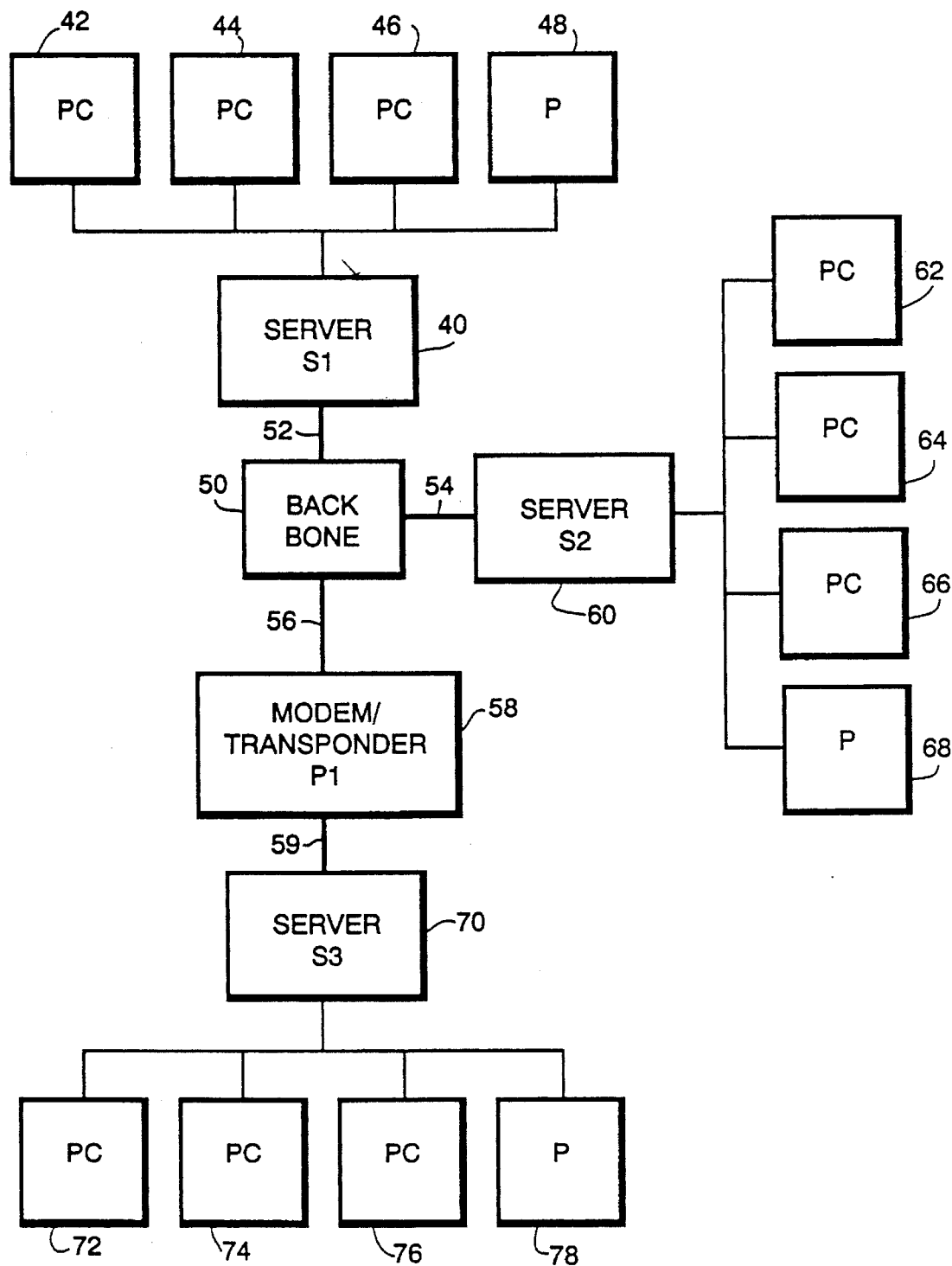
FIG. 2 is a block diagram of a plurality of Local Area Networks coupled together.

While the present invention offers unique advantages on the LAN 6, these advantages are also realized when the LAN 6 is coupled to one or more other LANs in a Wide Area Network ("WAN"). FIG. 2 depicts such a WAN which includes a first LAN 41 including a server S1 40, PC's 42, 44, and 46, and a printer 48. The server S1 40 is coupled to a backbone 50 over a bus 52. The backbone 50 is nothing more than an electrical connection between a plurality of buses. Also connected to the WAN is a second LAN 61 comprising server S2 60, PC's 62, 64, and 66, and a printer 68. Server S2 60 is coupled to backbone 50 over bus 54.

The WAN may also include a remote LAN 71 comprising server S3 70, PC's 72, 74 and 76 and a printer 78. Since the LAN 71 is remote from the remainder of the system, it is coupled to backbone 50 through a bus 56, a transponder (which may include a modem) 58, and a communication line 59.

In such a WAN, assume that PC 42 is a PSERVER requesting the use of printer 78. If the printer 78 is equipped with a NEB according to the present invention, a direct communication link can be established between the PC 42 and the printer 78 whereby job information can be sent to printer 78, and status and control information can be sent from printer 78 to the LAN 41. Therefore, the NEB according to the present invention achieves its enhanced functionality even when installed in a peripheral coupled to a WAN.

Figure 3:
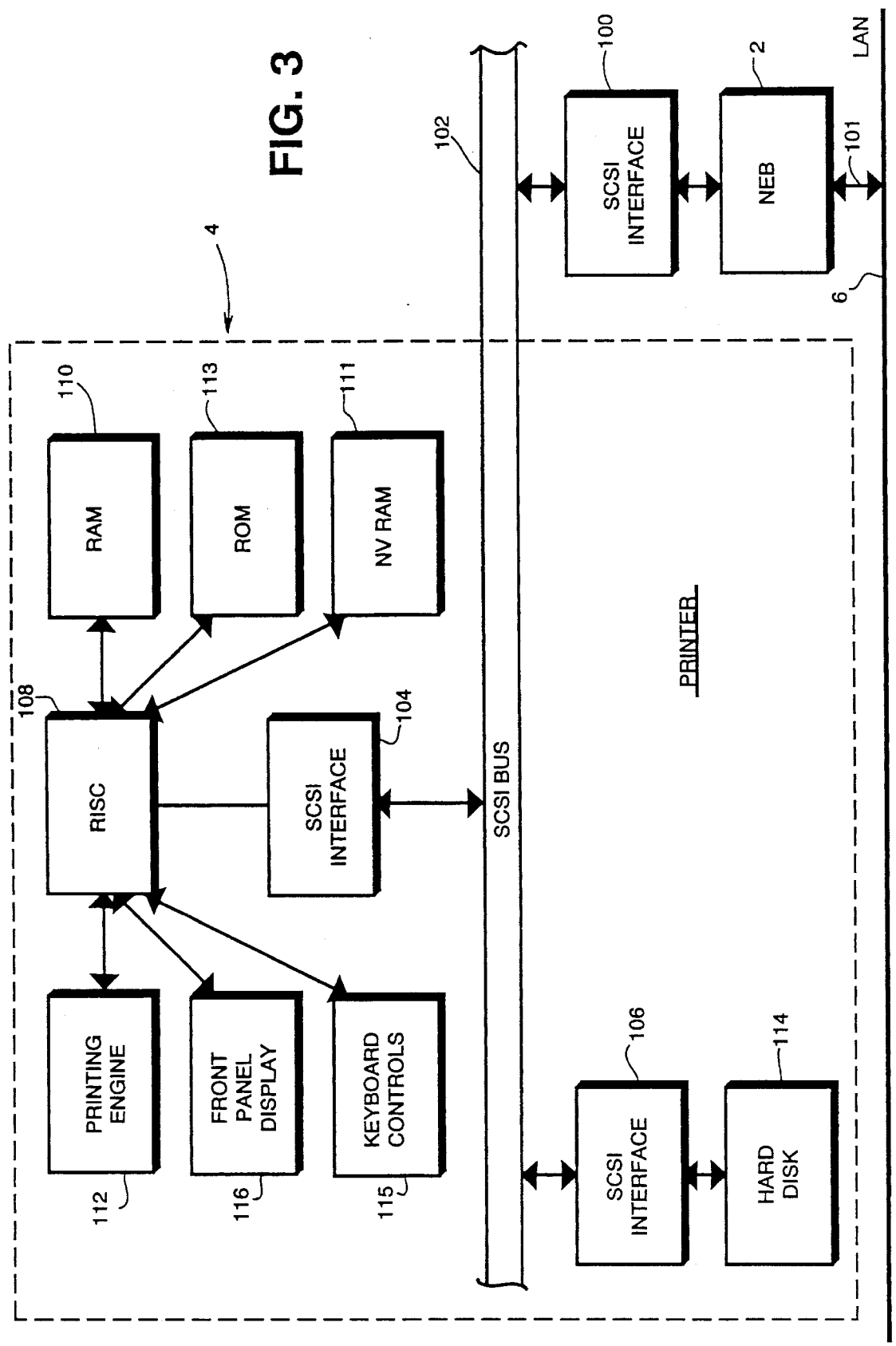
FIG. 3 is a block diagram showing the Network Expansion Board according to the present invention coupled between the Local Area Network and the printer.

FIG. 3 is a block diagram depicting the connection of the NEB 2, according to the present invention, with the printer 4 and the LAN 6. The NEB 2 is directly connected to the LAN 6 via LAN interface 101, and also to the printer 4 via a bi-directional interface, here a Small Computer System Interface ("SCSI") 100. The SCSI interface 100 is coupled to an SCSI bus 102 of the printer 4.

The NEB can also service additional SCSI devices, such as other printers (RPRINTERs) or other peripherals, daisy-chained on the SCSI bus using standard SCSI connectivity protocol. Also, the NEB may be used to drive other peripherals across the LAN itself.

The printer 4 is preferably an open-architecture printer including the SCSI bus 102 and SCSI interfaces 104 and 106. Printer 4 also includes a processor 108 such as a REDUCED INSTRUCTION SET COMPUTER ("RISC") which communicates with a RAM Memory 110 and with a printing engine 112 which actually drives the printing mechanism. The RISC processor also communicates with NVRAM 111 for storing information which needs to be maintained between power cycles, such as user-defined information, and with ROM 113 from which RISC processor 108 executes printer control. The printer 4 may also include a hard disk 114 capable of holding large amounts of data in a non-volatile way. Printer 4 also has a front panel display 116, and a keyboard 115 for inputting control commands to the printer.

Preferably, the printer 4 includes an open architecture which takes advantage of the bi-directional nature of the SCSI interface 100 to provide a great deal of status (and other) information from the printer 4 to the LAN 6 via the NEB, and also to allow fine control of the printer from a remote location. For example, such open architecture when used with the bi-directional SCSI interface permits most or all of the information on the front panel display 116 of printer 4 to be exported to a remote location, and also permits most or all of the control functions of the printer front panel keyboard 115 to be activated from the remote location.

Briefly, the open-architecture printer 4 comprises four major subsystems: Communication; Job Pipe; Page Layout and Raster functions; and Systems Services. The Communication subsystem handles the different communication devices and initiates the start of a job application. When the printer starts to receive data, the Communication subsystem sends the first part of the incoming data to each emulator for examination. The first emulator that can process the data becomes the Job Pipe driver. The system then constructs a Job Pipe to process the data (data flows into one end of the pipe, and page images flow out of the other end). This Job Pipe comprises many segments one of which is the Job Pipe driver.

The Job Pipe subsystem has a Pipe driver segment (the application for an emulator) and input and output segments. The input and output pipe segments have at least two other segments: for input, source and source filter segments; and for output, an output filter and a data sink. The input segment of the Communication subsystem delivers the input data which can be supplemented by information from a file system. The Pipe driver processes input and supplemental data. It also generates imaging commands and page layout information that it sends to the output segment. The Pipe driver may store this information to the printer disk (if present). The output segment sends this data to the Page Layout and Raster subsystem.

The Page Layout and Raster subsystem takes the imaging and page layout information and converts it to a raster image for the print engine 112. This section operates completely separately from Job Pipe.

The System Services subsystem provides file system access, console access, font services, basic system services, and image generation services. Therefore, a printer 4 having such an open architecture will take full advantage of the intelligent, interactive NEB 2 to provide increased functionality to the printer 4 and the entire network.

2. HARDWARE

Figure 4:
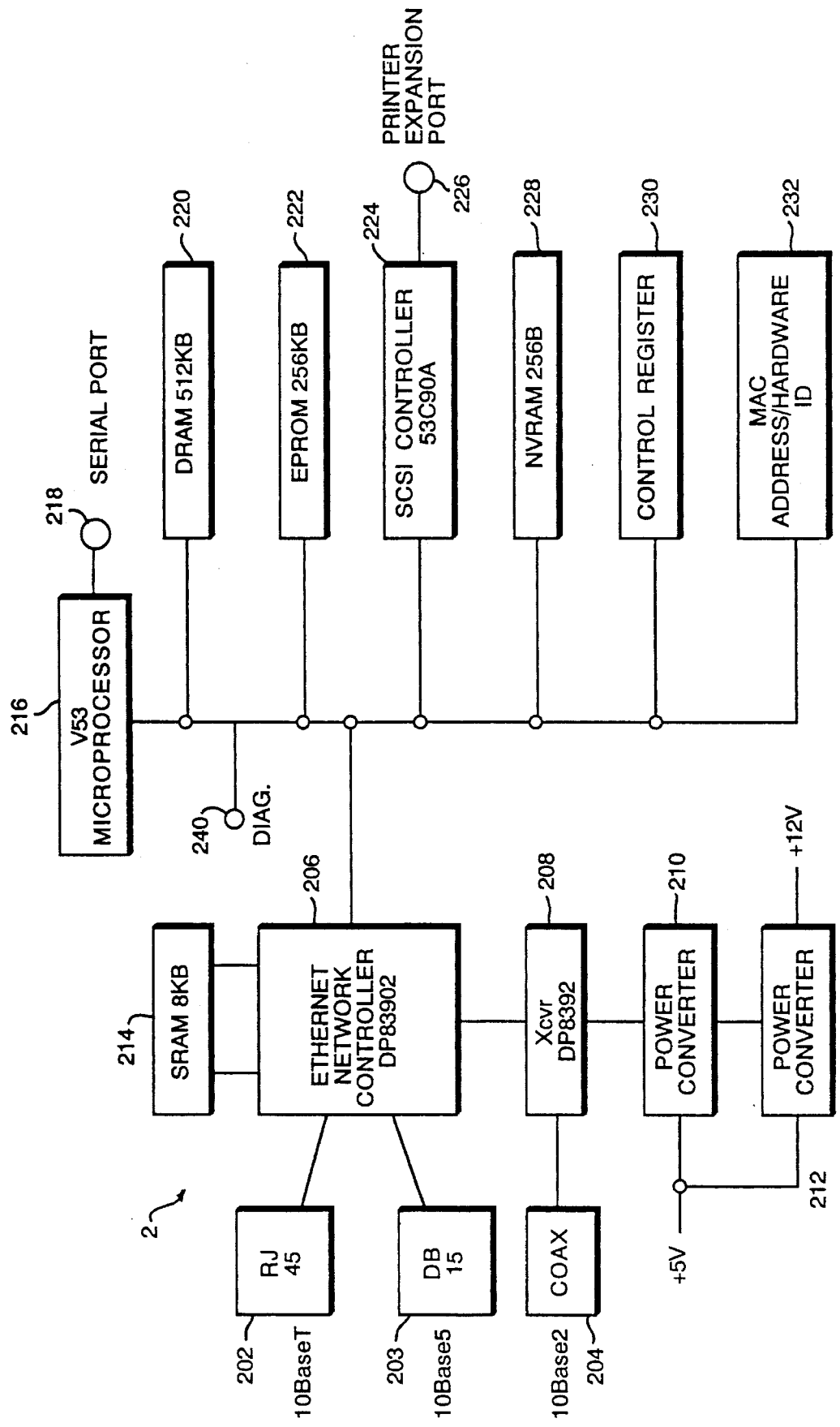
FIG. 4 is a block diagram of the Network Expansion Board according to the present invention.

FIG. 4 is a block diagram of the NEB 2 showing the major components thereof. The NEB 2 is coupled to the LAN 6 through network connectors 202, 203, and 204. Preferably, the connector 202 is an RJ45 capable of accepting a 10Base-T connection. The connector 203 may comprise a DB15 connector for accepting a 10Base-5 connection, while the connector 204 may be a simple Coax connector capable of accepting a 10Base-2 connection. All of the connectors 202, 203, and 204 are coupled to a network controller 206 (preferably an Ethernet Network Controller). However, the connector 204 is first coupled through a transceiver 208.

Power is supplied to NEB 2 from a +5V power source in printer 4 through the printer expansion port 226. The +5V power is also provided to the power converters 210 and 212. The power converter 210 provides −9V power to transceiver 208, while the power converter 212 provides +12V power for "flashing" (loading; to be discussed in section 4q below) the EPROM 222. Also, the network controller 206 is coupled to an 8 KB static RAM 214.

The heart of the NEB 2 is a microprocessor 216, preferably an NEC V53. The microprocessor 216 is coupled to a serial port 218, currently used for testing. Also coupled to the microprocessor 216 are a 512 KB dynamic RAM 220, a 256 KB flash EPROM 222, an SCSI controller 224 (corresponding to SCSI interface 100 of FIG. 3) a printer expansion port 226, a diagnostics/failure LED 240, a 256 Byte non-volatile RAM 228, a control register 230, and a PROM 232 which stores the Media Access Control ("MAC") address which is the unique name for every EtherNet board.

The architecture of the NEB 2 provides an advantage in that it has unique support features for administration and management of large, multi-area networks. These support features include, for example, printer control and status monitoring from a remote location on the network, (i.e., from the network administrator's office), automatic management of printer configuration after each print job to provide a guaranteed initial environment for the next user, and logs of printer usage statistics accessible across the network for characterizing printer workload and scheduling toner cartridge replacement. A key parameter in the NEB design is the ability to access the printer control state from the NEB 2 through a bi-directional interface, here the SCSI interface 100. This allows the printer console information to be exported to the NEB or to an external network node for the programming of many useful printing support functions.

Table 1 below provides a description of the functions, implementation, and operational notes with respect to the major hardware elements of NEB 2.

TABLE 1

| Function | Implementation | Notes |
| --- | --- | --- |
| Network Controller (206) | National DP 83902 | With DP8392 Coax Transceiver |
| Ethernet Interfaces: | 10Base-2 (202) | Coax connector |
| | 10Base-T (204) | RJ45 connector |
| | 10Base-5 (203) | DB15 connector |

TABLE 1-continued

| Function | Implementation | Notes |
| --- | --- | --- |
| | | (AUI) |
| Embedded Processor (216) | NEC V53 | 16-bit/16Mhz MPU with DMA, timers, Interrupts |
| EPROM (Flash) (222) | 256K Bytes | Network program code, board BIOS (Basic Input Output Subsystem), diagnostics |
| NVRAM (220) | 256 Bytes | Printer Installation Configuration on Network |
| DRAM (220) | 512K Bytes | Code execution and data buffering for exp.port |
| SRAM (214) | 8K Bytes | Buffering of incoming Ethernet packets |
| SCSI Controller (224) | NCR 53C90A | 30-pin, internal I/F configuration with power |
| MAC Address and Hardware ID PROM (232) | 32 Bytes | Stores MAC address and Hardward ID information |
| Board Size | 100 mm × 125 mm | Type 2 EXP-I/F PCB, double-sided SMT |
| Power | 5vdc, 710 ma | DC converter on board for Ethernet +12vdc/−9vdc |

Preferably, the NEB 2 is installed inside the printer 4 in an expansion or options slot. The NEB 2 is thus an embedded network node with the processing and data storage features described above.

The microprocessor 216 implements a data link layer of network packet transmission and reception. Network data transfer overhead is minimized through the use of a dedicated static RAM packet buffer 214 managed directly by the network controller 206. The microprocessor 216 accesses blocks of SRAM packet data and network messages through the network controller 206, and moves them into the large DRAM memory 220.

Blocks of print image data and control information are assembled by the microprocessor 216 for transmission to the printer 4 by the SCSI controller 224 using the SCSI transfer protocol of the printer expansion port. Likewise, printer status information is transferred from printer 4 back to the NEB 2 in SCSI block format. The SCSI controller 224 operates concurrently with the network controller 206 for increased data throughput for overall NEB performance.

The microprocessor 216 is preferably an NEC V53 chip which is a fast, highly-integrated microprocessor with a 16-bit Intel-compatible processor in support of Direct Memory Access ("DMA"), interrupt, timers and DRAM refresh control. Data bus structure on the NEB 2 is implemented 16-bits wide to take advantage of the 8-Bit/16-Bit dynamic bus sizing during microprocessor I/O transfers. Control firmware and printing application software for the microprocessor 216 are stored on the NEB 2 in EPROM 222. After power-on self-test, the firmware code is selectively moved to the higher-performance DRAM 220 for actual execution. Network and printer configuration parameters are written into NVRAM 228 when the printer is first installed onto the network. Thus, NVRAM 228 allows the NEB software to recover the installation parameters after printer power has been cycled off and on.

3. SOFTWARE

Software for the LAN comprises a combination of network software, and NEB-customized software such as NEB-embedded software and software resident on the network administrator's PC.

3a. Network Software

In the present embodiment, NetWare® network software is used to manage interactions between nodes of a network such that the client work stations can share and receive services from server nodes such as disk file servers, database servers, print servers, etc. NetWare® itself is a combination of software modules running on these server nodes and on each work station node. At least one file server may be provided in a Novell network. NetWare® runs as the operating system for the PC of the file server to provide basic network core services and utilities. File servers can connect to more than one LAN by using up to four network interface cards (preferably Ethernet or Token Ring connections). In these configurations, "bridging" or "backbone" services are provided between a plurality of LANs, as shown in FIG. 2, such that resources, including printers, can be shared "internet" i.e., from one LAN to another.

On work stations, NetWare® runs in cooperation with the work station operating system (DOS or OS/2) as a NetWare® "shell" of control software. This shell has the effect of extending the services of the workstation operating system onto the network to make network resources appear local to the work station.

Novell PSERVER software has the job of controlling a group of printers (up to sixteen) in order to service printing requests from network nodes. Requests are structured in a form of print queues that are held on the network file server using network queue management services. Queue entries contain a list of files to be printed. The files contain data to be printed such as tabs, formfeeds, and other Printer Description Language ("PDL") commands. Several queues can be serviced by a single PSERVER.

Standard Novell servers are available in different versions depending on the type of network node they are to execute on. Print server programs can reside on the file server itself. A version of print server software may also be loaded on a stand-alone DOS station node to make that node a dedicated print server.

By providing print server functionality (CPSERVER) to NEB 2 of the present invention, the NEB and attached printer will offer all the printing services of a standard Novell print server without the need for an attached PC.

Printers themselves are considered to be either "local" or "remote". A local printer is one that is physically connected to the print server node. In the case of the NEB 2, the local printer is the printer housing the NEB. A remote printer is managed by RPRINTER programs running in the PCs they are connected to. RPRINTERs receive print data from PRINTSERVERS running elsewhere on the LAN. The NEB 2 of the present invention can be provided with RPRINTER functionality (CRPRINTER) to offer its printer as a network remote printer. In this mode, it is fully compatible with standard versions of Novell print servers.

Novell NetWare® provides a number of print utilities to configure and control file server or work station-based print servers and their attached printers. The Novell program PCONSOLE is a menu-driven utility that allows a user (the printer console operator) to create a new print server, configure up to sixteen local or remote print ports, create print queues, assign queues to printers, and start/stop printer and server operations.

3b. NEB-Customized Software

The NEB 2 is bundled with software modules that implement the full range of printing services offered by NetWare®. This includes external NetWare®-compatible modules that execute on work station nodes of the network in addition to internal NetWare®-compatible modules running on the NEB 2 inside the printer. The specific NetWare®-compatible programs developed for use with the NEB 2 (e.g., the customized CPSERVER and CRPRINTER programs to be discussed below) are provided with the same general operational interfaces as standard printing modules from Novell so as to be familiar to Novell users and network administration personnel. The customized versions include functional extensions that make use of the open architecture of the printer 4 to enhance print service management across the network.

Table 2 shows the functions, implementations, and operational notes for the customized software developed for the NEB.

TABLE 2

| Function | Implementation | | Notes |
| --- | --- | --- | --- |
| NEB-specific functions in NEB EPROM | CPSERVER | (92KB) | Customized Print Server |
| | CRPRINTER | (40KB) | Customized Remote Printer |
| NEB-to-Network communication in NEB EPROM | CPSOCKET | (30KB) | Concurrent multiprotocol operation |
| NEB Environment in NEB EPROM | | (15KB) | Monitor, loader, POST, etc. |
| Extensions to NetWare ® | CPCONSOL.EXE | (180KB) | Remote Control & Stats, Auto- |
| PCONSOLE for Printer Control/Configuration in Administrator's PC 14 | CPINIT.EXE | (120KB) | Reconfiguration, Print Job Logs/Statistics |

3c. NEB-Embedded Software

The software developed for the NEB 2 includes software embedded in the NEB and software loaded into the network administrator's PC 14. The NEB-embedded software provides both the NetWare®-compatible node and NetWare®-compatible print services directly inside the printer 4 without the overhead of a work station PC and its DOS operating system. The NEB-embedded software comprises a plurality of application modules (CPSERVER, CRPRINTER, etc.), real-time service modules, network protocol stacks, and a MONITOR program which performs application switching, process extension, device semaphores, and shares bufferpool management. The functionality of the NEB is determined by the types of application modules and the number of protocol stacks of network layered communication software that are configured into the NEB 2. Interaction between the printer 4 and the network is coordinated by the MONITOR program which responds to real-time events while allocating NEB processing time to each application module on a multi-tasking basis.

The NEB software functions at two layers: a "run-time" or real-time layer; and a "soft-time" or applications layer. The run-time layer is comprised of components of NEB software that respond to microprocessor interrupts. This layer services devices such as a timer, queued data transfer requests from the SCSI port, or LAN data through the protocol stack routine, and the CPSOCKET (to be discussed in section 4j below) communication mechanism.

The soft-time layer is arbited and controlled by the MONITOR program (to be discussed in section 41 below) which gets control of the NEB microprocessor 216 after all real-time events have been serviced. A non-preemptive (cooperative multi-tasking) approach is used to divide the processor between the various application modules that are loaded such that no one application module can preempt other modules by capturing the microprocessor.

The NEB EPROM 222 contains up to 256 KB of application module programs and NEB initialization code. At power-up or during a programmed reset, the NEB 2 executes a POST from the EPROM 222 before selectively transferring its EPROM code to NEB DRAM 220. If the POST is successful, the NEB 2 will load its protocol stacks and application modules into DRAM, and begin execution of its application modules.

In its basic configuration, the NEB 2 contains NetWare®-compatible application modules comprising embedded versions of two configurations: the Customized Remote Printer ("CRPRINTER"); and the Customized Print Server ("CPSERVER"). Preferably, the NEB acts in only one of these configurations at a time. Further, these application modules require that a network protocol stack be loaded and functioning within the NEB.

When configured with RPRINTER functionality, the NEB operates its printer as a slave to an external print server using a CRPRINTER module. In this configuration, the NEB exports to the LAN only limited printer status information in emulation of what the standard Novell print server expects from a standard Novell RPRINTER. However, extended status information about the printer will still be available if the CPCONSOL utility (discussed above) is executed in the network administrator's PC 14.

As mentioned above, the NEB 2 includes embedded software programs CPSERVER and CRPRINTER which enable the NEB to act with either PSERVER or RPRINTER functionality on the network. The customized NEB-embedded software which permits peripheral status and control information over the LAN is CPSOCKET (to be discussed in section 4j below). CPSOCKET runs on the NEB and monitors the LAN for communications addressed to both the NEB 2 and the attached printer 4. Further, CPSOCKET communicates with CPINIT and CPCONSOL when they are running. CPSOCKET will maintain a table of default settings for the device environment, download basic configuration information (fonts and emulations) at power-up, provide device information, statistics, and log information for CPCONSOL displays, and provide reset, reboot, and download capabilities. CPSOCKET will also be responsible for the configuration of the NEB 2. Further, CPSOCKET will configure and activate applications on the NEB at the request of CPINIT. CPSOCKET also insures that the correct protocol stacks are available for each configured application. CPSOCKET will handle the settings of the NEB 2 and the printer variables at the request of both CPINIT and CPCONSOL. Finally, the download facility (e.g. the network administrator's PC 14) will contact CPSOCKET to carry out any firmware downloading, such as flashing EPROM 222, that is required.

Upon initialization, programs such as CPINIT and CPCONSOL will issue a Service Advertising Protocol ("SAP") on the LAN looking for all network devices having the customized software of NEB 2. CPSOCKET will receive this broadcast signal and will respond. CPINIT or CPCONSOL then establishes a special connection with CPSOCKET using a customized client socket. CPSOCKET will then post multiple listens and will provide client service transactions such as NEB control, device information, basic configuration information, application information, statistics, and logging. For example, CPINIT can request that an application be configured, and CPCONSOL can request that an already-configured application be activated or deactivated. CPSOCKET will insure that the appropriate option (protocol stack) is available and configured for an application before allowing the application itself to be configured. Within the NEB, the CPSOCKET operational module is always activated.

Additional print service applications may be utilized after loading further application modules into the NEB, for example, UNIX print services and associated protocol implementation.

3d. PC-Resident Customized Software

To further enhance the functionality of the NEB 2, customized software is also provided to the network administrator's PC 14. For example, a Customized PCONSOLE ("CPCONSOL"; to be discussed in greater detail in section 4i below) utility provides extensions to Novell's PCONSOLE printer utility to enable access to the powerful control and monitoring features of the open-architecture printer 4. For example, the following are typical status control information available to the network from the printer through the use of CPCONSOL: (A) status and control information such as online/offline, no response, time/date/time zone, language, offsets, error skip settings, timer, buzzer enable, toner low, paper full, paper counter, count since last service, paper out, paper jam; (B) font information such as primary, secondary, graphic set, scaling, rotation, elite; (C) layout information such as page orientation, line pitch, character pitch; (D) quality and common environment information such as number of copies, overlay, job complete, command mode, default paper size, current paper size; and (E) configuration information such as interface, buffer size, feeder select, duplex print, page stack order, etc.

Furthermore, configuration data for the printer accessible to the network through the use of CPCONSOL includes: (A) network group information such as protocol type, the node name, the file server name, routing, POST error code, NEB firmware level, MAC address, server mode; and (B) printer group information such as safe (default) environment, font, disk present, disk size, initial environment, logging on/off, log file size, configured/nonconfigured, and net name. Additionally, logs can be kept of print job flow, print engine usage, and network behavior. Examples of such usage and statistical log entries include: (A) network group information such as receive statistics, transmit statistics, and non-media related information; (B) job entry information such as date/time/time zone, log-in (user's name), job name, pages, copy count, and print status; (C) initialization entry information; (D) error condition entry information; (E) clear log entry information; and (F) printer group information such as the number of jobs, pages/job, pages/minute, time/job, total pages/day, total jobs/day, number of days and total resets.

CPCONSOL is a menu-driven DOS executable program whose function is to provide extensions to the Novell PCONSOLE printer utility. The CPCONSOL extension enables access to the additional control and monitoring features of the open-architecture printer 4. These features will enhance print service management across the network by allowing the network administrator's PC 14 to control and maintain the printer from a remote location. In summary, CPCONSOL is the utility that exports printer control features to the network administrator, allows reconfiguration of the safe (default) environment, and allows the network administrator to view network and printer status, job statistics, and a log of the previously-processed jobs and error conditions. CPCONSOL gathers the requested information by communicating with the NEB-embedded software program module CPSOCKET.

Another customized software program resident on the network administrator's PC 14 is Customized Peripheral Initializer ("CPINIT"; to be discussed in section 4h below) which is also a menu-driven DOS executable program. The function of the program is to configure, reconfigure, and initialize the printer 4 attached to the NEB 2.

The CPINIT module will configure the NEB to act as a print server with one attached printer and specifies its primary file server by which the NEB will determine which queues to service. CPINIT is the program that supervises all like-customized devices on the LAN (e.g. other NEBs installed in other open-architecture printers). CPINIT accomplishes this task by communicating over the network with other NEBs that reside within open-architecture peripheral devices. CPINIT is used to configure each NEB with the appropriate basic configuration information such as configuring the NEB as CPSERVER or CRPRINTER. The basic configuration information comprises NEB environment settings (including which print server applications are active), as well as device environment options (e.g. a list of fonts and emulations to download printer initialization time), and device default settings (such as the internal device time/date/time zone, buffer size, disk and logging information, and printer name). The CPINIT program also displays status information about the NEB (such as the firmware level loaded in the NEB and reports latent POST errors).

The CPINIT program will broadcast over the network to see which other customized devices are available on the LAN. The NEBs attached to such other customized devices will respond with their identification numbers, their device types, and their configuration states. CPINIT will construct a list of these NEBs and devices that will be presented to the netwrok administrator to allow their configuration or reconfiguration.

A DOWNLOADER program may also be loaded into the network administrator's PC 14 to download executable files to the NEB across the network (to be discussed in greater detail in section 4n below).

Another customized program which may run on the network administrator's PC 14 is CPFLASH which may be used to remotely flash new firmware into EPROM 222, as will be discussed in greater detail in section 4q below.

4. OPERATION

Figure 5A:
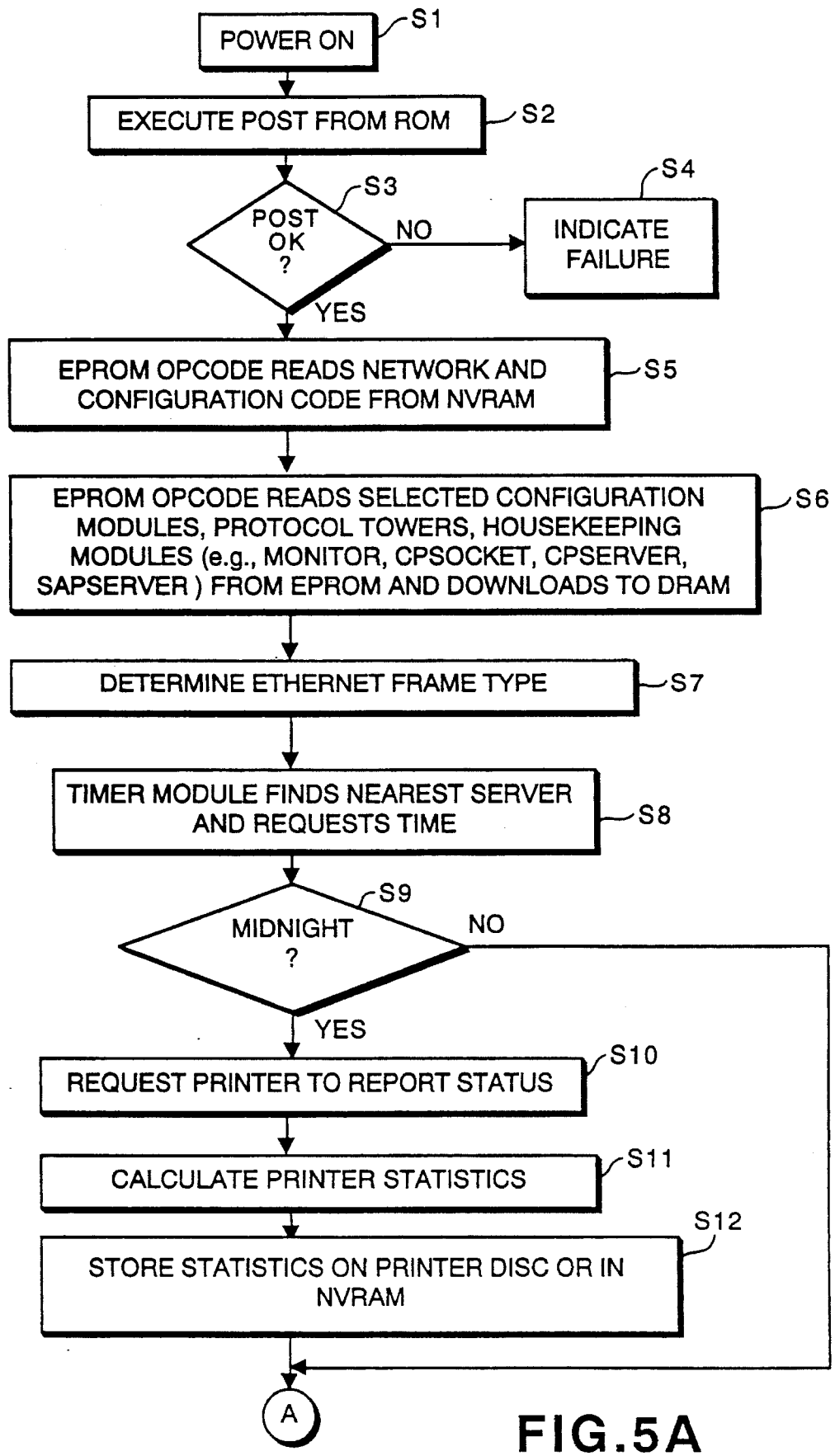
FIGS. 5A, 5B and 5C comprise a top-level flowchart showing the basic functions of the Network Expansion Board according to the present invention.
Figure 5B:
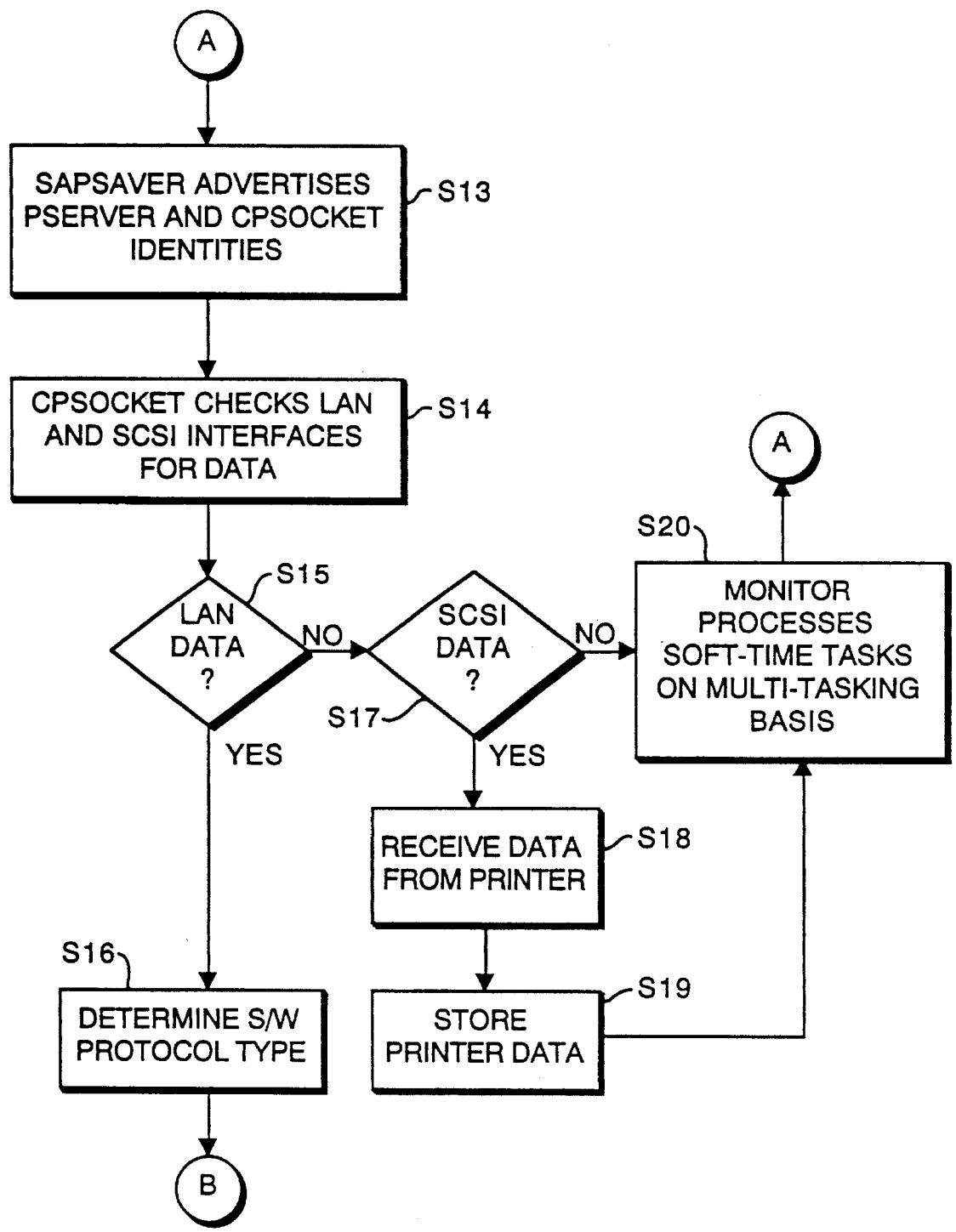
Figure 5C:
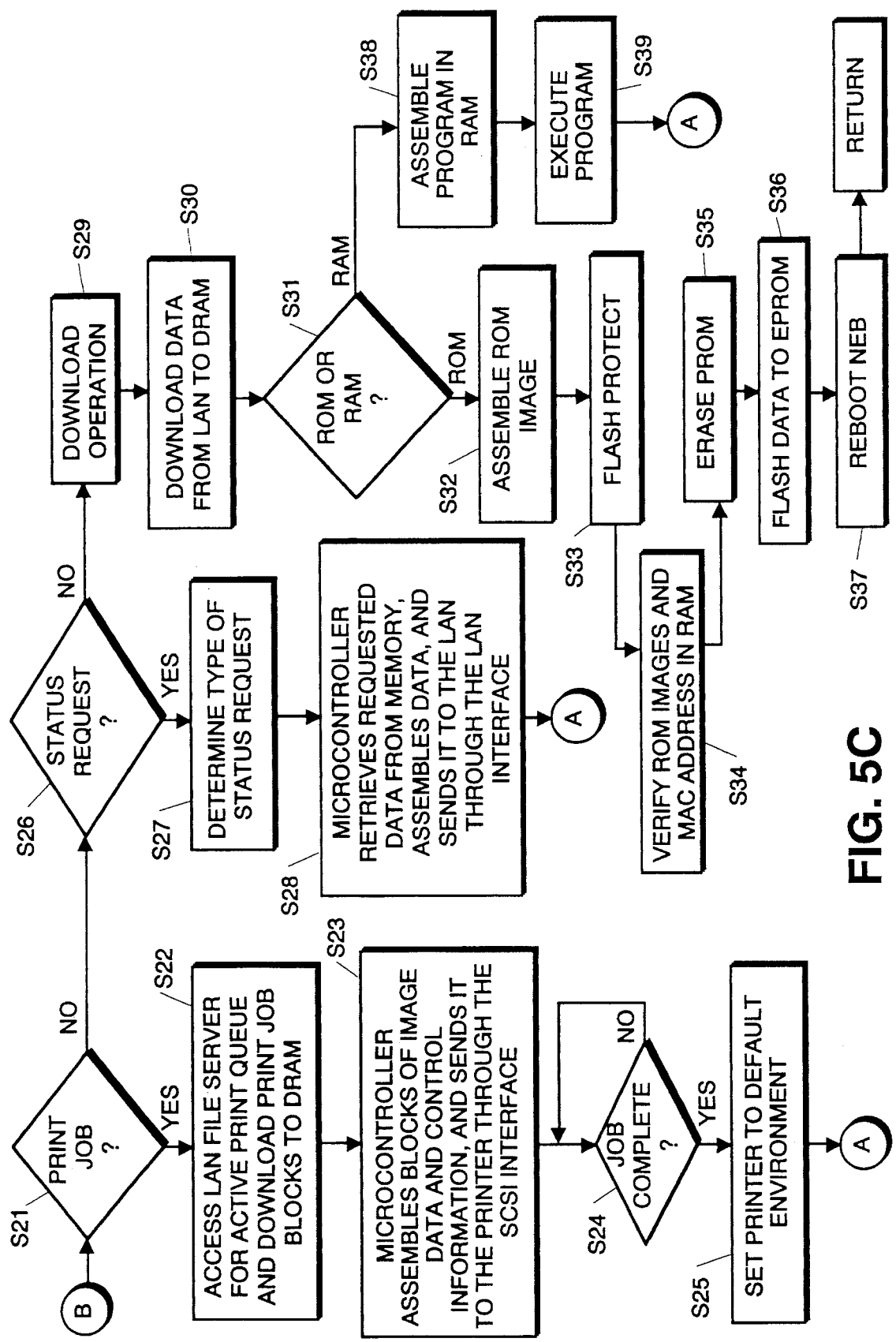

At first, an overview discussion of the NEB structure and functions will be provided with respect to the flowchart of FIGS. 5A, 5B and 5C. Thereafter, more detailed descriptions of various aspects of the NEB hardware and software will be provided with respect to sections 4a to 4q.

The present invention takes advantage of the bi-directional nature of the communication between the printer and the NEB, and the NEB's ability to process information on a multi-tasking basis. That is, the bi-directional SCSI bus can transmit large quantities of data both to and from the printer, enabling the NEB to receive large quantities of specific status data from the printer or even data input from the peripheral (such as image data input from a scanner). The NEB microprocessor processes information on a multi-tasking basis (sequential but shared) effectively parallel processing information received from the network and information received from the printer. This multi-tasking processing insures that the NEB is responsive to both the network and the printer on a near real-time basis.

FIGS. 5A, 5B, and 5C comprise a top-level flowchart depicting a notional sequence of events which may occur when the NEB and its associated software is installed in a printer coupled to a local area network. Overall, the printer renders print information and is coupled to the NEB through a bi-directional SCSI interface. The printer may also have a parallel port and/or a serial port for receiving print information from other sources. The NEB is connected to the printer via the bi-directional SCSI interface, the board receiving printer information from the local area network. The board sends print jobs and printer status inquiries to the printer over the SCSI interface, receives printer status from the printer over the SCSI interface, and reports printer status over the network.

Where the NEB is coupled to a data generating device such as a scanner, the board is connected to the scanner through the bi-directional SCSI interface and is coupled to the network via the LAN interface. The board receives status request information from the network and will pass this information to the scanner over the hi-directional interface. The board will also receive the data generated by the scanner over the bi-directional interface, and will pass that data onto the network over the LAN interface.

Illustrating a sequence of events which may occur when the NEB is installed in a printer, FIG. 5A begins when power is applied to the NEB at Step S1. At Step S2, the NEB executes a power-on-self-test ("POST") from EPROM 220. At Step S3, if the POST is successfully completed, the process moves to Step S5 where the NEB EPROM 222 operational code reads the network and printer configuration code from NVRAM 228. If the POST is not successfully accomplished at Step S3, a failure indication is logged at Step S4 and this information may be transmitted to the network over the LAN interface. An LED failure/diagnostics light on the NEB or printer may also be activated.

After the network and configuration code have been read from NVRAM 228, the procedure advances to Step S6 where the NEB EPROM operational code reads selected configuration modules, protocol stacks, housekeeping modules, etc., (e.g., the MONITOR multi-tasking module, CPSOCKET, CPSERVER, etc.) from EPROM 222, and downloads the selected modules to DRAM 220. In Step S6, a configuration is selected (in accordance with the configuration set by CPINIT) which defines an operational mode (e.g. CPSERVER or CRPRINTER) of the interactive network board. As will be discussed in greater detail in section 4d below, a binary configuration code is sent over the LAN and stored in NVRAM 228. After the NEB is booted up, the configuration code is read from NVRAM using ROM-resident power-up process steps. Using the ROM-resident process steps, ROM-resident executable modules are selected in accordance with the configuration code read from NVRAM. The modules are selected in bit-wise correspondence to the binary digits of the configuration code in NVRAM. The selected modules are then stored into DRAM and execution control for the modules is passed to DRAM whereupon the selected modules are executed. In this manner, multiple configurations can be defined and selectively changed.

At Step S7, the EtherNet frame type of the information packets transmitted on the LAN is determined (as will be discussed in greater detail in section 4e below). That is, EtherNet supports four different frame types: EtherNet 802.3; EtherNet II; EtherNet 802.2; and EtherNet SNAP. To determine the EtherNet frame type, a pre-scan process ("PRESCAN") determines what frame type is resident on the LAN (from any LAN broadcast data), and configures the appropriate NEB-resident protocol stack for that data. The pre-scan process strips away bytes of data from a received LAN packet until the bytes which indicate frame type are reached. Briefly, Step S7 provides the NEB with the capability of processing LAN packets of different frame types by: receiving from the LAN a frame of data, pre-scanning the frame to determine the frame type, and processing, on the NEB, the identified frame, using an appropriate processing program. The pre-scanning operation includes the sub-steps of stripping a predetermined number of bytes from the head of the frame, processing the stripped frame to identify an identification code indicative of the frame type, and transmitting the identified frame to the processing program.

At Step S8, a timer module which was downloaded in Step S6 finds the nearest LAN server and requests the current time. After receiving the current time, the process proceeds to Step S9 where it is determined whether it is midnight, i.e. whether the returned time indicates a new date.

Steps S9 through S12 comprise a so-called "autologging" function which is carried out in the NEB by the CPSOCKET program in order to automatically and systematically provide status information from the printer to the LAN (autologging will be discussed in greater detail in section 4k below). In Step S9, if midnight has not been reached the procedure advances to Step S13. However, once midnight is reached, the NEB microprocessor 216 transmits a request to the printer over the SCSI bus for the printer to return current status to the NEB. For example, the printer may return the cumulative number of pages printed to the NEB. In Step S11, the NEB microprocessor 216 calculates printer statistics such as pages per job or pages per day, the NEB having kept track of the number of jobs sent to the printer and the date. At Step S12, the printer statistics are transferred to a non-volatile memory such as the printer's hard disk 114 or NVRAM 111, or the NEB's NVRAM 228. Alternatively, Steps S10, S11, S12 may be performed before Step S9, so that statistics are stored every minute.

Summarizing Steps S9 through S12, a method for logging system statistics of a printer connected via a bi-directional interface to an interactive network board for LAN communication includes the steps of counting in the printer the number of pages printed, and counting on the board the number of jobs printed. The printer is interrogated daily over the bi-directional interface for the number of pages printed, and the board then calculates daily statistics using the number of pages, the number of jobs, and other status information. The daily statistics are then stored and may be accessed and remotely displayed using CPCONSOL from the network administrator's PC 14. An additional feature of the "autologging" function is that different levels of statistics may be logged. For example, at a basic level, only the number of pages for each job may be logged. At more advanced levels, the number of pages per job plus a log of failure conditions may be logged; or the job start and end times may be logged in addition to the failure conditions and the number of pages per job. The logging level is set by CPINIT.

In FIG. 5B, at Step S13, the SAPSERVER program (to be discussed in greater detail in section 4g below) advertises the NEB as having both CPSERVER and CPSOCKET identities. Thus, the NEB and attached printer can function in its twin roles of PSERVER and customized entity (CPSOCKET; i.e., similar to other LAN peripherals having a NEB installed therein). SAPSERVER is a NEB-resident TSR program that allows more than one server to advertise network services at the same time on the same node. Thus, CPSOCKET and CPSERVER both advertise their services through SAPSERVER and respond to inquiries from other network applications. Since each EtherNet board can have only one SAP socket number, SAPSERVER will function to advertise both NEB identities without confusion to the LAN.

In summary, Step S13 is a method of identifying a single interactive network board as two network servers (e.g. CPSERVER and CPSOCKET) comprising the steps of transmitting to the network at a predetermined time interval a signal indicating that the board is a first type of network entity, the signal including an identification signal unique to the board; then, transmitting a second signal to the network at the predetermined time interval to indicate that the board is a second type of network entity, the second signal also including the same unique identification signal. Once a signal is received from the network requesting that the board perform functions of one of the types of network entities, direct communication is established between the board (acting as the requested type of network entity) and the network entity which generated the request. When the direct communication is established, the NEB will utilize a new unique identification signal.

At Step S14, both the LAN and the SCSI interfaces are checked for data that is being directed to CPSOCKET (to be discussed in greater detail in section 4j below). The SCSI interface will typically have printer status data which is to be passed to the LAN in response to a previously-received request for status. CPSOCKET is the NEB-resident resident TSR program that responds to such requests for connection, requests for data download, or requests for services from remote utilities. CPSOCKET gathers information from the NEB or the printer, as needed, monitors requests to write to the log file, monitors application requests for device status, and maintains job statistics, as discussed above.

Briefly, the CPSOCKET program is a method of interfacing an interactive network board between the network and a peripheral device, comprising the steps of transferring a program from board ROM to board RAM for execution from the RAM; and monitoring, with the program, a board network interface to detect a network communication directed to the peripheral device. The program then commands the peripheral device to perform a function in response to the network communication, and monitors a board bi-directional peripheral interface to detect and store status information of the peripheral device. Finally, the program outputs the peripheral device status information onto the network through the network interface in response to another network communication.

In FIG. 5B, Steps S15 and S17 indicate "run-time" layer functions, and Step S20 represents a "soft-time" application layer. First, Step S15 determines whether data is being received over the LAN. When LAN data is received, the process proceeds to Step S16 and the software protocol type is determined (to be discussed in greater detail in section 4f below). For example, the Ethernet data received over the LAN may be one of the following software protocols: e.g. NetWare® over SPX/IPX; UNIX over TCP/IP; or Mac Systems 7 over AppleTalk. Basically, the software protocol type may be determined according to the frame packet type sensed in Step S7 above.

If CPSOCKET determines that LAN data is not being received in Step S15, Step S17 determines whether SCSI data is being received, and if SCSI data is being received, it is input from the printer in Step S18, and then stored in DRAM 220 in Step S19.

After the storing of printer data in Step S19, or if SCSI data is not being received in Step S17, the process proceeds to Step S20 where "soft-time" tasks are performed on a multi-tasking basis as controlled by a multi-tasking software program called "MONITOR" (to be discussed in greater detail in section 4l below). Step S20 is therefore a "background" process which runs concurrently throughout the flowchart depicted in FIGS. 5A, 5B and 5C. That is, whenever "soft-time" tasks are being performed, the microprocessor 216 will ensure time-shared, parallel, non-preemptive processing of the "soft-time" tasks.

More particularly, MONITOR is a software module downloaded from EPROM 222 to DRAM 220 in Step S6. MONITOR is a non-preemptive multi-tasking monitor which distributes the processor usage among the several application tasks which are currently active. The non-preemptive nature of the monitor requires that each application task periodically relinquish control so that other tasks gain the opportunity to execute. The relinquish control mechanism is implemented using a software interrupt to pass control to the MONITOR. At an interrupt, MONITOR saves the state of the current task, restores the state of another active task, and resumes (or commences) execution of the new task. The task which originally relinquished control eventually regains control at the interrupt point, i.e. with its context restored to the same condition as when it relinquished control.

In summary, Step S20 comprises the step of monitoring a plurality of application tasks in a multi-tasking interactive network board to distribute processor resources. A memory stores a first application task which may queue a file server to get a network interface to obtain a queue of print files to be printed, and which channels the print files to a printer coupled to the board through an interface. The memory also stores a second application task which may receive remote status inquiries over a LAN interface, interrogate the printer over a bi-directional interface to obtain printer status and a response to the received status inquiry, and provide the status information over the LAN interface to the status requester. The first and second application tasks each include a relinquish command which causes the currently executing application task to periodically relinquish control to the MONITOR. The MONITOR saves the state of the relinquishing task, restores the state of the non-relinquishing task, and resumes execution of the non-relinquishing task.

In FIG. 5C, presuming that data has been received over the LAN at Step S15, Step S21 determines whether the received data is for a print job or not. If it is for a print job, microprocessor 216 acts as the LAN file server for an active print file and transfers print job blocks to DRAM 220 at Step S22.

At Step S23, microprocessor 216 assembles blocks of image data and control information, and sends the blocks to the printer through the SCSI interface. In this step, the microprocessor 216 effectively adds "beginning of job" and "end of job" indications to the data stream received over the LAN. It does this by opening the XP (data) channel at the beginning of a print job, and by closing the XP channel at the end of a print job.

At Step S24, the process waits until the print job is complete. Once the print job is complete, Step S25 will unambiguously set the printer to a default environment. It is also possible to set the default configuration before (or during) the print job. That is, the NEB itself will ensure that the attached printer is set to a default environment which specifies, for example, default fonts, papers trays, collation, stapling, etc., to insure that the next print job will be started with the printer in a known configuration (to be discussed in greater detail in section 4m below).

Step S25 may be thought of as guaranteeing a safe environment for the printer by ensuring that the printer settings (e.g. portrait mode, duplex, etc.) are returned to between logical printing jobs. For example, while Novell NetWare® includes the ability to prefix every job with printer escape sequences to reset the printer environment, such escape sequences reside in a database on the network file server, and the print job in question might not originate from that file server. In order to ensure a guaranteed safe environment, the NEB will store the requisite configuration parameters, and will be responsible for resetting the printer environment between print jobs.

In summary, a method for providing a default configuration to a LAN printer having an interactive network board coupled thereto includes the step of receiving a default configuration over a LAN interface at the interactive network board. The default configuration may be stored in NVRAM 228 in the NEB or stored in an NVRAM or disk in the printer over the bi-directional interface between the board and the printer. Then, the default configuration is downloaded from the NVRAM in the printer to the DRAM 220 on the board over the bi-directional interface. When the board receives print information over the LAN interface and provides the print information to the printer over the bi-directional interface, the board detects an end of print job. In response to this detection, the default configuration is sent to the printer whereby the printer is set in its default configuration.

Additionally, a plurality of default configurations may be stored, and an appropriate default configuration may be selected remotely from another LAN entity. For example, a method of setting one of a plurality of default configurations may include a step of detecting, at the board, the origination of a print job and identifying the source of the job. Subsequently, an appropriate default configuration is selected from among the stored configurations, and the selected default configuration is then sent to the printer at the beginning or end of the print job.

In FIG. 5C, if it is determined that a print job is not required at Step S21, Step S26 determines whether a status request has been made over the LAN requesting the status of the attached printer. If it is determined that a status request has been received, Step S27 determines the type of status request. For example, printer status such as error codes, the number of pages printed, the toner status, etc., may be requested.

At Step S28, the microprocessor 216 retrieves the requested status data from DRAM 220, assembles the status data, and sends it to the LAN through the LAN interface (to be discussed in greater detail in section 4i below). Thus, in Step S28, more than simple "on/off" information may be transmitted to the LAN so as to inform the LAN of the detailed status of the printer. In a broad application, Step S28 encompasses the export of printer front panel status over the LAN, and the import of front panel control commands from the LAN. That is, the network administrator at the PC 14 may request and receive a display indicating all of the printer information included on the printer front panel display 116. The network administrator may then activate different printer front panel functions on his/her PC, and such functions will be transmitted to the printer where the selected control will be effected.

In summary, at Step S28, a method for remotely controlling a manually-operable function of a networked printer through an interactive network board having a LAN interface for LAN communication, comprises the step of issuing, at a remote location, a command to the board that will cause the board to transfer printer status information through the board to the remote location through the LAN interface. At the remote location, a printer status may be displayed, and a second command may be issued at the remote location to the board through the LAN interface to cause the board to perform a manually-operable function.

If the received LAN data is neither a print job nor a status request, it is determined at Step S29 that the received data may be a download operation, i.e., a transfer of data into the NEB for updating the ROM or RAM applications, e.g. download may be utilized for transient diagnostics to be run on the NEB.

First, at Step S30, the data is downloaded from the LAN to the DRAM 220 (to be discussed in greater detail in section 4n below). That is, the download is a process by which data may be loaded into a network node and then acted upon or executed. For example, anything from patch code, to manufacturing test routines, to firmware updates for the EPROM may be downloaded. Also, application modules may be stored in the LAN file server and then downloaded to the NEB every morning.

In summary, the downloading of data from LAN to DRAM comprises a method for altering an operational mode of an interactive network board having a LAN interface, including the step of activating a LAN communication program for execution from DRAM, the communication program channelling print information on the LAN to a peripheral printer. Executable instructions which correspond to the altered operational mode are then downloaded into DRAM via the LAN interface. The board is then commanded via the LAN interface to begin execution of the altered operational mode.

At Step S31, it is determined whether the downloaded information is destined for EPROM 222 or DRAM 220. If the information is destined for EPROM, a ROM image is assembled at Step S32 (to be discussed in greater detail in section 4o below). For example, downloading of EPROM firmware from a remote location provides unique flexibility. In particular, downloading of on-board test routines, and changing EPROM configuration firmware can be performed from a remote location after the board is installed in the printer.

Step S32 is the process which constructs the binary image file which is to be programmed into the EPROM 222. The data destined for the EPROM is first downloaded to DRAM 220 where a utility reads a configuration file containing the names of the modules to be placed in the ROM image. Then, a complete binary image file is constructed containing all of the specified modules. A header precedes each module in the image, the header identifying the module, describing its attributes, and pointing to the succeeding header to aid in locating the modules during loading. The last module loaded in the EPROM is the EPROM-resident code. It is placed at the end of the ROM image so that the power-up initialization code resides at the address expected by the microprocessor 216.

In summary, Step S32 comprises a process for formatting a binary image file which contains executable code modules for storage in the EPROM. First, a configuration file is read which specifies the code modules which form the binary image. Next, a header is formed for each module specified in the configuration file, the header including an identification of the module, a definition of the module's attributes, and a pointer to a header for a succeeding module. The binary image file is then constructed containing the specified modules and their associated headers. Finally, a module of ROM-resident code is appended to the binary image, the ROM-resident code receiving control at power-up, providing POST, loading at least some of the modules from the binary image file into DRAM 220, and providing basic board I/O services.

Before writing new data into EPROM 222, it is first necessary to unequivocally ensure that a write operation is, in fact, intended. Obviously, any accidental writings into EPROM 222 could render the NEB unusable. Therefore, before information may De "flashed" to EPROM 222, a specified sequence of events will occur in Step S33 in order to access the EPROM (to be discussed in greater detail in section 4p below). In the present embodiment, unless two data bits are changed in two separate I/O locations, the +12 Volts necessary to write to the EPROM will not be provided.

Briefly, a method of ensuring that the EPROM is not accidentally written into comprises a method of performing a flash operation on an EPROM resident on an interactive network board having a processing unit and a memory, including the step of sending an I/O write signal to the processing unit. Then, the processing unit generates a first address in the memory to cause a first bit to be in a predetermined state in response to the I/O signal. A power unit is then caused to provide +12 Volts to a transistor in response to the first bit being placed in the predetermined state. Then, an I/O receive signal is sent to the processing unit which generates a second address in the memory to cause a second bit to be in a preselected state in response to the I/O receive signal. Then, the transistor is turned on in response to the second bit being placed in the preselected state causing the +12 Volts to flow to a power terminal of the EPROM, allowing a write operation to take place.

Before the new ROM image is actually stored in EPROM 222, at Step S34 the new ROM image must be check-summed and verified with a checksum value sent after the ROM image is received. Prior to erasing EPROM 222, data and modules to be preserved, such as the MAC address, must be loaded into DRAM 220 within the new ROM image.

After determining that the ROM image is verified and after preserving all required data into the new ROM image stored in DRAM 220, it is necessary to clear and erase EPROM 222 to ensure no corruption of data upon loading of the new ROM image. Accordingly, at Step S35, EPROM 222 may be erased a plurality of times before the new ROM image is stored therein.

After erasing EPROM 222 at Step S35, the new ROM image is "flashed" into EPROM 222 in Step S36 (to be discussed in greater detail in section 4q below).

In summary, Step S36 relates to a method for remotely altering programmable firmware on an interactive network board having a LAN interface including the step of activating a LAN communication program for execution from DRAM on the board, the communication program channelling print information on the LAN to a peripheral printer. A ROM firmware image is then downloaded to the DRAM on the board via the LAN interface. It is next confirmed that the ROM image has been downloaded to the target board, and the integrity of the ROM image is confirmed. The board is then commanded to electronically erase the EPROM, and then the EPROM is flashed with the new ROM image. Additionally, a "flash complete" signal may be sent to the LAN after the flash operation, if desired.

After the information is flashed to the EPROM 222, the NEB is then re-booted from the new ROM firmware image in EPROM 222 at Step S37, and the process returns to Step S1.

In FIG. 5C, if Step S31 determines that RAM information is being downloaded, such information is first assembled in DRAM 220 via Step S38. Subsequently, Step S39 executes the RAM program, and the process returns to Step S13 wherein SAPSERVER advertises PSERVER and CPSOCKET entities.

This discussion concludes the overview of the NEB structures and functions when the NEB is installed in LAN-networked printer. A more detailed description of the operation of various aspects of the NEB hardware and software will now be provided.

4a. Power-on Sequence

Immediately following power-on, NEB 2 executes a power-on self test (POST), following which the NEB loads operational software from EPROM 222 into DRAM 220 for execution.

More specifically, immediately following power-on, microprocessor 216 accesses POST program modules located in EPROM 222. Microprocessor 216 executes POST directly from EPROM 222 to test the functionality of the microprocessor, integrity of the programs stored in EPROM 222 (for example, via checksum verification), operability of DRAM 220 (for example, through read/write cycles), operability of SCSI controller 224, data integrity of NVRAM 228, and operation of control register 230. POST may also include a comparison of the MAC address stored in PROM 232 with a MAC address downloaded into EPROM 222.

POST further includes operational checks of network-related hardware. More specifically, POST may include operability checks for SRAM 214 (for example, through read/write cycles), as well as a check of network activity to verify operation of network controller 206.

Operation of other hardware in NEB 2 may be determined directly through additional POST testing. In some cases, where it is not possible for microprocessor 216 to test operation of hardware directly, as in the case of connectors 202, 203 and 204, proper operation of that hardware may be implied through result codes received from direct testing.

Upon termination of POST, microprocessor 216 puts a checksum code onto serial port 218 and then enters a window of quiescent operation (for example, a one second window) during which microprocessor 216 can receive commands (e.g. for testing—see paragraph 5 below) via serial port 218. The POST checksum code may be obtained by a device coupled to serial port 218 to determine the outcome of POST. For example, a no error condition may be indicated by a POST checksum code of "0000h", while a POST checksum code indicating an error may be indicated by a non-zero hexadecimal value which indicates the area of failure. In the case of failure, microprocessor 216 may also illuminate LED 240 on NEB 2 to signal to a user that an error has been detected. Preferably, LED 240 is illuminated on power-up and is only turned off if POST is successful.

Following successful completion of POST and in the event that no commands are received via serial port 218 during the one second quiescent window of activity, microprocessor 216 begins to load software modules stored in EPROM 222 into DRAM 220. Microprocessor 216 does not execute those software modules directly from EPROM 222, but rather loads those modules into DRAM 220 for execution from DRAM 220. By virtue of this arrangement, it is possible to select the specific modules that are retrieved from EPROM 222 for execution out of DRAM 220 so as to permit flexible configuration of NEB 2 (see section 4d below). For example, in accordance with a configuration command stored in NVRAM 228, microprocessor 216 may retrieve selective modules from EPROM 222 for loading into DRAM 220 and for execution from the DRAM.

Figure 6:
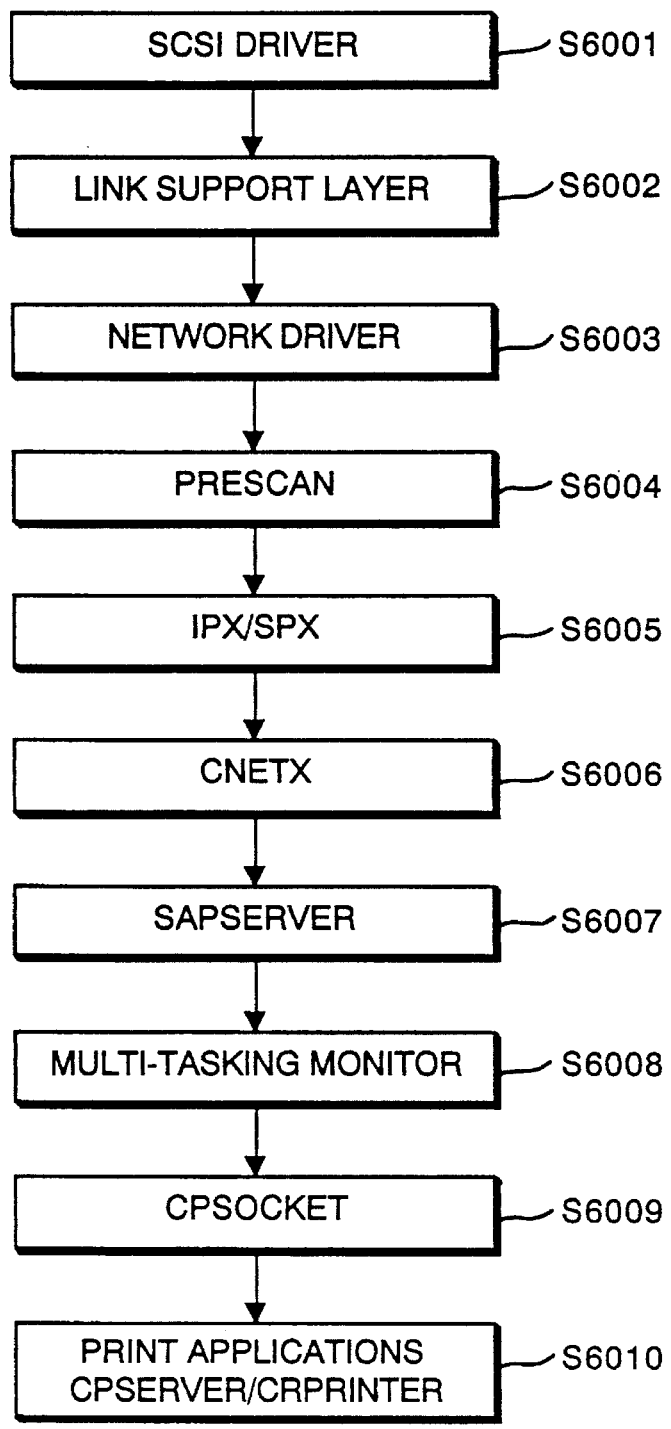
FIG. 6 is a diagram showing the sequence in which software modules are loaded from the Network Expansion Board ROM to RAM.

FIG. 6 shows the sequence by which different modules are retrieved from EPROM 222 and loaded into DRAM 220. In Step S6001, microprocessor 216 loads the SCSI driver from EPROM 222 into DRAM 220. The SCSI driver provides for operational sequence and control over SCSI controller 224 and permits interface with printer 4 so as to send printer 4 print data and so as to send and receive control information to and from printer 4.

Figure 7:
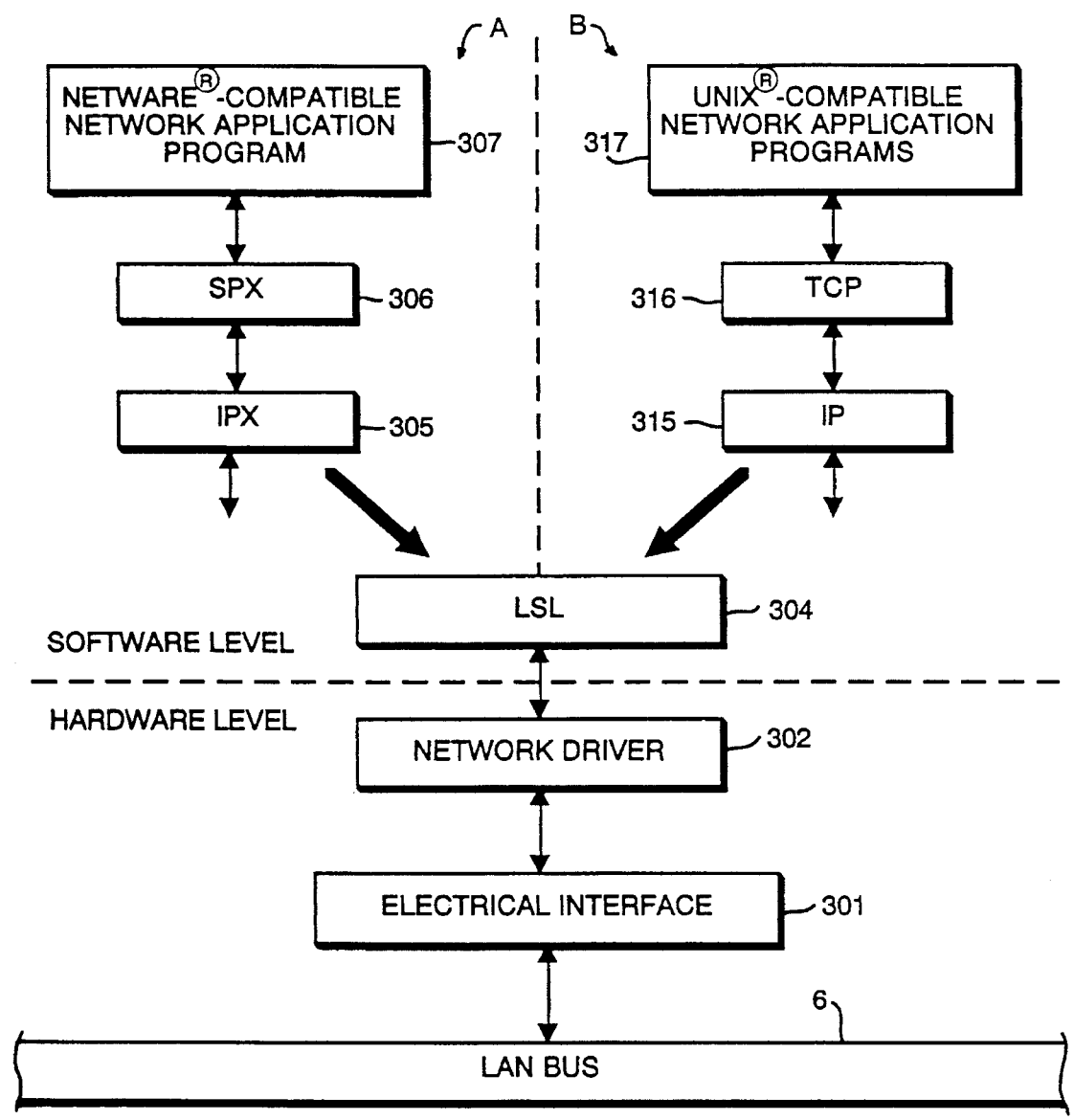
FIG. 7 is a block diagram showing hardware and software interfaces between the LAN and the Network Expansion Board.

In Step S6002, microprocessor 216 loads the link support layer, or "LSL", from EPROM 222 into DRAM 220, and in Step S6003 microprocessor 216 loads network driver software from EPROM 222 into DRAM 220, and thereupon microprocessor 216 begins to execute the link support layer and the network driver from DRAM 220. The link support layer and the network driver provide common access to LAN communications on LAN bus 6. More particularly, as shown in FIG. 7, all networked devices, including a device such as NEB 2, interface with LAN bus 6 via an electrical interface 301 such as the network controller 206 used on NEB 2. The electrical interface 301 is driven by network driver 302 which in turn receives LAN frame data from link support layer software 304. Both the link support layer 304 and the network driver 302 are common to different kinds of network software. For example, as further shown in FIG. 7, network application programs, such as those provided in NetWare® software by Novell (as illustrated at Arrow A) interface with the link support layer and the network driver via an internetwork packet exchange program, or "IPX", 305 and a sequenced packet exchange program, or "SPX", 306. On the other hand, network application programs from UNIX provided by AT&T (as illustrated at Arrow B) interface to the LSL through "IP" module 315 and "TCP" module 316.

In NEB 2, only one type of network application programs is normally executed at any one time (although multiprotocol operations are possible as discussed in section 4f below). Explanation here will be made for NetWare® network application programs although it is also possible for UNIX network application programs to be executed as well.

In Step S6004, microprocessor 216 loads a PRESCAN program from EPROM 222 and stores it into DRAM 220, and thereupon begins executing the PRESCAN program from DRAM 220. PRESCAN software interfaces with the link support layer to determine the frame packet type being transmitted on LAN bus 6. More particularly, as described above, there are four different possible frame packet types on an Ethernet-type network LAN bus: Ethernet 802.3, Ethernet II, Ethernet 802.2, and Ethernet SNAP. As described more fully below in section 4e, the PRESCAN software module monitors network communications on LAN bus 6 to determine the frame packet type. The frame packet type, once determined by PRESCAN, is stored in a predetermined common location in DRAM 220 for use by other network communication modules in the NEB. After determining the frame packet type, PRESCAN signals microprocessor 216 that its tasks are completed and allows microprocessor 216 to overwrite the memory occupied by the PRESCAN program with another program module.

In Step S6005 microprocessor 216 retrieves the IPX and SPX program modules from EPROM 222 and stores them in DRAM 220, and thereupon begins executing the IPX and SPX modules from DRAM 220. Both IPX and SPX use the frame packet type determined by the PRESCAN module.

In Step S6006 microprocessor 216 retrieves the CNETX program module from EPROM 222 and loads that module into DRAM 220 and thereupon begins execution from DRAM 220. CNETX provides localized DOS-like functionality to the NEB.

In Step S6007, microprocessor 216 loads the SAPSERVER program module from EPROM 222 into DRAM 220 and begins executing the SAPSERVER module from DRAM 220. As described more fully below in section 4g, SAPSERVER is a program module which allows two network server entities, such as CPSOCKET and CPSERVER, to advertise simultaneously from the single network node assigned to the NEB board, even though conventional network application programs such as those provided by NetWare® only permit advertising of a single network server entity from each network node.

In Step S6008 microprocessor 216 retrieves the non-preemptive multi-tasking MONITOR (see section 4l below) from EPROM 222 and stores it into DRAM 220 and begins executing the multi-tasking monitor from DRAM 220.

In Step S6009 microprocessor 216 retrieves the CPSOCKET server software module from EPROM 222 and loads it into DRAM 220 and begins executing the CPSOCKET server from DRAM 220. As will be described more fully below in section 4j, CPSOCKET initiates a request to SAPSERVER to advertise on behalf of CPSOCKET, and SAPSERVER begins making SAP advertisements on LAN bus 6.

In Step S6010 microprocessor 216 retrieves print application servers such as CPSERVER or CRPRINTER from EPROM 222 and loads the print application servers into DRAM 222. In the case of CPSERVER, microprocessor 216 begins executing the loaded print application servers from DRAM 220 which in turn requests SAPSERVER to make SAP advertisements on behalf of the print server. As described more fully below in section 4g, SAPSERVER interleaves advertisements for the CPSOCKET server and for the print server thereby acting as a surrogate SAP entity for both the CPSOCKET server and the print server.

4b. Interfacing A Peripheral With A Local Area Network

According to the broad aspects of the present invention, a peripheral such as a printer is coupled to a LAN using an interactive network board having software programs embedded therein. Preferably, the connection between the printer and the NEB is an SCSI interface so that large amounts of print data and status data are carried bi-directionally between the NEB and the printer. EPROM 222 stores a plurality of software modules for operationally configuring the NEB in the PSERVER or RPRINTER or LPR functional configurations. The EPROM 222 also stores a number of status control software modules for exporting status information from the printer over the LAN, and for importing control information from the LAN to the printer. The EPROM-resident firmware is downloaded to the DRAM 220 upon power-up (as discussed in section 4a above), whereby the MONITOR multi-tasking program executes soft-time tasks until run-time interrupts are received from either the LAN or SCSI interfaces.

NVRAM 228 stores a configuration word which specifies which modules stored in EPROM 222 should be downloaded into DRAM 220 in order to configure the NEB with either a PSERVER or RPRINTER functionality. The microprocessor 216 executes the programs from DRAM 220, allowing print jobs to be received from the LAN and sent to the printer for printing, and allowing printer status to be returned over the LAN in response to a status request.

The particular details of the structure and functions for interfacing the peripheral to the local area network are set forth above with reference to FIGS. 4, 5A, 5B and 5C, and in the following sections.

4c. The Bi-Directional Interface Between The Local Area Network And The Printer The provision of a bi-directional SCSI interface between the NEB 2 and the printer permits a large amount of status information to be extracted from the printer, while still providing the print data to the printer. Further, by utilizing the bi-directional SCSI interface, the printer can respond to control commands issued from a remote location over the LAN. For example, the network administrator may issue a control command from his/her PC 14 that requests a particular print job be printed a plurality of times, with high image density, and then stapled. Such control commands are sent to the NEB 2 over the LAN 6, and the NEB 2 transmits these control commands to the printer through the SCSI bus 102. At the same time, the actual print data is transferred from file server 30 to the NEB 2, where the print data is packaged in blocks and transferred to the printer over the SCSI bus 102. Preferably, the NEB 2 indicates the "start of print job" by opening the XP data channel to the printer. Likewise, the NEB 2 indicates "end of print job" by closing the XP data channel to the printer. Therefore, the NEB 2 can provide such indications to the printer.

The use of the bi-directional SCSI interface on the NEB 2 also permits other types of peripherals to be coupled to the LAN. For example, since the SCSI interface is capable of transmitting large quantities of data to the LAN from the peripheral, it is possible to couple the NEB to an image data generating device such as a scanner (e.g., where printer 4 is an Optical Character Recognition ("OCR") device) or a facsimile machine. Thus, data produced by the image generating device may be transferred to the NEB over the SCSI interface, and then put on the LAN for storage or retrieval by any of the LAN entities. As with a printer, large quantities of detailed control/status information can also be provided to/from the image data generating device.

The detailed structural and functional features of the bi-directional SCSI interface on the NEB are set forth above with reference to FIGS. 4, 5A, 5B and 5C, and in the following sections.

4d. ROM Firmware Configuration

As described earlier with respect to FIG. 5A, Step S6 downloads selected software programs from EPROM 222 to the DRAM 220 for execution (see also FIG. 6 and section 4a). The EPROM 222 is delivered with firmware modules which permit the NEB 2 to be configured with either RPRINTER or PSERVER functionality. Therefore, the functionality of the NEB 2 will be determined by which of the stored programs are downloaded from EPROM 222 to DRAM 220 in accordance with the configruation code stored in NVRAM 228.

The NEB 2 firmware is configured initially, and can be reconfigured subsequently by running CPINIT on the network administrator's PC 14 (see section 4h below). However, even in an unconfigured state, NEB 2 itself will always activate those software modules needed to perform basic communication with the LAN. Using CPINIT, the network manager can determine, remotely, the current configuration of the NEB, or he/she can change the configuration as desired. Since the configuration information is stored in EPROM on the NEB board, the configuration information is retained across power cycles.

Figure 8:
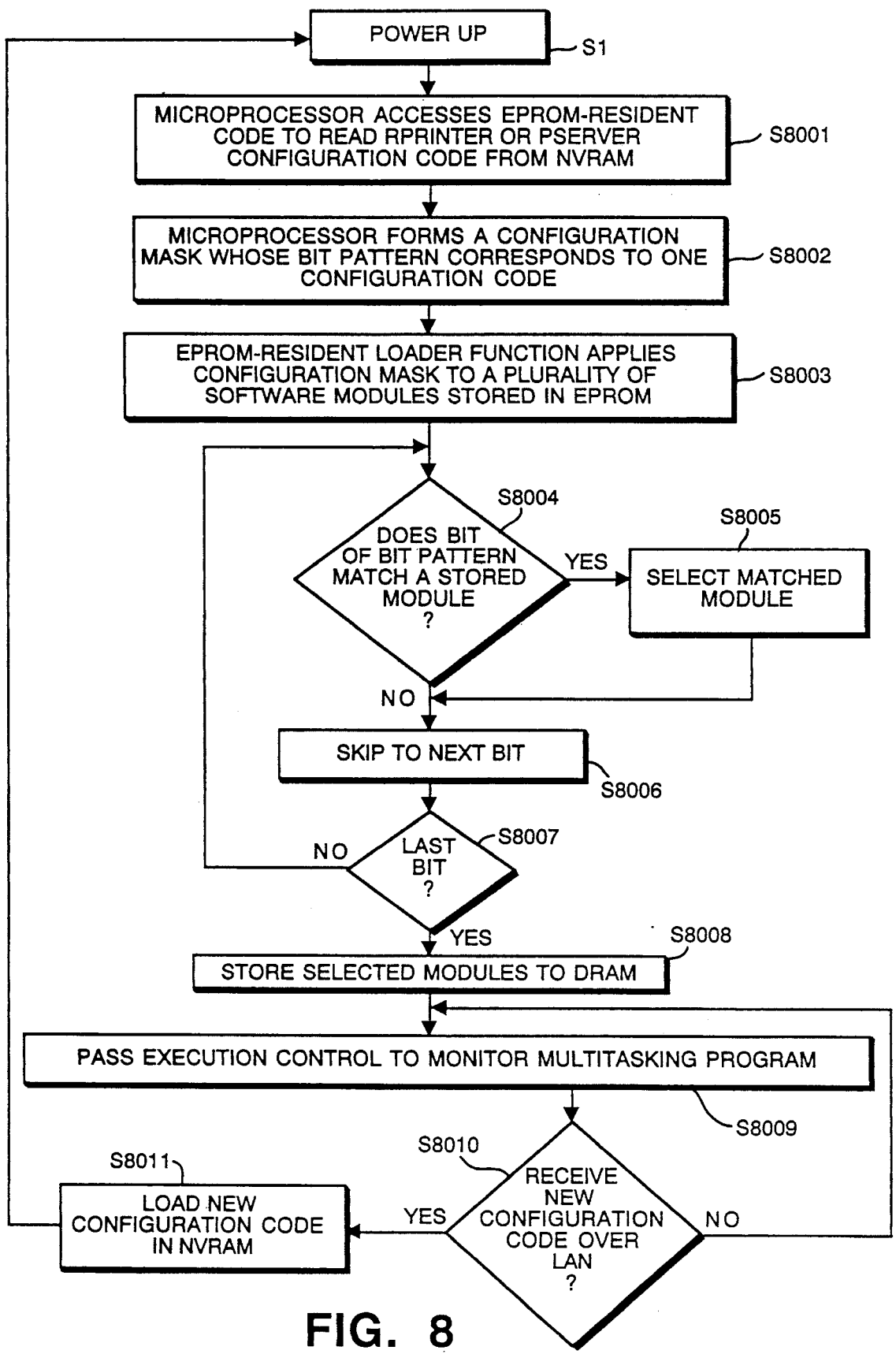
FIG. 8 is a flowchart showing how the EPROM firmware is configured for placing the Network Expansion Board in an operational mode.

The process by which the software programs for a particular configuration are downloaded from the EPROM 222 to the DRAM 220 will be described below with respect to FIG. 8.

After the board has been powered up at Step S1, the process proceeds to Step S8001 where microprocessor 216 accesses EPROM-resident code in the EPROM 222 to read a configuration code (typically a word) from NVRAM 228. The configuration code will specify modules which can provide the NEB with either a PSERVER or RPRINTER functionality. Although the present embodiment includes only RPRINTER or PSERVER functional configurations, other configurations may be utilized where, for instance, the NEB 2 is installed in a different LAN entity, such as a scanner or a facsimile machine.

After reading the configuration code from NVRAM 228, the microprocessor, at Step S8002, forms a configuration mask whose bit pattern corresponds to the read configuration code. At Step S8003, a loader module resident in EPROM 222 compares the configuration mask to the plurality of firmware modules stored in the EPROM 222.

In detail, in Step S8004, a process begins whereby the EPROM-resident software modules are selected in bit-wise correspondence to the binary digits of the configuration code read from NVRAM 228. If it is determined in Step S8004 that the currently-examined bit of the bit pattern matches a stored module, then that module is selected (at Step S8005) for downloading to DRAM 220, and the process skips to the next bit at Step S8006. Likewise, if Step S8004 determines that a bit of the bit pattern does not match the stored module, the process skips to the next bit at Step S8006.

At Step S8007, it is determined whether the bit tested in Step S8004 is the last bit of the configuration mask bit pattern. If the tested bit is not the last bit, the process loops back to Step S8004, where the next bit of the bit pattern is tested with respect to the next stored module. When the last bit of the configuration mask bit pattern has been tested, the selected software modules are downloaded from EPROM 222 to DRAM 220 at Step S8008.

In the present embodiment, the software modules are loaded in the following sequence: SCSI Driver; Link Support Layer; Network Driver; Prescan; IPX/SPX; CNETX; SAPSERVER; MONITOR; CPSOCKET; and Print Applications (e.g CPSERVER, CRPRINTER) (see FIG. 6).

After all of the software modules which correspond to the configuration codes stored in NVRAM 228 have been downloaded to DRAM 220, the loader function will pass program execution control to the MONITOR multi-tasking program at Step S8009.

As discussed earlier, the configuration code stored in NVRAM 228 may be remotely altered using CPINIT. This provides greater flexibility for making minor modifications to CPSERVER or CRPRINTER, or where entirely new configurations are desired to be set. Therefore, at Step S8010, a new configuration is received over LAN 6, and is loaded into NVRAM 228 at Step S8011. Preferably, the old configuration code will be erased or overwritten with the new configuration code. Then, the NEB reboots itself and returns to Step S1.

4e. Determining Frame Packet Type Using PRESCAN

On any local area network, data is transmitted between network devices in packets or frames. But even in the context of a common network architecture, such as Ethernet, more than one format for the frame may be supported. Thus, even though it is known that Ethernet architecture is being used, it is not possible to determine the arrangement of data within each physical frame or packet of information on the Ethernet bus. In particular, as described above, Ethernet supports four arrangements of data, or formats, as follows: Ethernet 802.3, Ethernet II, Ethernet 802.2, and Ethernet SNAP.

In conventional network devices-, which provide for a manually selectable operator interface, it is possible to advise the network device of the particular frame type being used on the Ethernet network. In the context of NEB 2, for which operator access is provided only via the network interface (or via the serial port 218 in a test configuration), it is not possible to set the frame packet type without first allowing operator access to the local area network which, of course, requires knowledge of the frame packet type.

The PRESCAN software module allows NEB 2 to automatically determine the frame packet type currently being used for LAN communication on the LAN bus by monitoring broadcast communications on the LAN bus until the proper frame packet type is recognized. PRESCAN makes this determination based on recognizable components that are common to all four frame packet types used on Ethernet.

Figure 9:
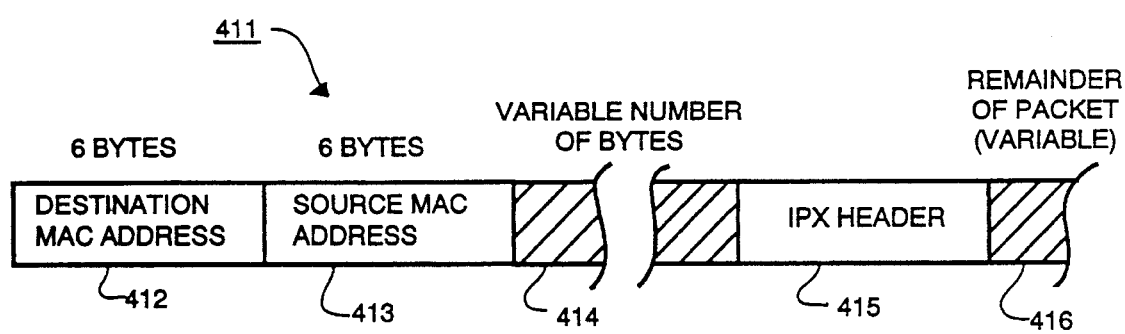
FIG. 9 is a chart showing the physical construction of different frame packets used on Ethernet.

In more detail, FIG. 9 shows the physical construction of different frame packets used on Ethernet. As shown in FIG. 9, a physical frame 411 being transmitted on the LAN bus includes a 6-byte section 412 for storing the destination MAC address, and a 6-byte section 413 for storing the source MAC address. These 12 bytes comprise the first 12 bytes of LAN data packets regardless of the frame type being used for LAN communication. A data section 414 follows these 12 bytes. The data section is comprised of a variable number of bytes which are not used for the same purposes by the different frame packet types and which do not have the same number of bytes for the different frame packet types.

Following the indeterminate area 414, the LAN communication packet includes an IPX header 415 the first two bytes of which always has the value "FFFF" (hexadecimal). The remainder of the packet 416 follows the IPX header and comprises the data and other commands which characterize each different type of LAN communication packet.

PRESCAN operates by monitoring the LAN communication in accordance with each of the different packet types until the common area (such as IPX header 415) is recognized in one of those packet types. PRESCAN then stores that packet type for use by other network communication programs.

Figure 10:
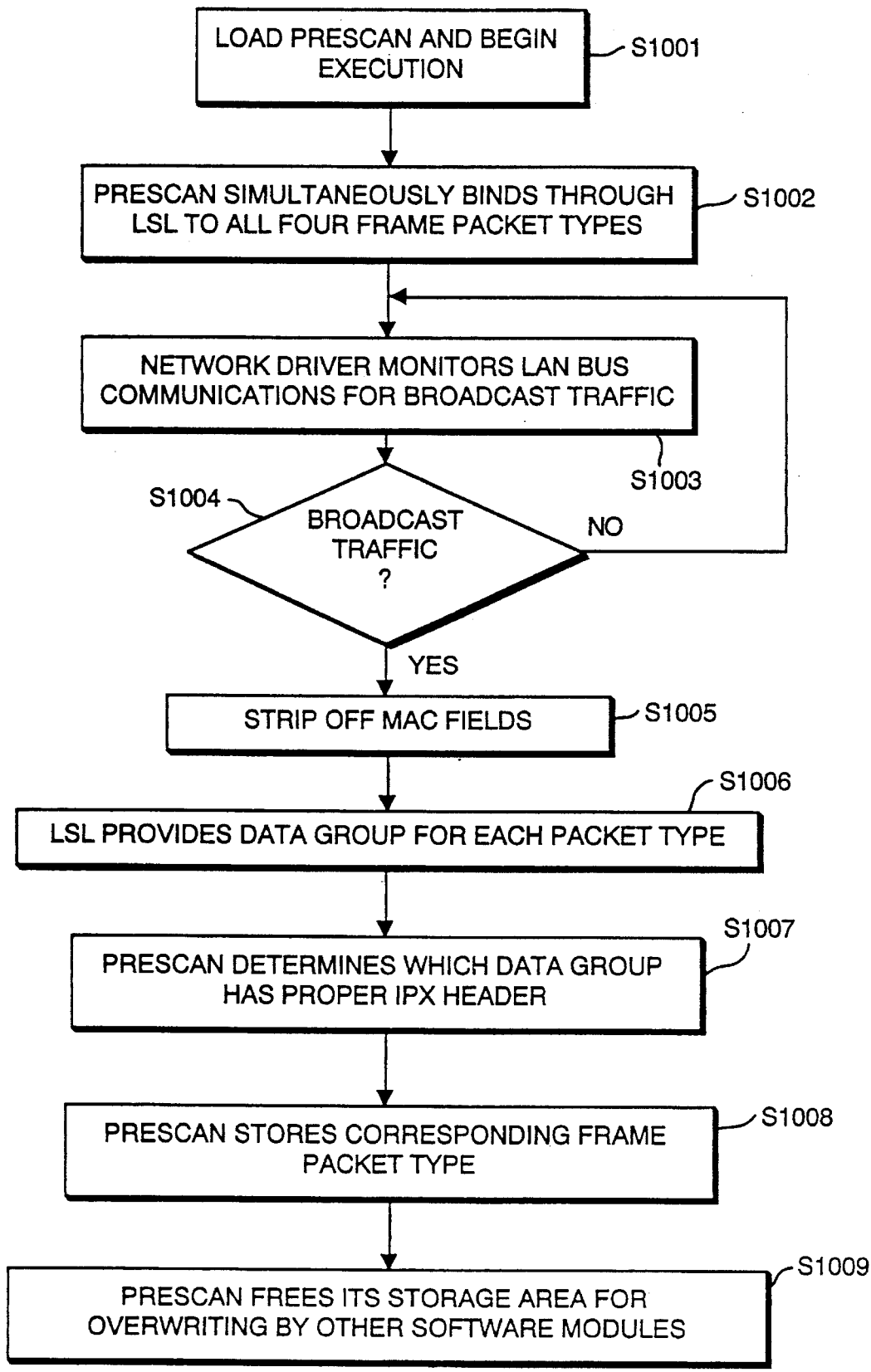
FIG. 10 is a flowchart showing the operation of a PRESCAN software module.

FIG. 10 is a detailed flowchart for showing operation of the PRESCAN module. In Step S1001, microprocessor 216 retrieves the PRESCAN module from EPROM 222 and loads it into DRAM 220 and thereupon begins execution of the PRESCAN module. The PRESCAN module is executed before the SPX and IPX modules, even if microprocessor 216 retrieves those latter modules from EPROM 222 and loads them into DRAM 220 before the operational sequence shown in FIG. 10 is complete. More particularly, proper operation of the SPX and IPX program modules depends upon the identification of the frame packet type by PRESCAN and therefore execution of SPX and IPX is deferred until after PRESCAN determines the proper frame packet type.

In Step S1002, PRESCAN simultaneously binds through LSL to all four frame packet types, namely, Ethernet 802.3, Ethernet II, Ethernet 802.2, and Ethernet SNAP. That is, PRESCAN configures LSL such that for each packet of LAN communication, LSL provides a data group corresponding to each of the four frame packet types. Thereafter, PRESCAN goes inactive pending reactivation by an interrupt from the network driver.

In Step S1003, the network driver monitors communications on the LAN bus for broadcast traffic. Broadcast traffic means that the destination MAC address 412 is unspecified or is given a global specification of "FFFFFFFFFFFF" (hexadecimal). The network driver continues to monitor communications on the LAN bus for broadcast traffic (Step S1004) until broadcast traffic is received, whereupon flow advances to Step S1005. In Step S1005, the MAC address fields 412 and 413 are stripped off the received data packet and the remainder of the data packet is provided to LSL. In Step S1006, LSL interprets the frame packet in accordance with each of the frame packet types and provides a data group in correspondence to each of the frame packet types. In Step S1007, the network driver reactivates PRESCAN which determines which data group provided by LSL has the proper first two bytes, of an IPX header, namely "FFFF" (hexadecimal). That is, because of the variable data area 414 (variable data area 414 corresponding to each of the different packet types (FIG. 9)), LSL will properly identify the IPX header 415 in accordance with only one of the frame packet types. In Step S1007, PRESCAN searches for the IPX header and, in accordance with which of the four data groups is provided by LSL, it is able to determine a frame packet type that is currently being used on the LAN bus.

In Step S1008 PRESCAN stores the corresponding frame packet type in a common area in DRAM 220 so that the frame packet type can be used by other network application programs such as SPX and IPX. Thereafter, in Step S1009, PRESCAN frees its storage area in DRAM 220 so that microprocessor 216 may overwrite that data area with other software modules, if desired.

4f. Multiprotocol Operation

In a multiprotocol operation, two different operating systems carry on LAN communications over a single local area network bus, but using respectively different operating protocols. For example, a Novell-compatible operating system communicates over a LAN bus using SPX/IPX operating protocol, while a UNIX-compatible operating system communicates over the LAN bus using a TCP/IP operating protocol. Other operating systems, such as the AppleTalk® operating system provided by Apple Corporation, use respectively different operating protocols for LAN communication over a single network bus in a multiprotocol network environment.

Ordinarily, NEB 2 is configured to communicate to a single network operating system, but it may also be configured to operate in a multiprotocol network environment, for example, a combined Novell/UNIX multiprotocol environment. In this configuration, NEB 2 includes a Novell-compatible peripheral server, such as the aforementioned CPSERVER, which checks job queues in a file server on a Novell operating system, as well as a UNIX-compatible peripheral server, such as the aforementioned CLPR (Custom Line Printer Remote), which, in coordination with checks made by CPSERVER, also checks for job queues in a file server for a UNIX operating system. Both servers, here CPSERVER and CLPR, service common peripheral resources, here a single peripheral such as a printer, and to avoid contention for control of the common resources, both servers are able to seize control of the peripheral to the exclusion of other servers, to signal other servers that control has been seized, and to relinquish control of the peripheral when the job queue has been emptied. It is also possible for each server to check with other servers to determine if other servers have a pending request for use of the peripheral. In the case where there is a pending request, the server can relinquish control of the peripheral at the end of a current job even though there are jobs remaining in the job queue, so as to allow alternating use of the peripheral by each server.

Figure 11:
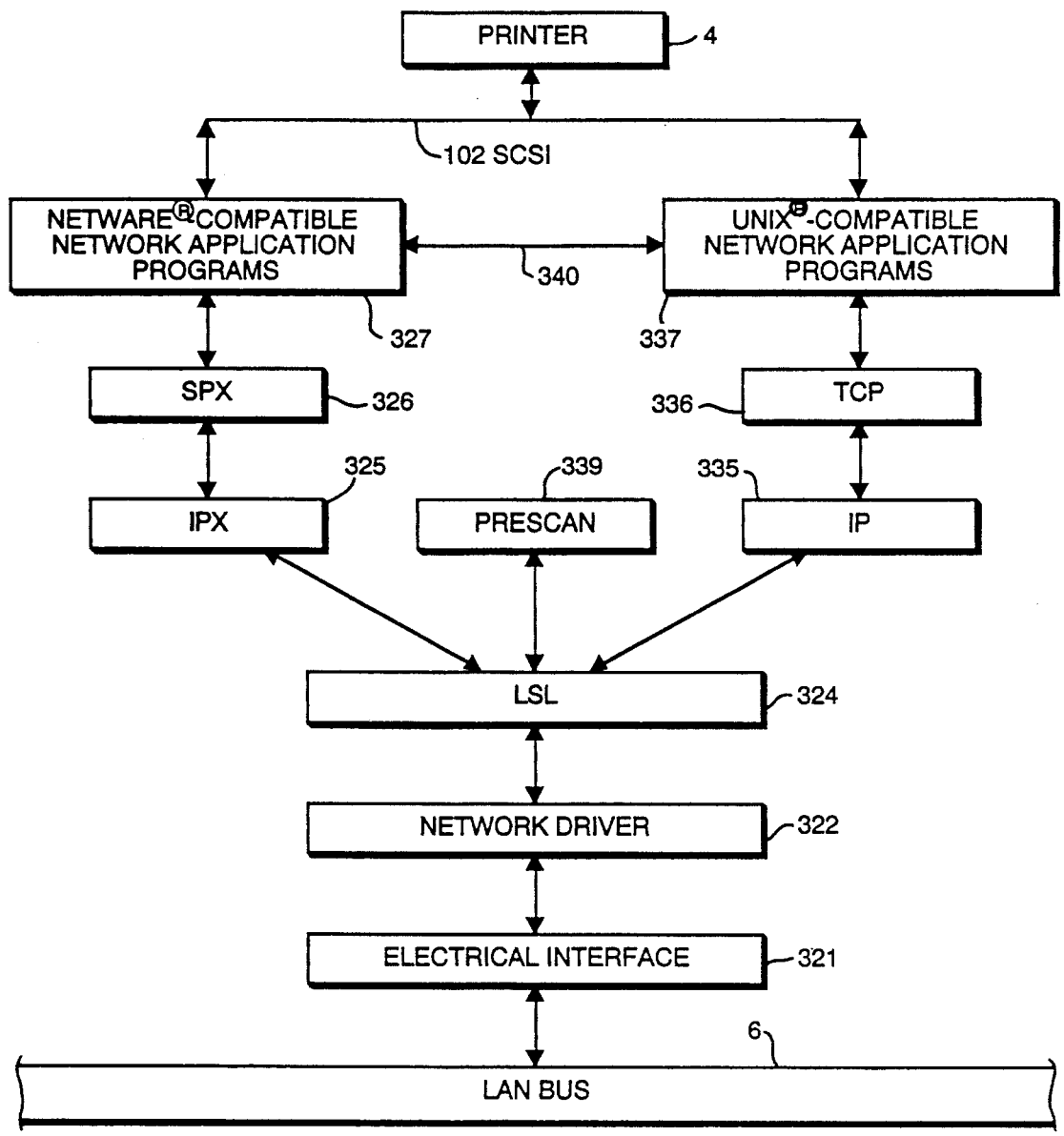
FIG. 11 is a chart showing that the PRESCAN module may be used with other software protocols.

FIG. 11 illustrates NEB 2 configured for multiprotocol network operations. FIG. 11 illustrates a combined Novell/UNIX multiprotocol environment, but it is to be understood that other operating protocols may be substituted for or used in combination with those shown in FIG. 11. In FIG. 11, NEB 2 is interfaced to LAN bus 6 via electrical interface 321, network driver 322, and link support layer ("LSL") 324, much as illustrated above in FIG. 7. Novell-specific operating protocols are indicated at reference numerals 325, 326 and 327. More specifically, 325 and 326 are an SPX/IPX operating protocol stack (or tower) by which Novell-compatible applications programs communicate with the LAN bus through LSL. Novell-compatible applications programs, including a Novell-compatible server such as CPSERVER, are illustrated at 327. The Novell-compatible software drives printer 4 via bi-directional SCSI bus 102 as described above.

UNIX-compatible operating protocols are illustrated at reference numerals 335, 336 and 337. More specifically, 335 and 336 comprise a TCP/IP operating protocol stack (or tower) by which UNIX-compatible application programs communicate to LAN bus 6 via LSL. UNIX-compatible network application programs, including a UNIX-compatible printer server such as CLPR, are designated at 337. The print server CLPR drives printer 4 via SCSI bus 102 as described above.

Prescan module 339 interfaces with LSL 324 to determine the frame packet type being transmitted on LAN bus 6 for each of the operating systems. In more detail, each operating system such as the UNIX operating system and the Novell operating system can communicate on LAN bus 6 in a variety of frame packet types. When LAN bus 6 is an Ethernet type LAN bus, then a UNIX operating system can communicate over the Ethernet by any of three frame packet types, namely, Ethernet 802.2, Ethernet II and Ethernet SNAP. Likewise, when LAN bus 6 is an Ethernet-type bus, then a Novell operating system can communicate over the LAN bus by any of four frame packet types, namely, Ethernet 802.2, Ethernet 802.3, Ethernet II and Ethernet SNAP. It is possible for both the Novell operating system and the UNIX operating system to use the same frame packet type; it is the operating system protocols (SPX/IPX for Novell and TCP/IP for UNIX) which determine which one of the operating systems in a multiprotocol environment is currently communicating on the LAN bus.

In the multiprotocol environment illustrated in FIG. 11, PRESCAN module 339 determines the frame packet type being used by each operating system by repeating the steps shown in FIG. 10 for each of the operating system protocols (see section 4e above). For example, when Novell-compatible and UNIX-compatible systems comprise the multiprotocol environment, then PRESCAN simultaneously binds through LSL to all four frame packet types for an SPX/IPX protocol tower, so as to determine the frame packet type in accordance with the data group returned from LSL which has the proper IPX header. Then, PRESCAN binds simultaneously through LSL through all three frame packet types having a TCP/IP protocol tower. PRESCAN determines the frame packet type being used by the UNIX-compatible operating system in accordance with the data group having the proper TCP/IP header.

In more detail, to adaptively and automatically determine which of plural predetermined frame packet types is currently being used for LAN communication in a multiprotocol network environment, the PRESCAN program module 339 is downloaded from EPROM 222 into DRAM 220 where microprocessor 216 executes the PRESCAN module. To determine the frame packet type for the first operating system, PRESCAN first configures LSL to bind simultaneously to a plurality of frame packet types corresponding to a first operating system protocol, such as SPX/IPX operating protocol for Novell-compatible operating systems. Network driver 322 monitors the LAN communication bus to capture broadcast traffic for the first operating system. In response to capturing such broadcast traffic, LSL provides plural data groups for the captured broadcast traffic, each of the data groups corresponding to a different one of the plural packet types. The PRESCAN module 339 is reactivated to prescan each data group for the presence of a predetermined header, such as the SPX/IPX header, and stores the frame packet type corresponding to the data group having the predetermined header for use by the first operating protocol tower.

To determine the frame packet type being used for the second operating system such as a UNIX operating system, PRESCAN configures LSL to bind simultaneously to a plurality of frame packet types corresponding to the second operating system protocol, such as TCP/IP for a UNIX operating system. The network driver monitors the LAN communication bus to capture broadcast traffic for the second operating system, and provides plural data groups corresponding to the captured broadcast traffic, each of the data groups corresponding to a different one of the packet types. The PRESCAN module prescans each data group for the presence of a predetermined header, such as the TCP/IP header for UNIX, and stores the frame packet type corresponding to the data group having the predetermined header.

Once knowledge of the frame packet types being used by each of the operating systems in the multiprotocol environment has been obtained, the Novell-compatible network application programs 327, such as CPSERVER, and the UNIX-compatible network application programs 337, such as CLPR, can both communicate on the LAN bus 6. The two application programs 327 and 337 also communicate with each other as illustrated schematically by signalling line 340. Using signalling line 340, which may be implemented as a control register stored in DRAM which is commonly accessed by programs 327 and 337, programs 327 and 337 can communicate with each other so as to signal that one of them has seized exclusive control over printer 4 or to signal that one of them has a pending request for use of printer 4, as will be described more fully hereinbelow.

In operation, a first server such as CPSERVER, checks its operating system job queue, and if there is print information in the job queue, receives the print information from its operating system. In coordination with job queue checks by the first server, the second server such as CLPR checks its operating system job queue and, if there is print information in the job queue, receives job information from the operating system. When one of the servers has acquired sufficient information to require use of the printer peripheral, it seizes exclusive control of the printer, and signals to other servers via signalling line 340 that it has exclusive control of the printer. This prevents contention problems whereby other servers may inadvertently try to insert print jobs into printer 4.

The first server retains exclusive control over printer 4 until its job queue has been emptied. When its job queue has been emptied, the first server relinquishes control of printer 4 after which it may be used by any of the other servers.

Alternatively, even though the first server's job queue might not yet be empty, when the first server reaches the end of a print job, the first server may interrogate other servers via the signalling line 340 to determine if the other servers have requests pending for the use of printer 4. If other servers have requests pending, then the first server may temporarily relinquish control of the printer so as to permit alternating use of the peripheral by each of the servers. In this case, when the first server relinquishes control over the printer, it also signals that it has a pending request for use of the printer.

4g. Advertising Multiple Servers From A Single Network Node Using SAPSERVER

As mentioned above, NetWare® only allows a single network server from each non-fileserver network node to advertise its services on the LAN bus. However, in the multi-tasking environment established by the non-preemptive MONITOR, NEB 2 provides more than one network server. In particular, NEB 2 provides the services of the print server (CPSERVER, CRPRINTER or CLPR) as well as the services of the socket server (CPSOCKET). The SAPSERVER program module allows both network servers to advertise their services from a single network node, here the NEB, in a LAN communication system which normally supports advertising of only a single network server from each node. SAPSERVER accomplishes this by acting as a surrogate server (or SAP'ing entity) from the NEB which interleavedly advertises the services of each of its client servers, here CPSOCKET and CPSERVER.

SAPSERVER listens to the network for SAP broadcast requests directed to one of its clients and responds with the server type of its client, the server name, and a communication socket number by which the client can establish direct LAN communication.

Figure 12:
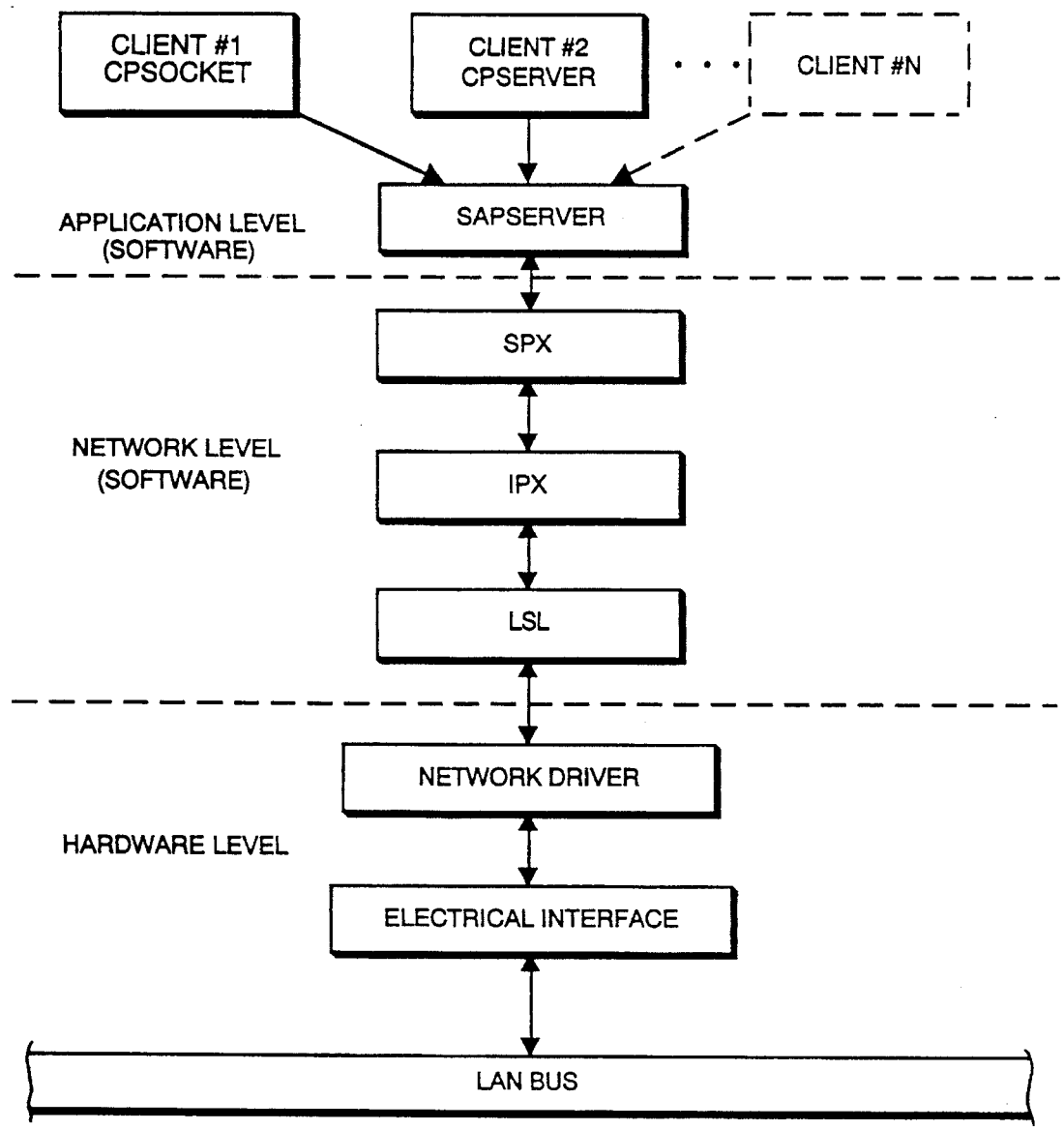
FIG. 12 is a chart for explaining the software structure of the SAPSERVER program.
Figure 13:
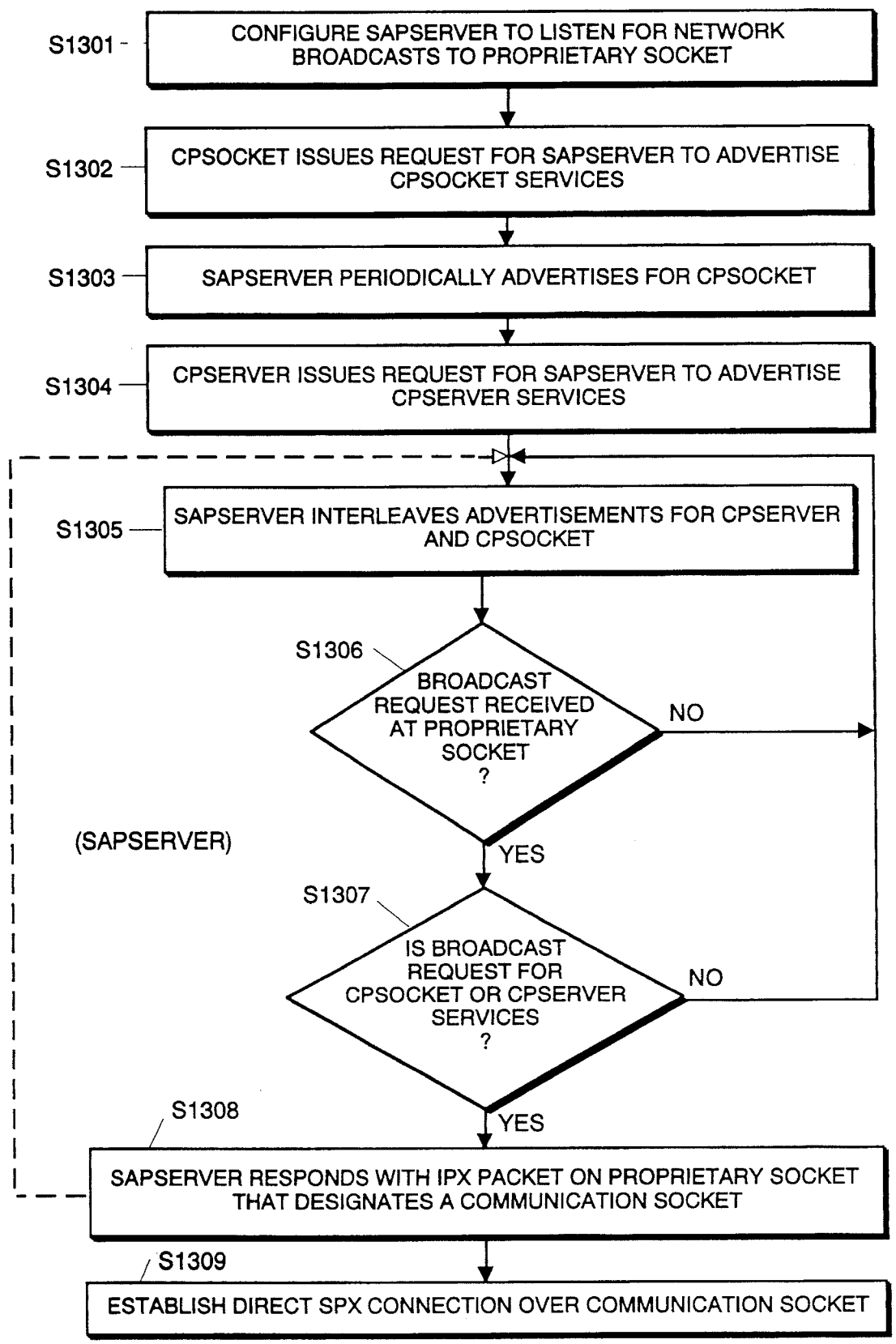
FIG. 13 is a flowchart showing the operation of SAPSERVER.

FIG. 12 is a view for explaining the software structure of SAPSERVER, and FIG. 13 is a flow diagram for explaining operation of SAPSERVER.

As shown in FIG. 12, SAPSERVER is positioned in the software hierarchy at the application level of software so that it can communicate directly with the SPX and IPX network levels of software. SAPSERVER acts as a surrogate SAP'ing entity for each of its clients which in the case of NEB 2 consists of the socket server program CPSOCKET and the print server program CPSERVER as designated by the configuration of the board. SAPSERVER may also be configured to serve other clients as well, as illustrated diagrammatically at "CLIENT N".

As shown in FIG. 13, after microprocessor 216 retrieves the SAPSERVER program module from EPROM 222 and stores it in DRAM 220, microprocessor 216 commences operation of the SAPSERVER program and configures it to listen for SAP proprietary broadcasts to the SAP proprietary socket (Step S1301). In Step S1302, after microprocessor 216 retrieves the CPSOCKET module from EPROM 222 and stores it for execution in DRAM 220, the CPSOCKET program module issues a request to SAPSERVER to advertise CPSOCKET services. In accordance with standard SAP protocol, SAPSERVER commences periodic advertisements for CPSOCKET (Step S1303), for example, at one minute intervals.

In Step S1304, after microprocessor 216 retrieves the CPSERVER module from EPROM 222 and stores it for execution from DRAM 220, CPSERVER issues a request to SAPSERVER for SAPSERVER to advertise CPSERVER services over the network. SAPSERVER commences periodic SAP advertisements for the services of CPSERVER and also continues to advertise the services for CPSOCKET. As shown in Step S1305, the advertisements are interleaved.

Step S1306 determines whether a broadcast request has been received at the SAP proprietary socket (e.g. socket number 453). Until a broadcast request has been received at the proprietary socket, SAPSERVER simply continues to interleavedly advertise for the services of CPSERVER and CPSOCKET. However, when a broadcast request is received at the proprietary socket then in Step S1307 SAPSERVER determines whether the broadcast request is for the services of one of its clients, here for the services of CPSOCKET or CPSERVER. If the broadcast request is not for one of SAPSERVER's clients, then flow simply returns to Step S1305 where SAPSERVER continues to interleavedly advertise for its clients. On the other hand, if the broadcast request is for one of SAPSERVER's clients, then flow advances to Step S1308.

In Step S1308, SAPSERVER responds with an IPX packet on the proprietary socket number 453. The IPX packet contains the server type of its client, the server name, and a communication socket number. The IPX packet also designates a communication socket over which the broadcast requestor can establish direct communication with the client. Thereupon, SAPSERVER returns to Step S1305 so as to continue to interleavedly advertise for each of its clients.

In Step S1309, the broadcast requester establishes direct SPX connection with the client designated in the broadcast request over the communication socket designated in Step S1308. In the present configuration, where services of the print server CPSERVER is requested, the socket number is 8060. On the other hand, when requests for services of the CPSOCKET server is requested, the socket number is 83B4 for communication and 83B5 for connection. Direct communication then proceeds as described more fully hereinbelow.

4h. Configuring The Networked Printer Using CPINIT

Figure 14:
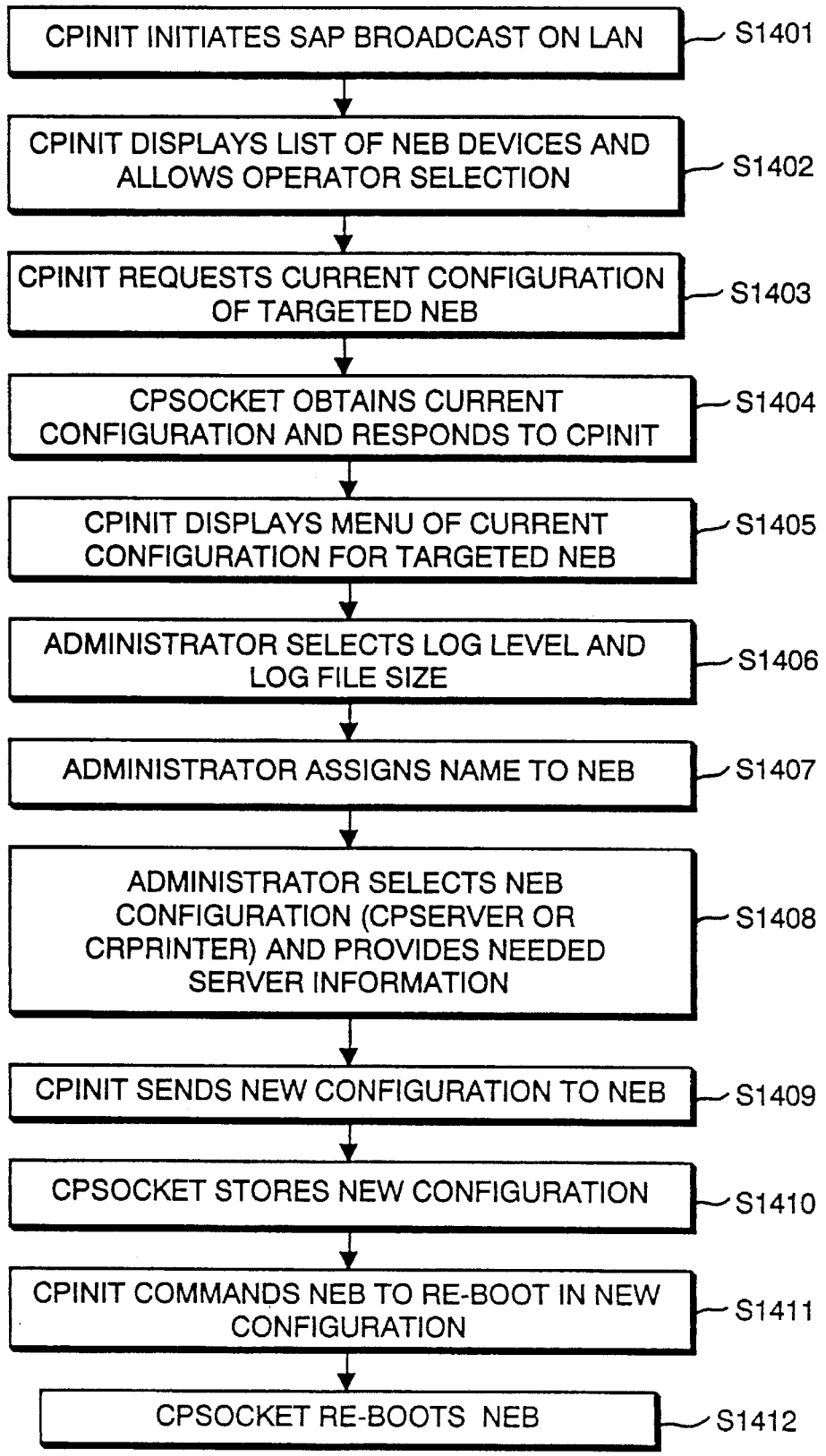
FIG. 14 is a flowchart showing the operation of a CPINIT program.

FIG. 14 is a flow diagram showing how a network administrator can use CPINIT from PC 14 to initialize and to configure, and later to reconfigure, both NEB 2 and printer 4 in which the NEB resides.

In Step S1401, the CPINIT utility uses a service advertising protocol (SAP) on the network to determine which networked printer devices are available to respond to CPINIT inquiries. At each of the NEB boards, CPSOCKET responds with server type, server name and a unique socket number by which each NEB can be accessed directly, and an indication of whether or not the NEB requires configuration.

In Step S1402, CPINIT constructs a list of all NEB's and their associated devices, and presents them in a menu form so that they can be selected by the system administrator. Following selection, CPINIT requests the current configuration of the targeted NEB (Step S1403). More specifically, CPINIT sends a request to the targeted NEB via the LAN interface. At the NEB, CPSOCKET, receives the request for configuration information from the LAN interface. CPSOCKET collects the needed configuration information, and directs it via the LAN interface to CPINIT at the system administrator's PC 14 (Step S1404). In Step S1405, CPINIT displays a menu of the current configuration of the targeted NEB.

In Steps S1406 through S1408, the system administrator specifies a desired configuration for the targeted board. More particularly, configuration is specified on the system administrator's PC 14 by means of a user interface such as a menu display. The following configuration parameters are selected by the operator to set the configuration information: (1) logging information (Step S1406), (2) NEB name (Step S1407), and (3) application type (such as CPSERVER) (Step S1408).

Under logging information, the system administrator specifies one of four different levels of logging: "NONE", in which logging is disabled; "AUTO" in which basic printer usage statistics are logged once per day; "ERROR", in which basic printer usage statistics and error events are logged as they occur; and "JOB", in which basic usage printer statistics, error events and job start/end information are all logged as they occur. After selecting the log preference, the system administrator must also set the maximum log size (except when "NONE" is selected) so as to permit the printer to reserve this amount of space on its disk (or on its NVRAM 111 in the event there is no printer disk or in NVRAM 228 in the NEB) for storing log information.

Under NEB name information (Step S1407), the system administrator may assign an alphanumeric name to the NEB, such as a descriptive name like "2nd Floor Laser". The descriptive name is stored by the NEB in its NVRAM and is used by the NEB and other network devices to assist in identification.

Under application type selection (Step S1408), the system administrator selects whether to configure the NEB as a CPSERVER or a CRPRINTER. If CPSERVER is selected, it is necessary to designate the name of the print server assigned to the NEB, password, application buffer size, queue service mode, form numbers, the printer number of the printer in which the NEB resides, the name(s) of the print queue(s) serviced by the NEB, and the name of the primary file server. If CRPRINTER is selected, it is necessary for the system administrator to designate the name of the print server through which the NEB obtains its print information, the printer number of the printer in which the NEB resides, the name(s) of the print queue(s) serviced by the NEB, and the name of the primary file server.

In Step S1409, CPINIT sends the new configuration to the NEB via the network LAN. At the targeted NEB, CPSOCKET receives the new configuration information and stores it in NVRAM 228 (Step S1410).

To complete the configuration of the NEB, the NEB should be re-booted. The system administrator issues a command via CPINIT which in turn sends a command to re-boot via the LAN to the targeted NEB (Step S1411). At the NEB, CPSOCKET receives the command to re-boot, and re-boots the NEB in the new configuration (Step S1412).

4i. Accessing the Networked Printer Using CPCONSOL

CPCONSOL is a utility program executed from the system administrator's PC 14 by which the NEB can be used for maximum control and efficiency of the networked printer. Using CPCONSOL, it is possible to remotely track routine and ongoing maintenance parameters. For example, it can be determined if toner is low, if the paper tray is empty, if a page is jammed, or if the printer is not responding at all. CPCONSOL can also keep track of the total number of pages printed to schedule routine and preventative maintenance, as well as plan for eventual printer replacement.

The CPCONSOL utility gives the system administrator access to statistics about the printer operation as well as the efficiency of network communications. CPCONSOL can determine the total number of pages printed, as well as the average page-per-minute rate, average pages-per-day, and other statistics that allow monitoring of the operating efficiency of the printer.

The network statistics allow gauging the efficiency of communications on the network, frequency of transmit and receive errors as well as retries, overrun, and underrun errors.

When multiple printers are installed, CPCONSOL can remotely keep track of each printer's usage, both in terms of total jobs as well as total pages. This allows job tracking such as for direct departmental billing for items such as consumable paper costs.

By ongoing monitoring CPCONSOL can help determine whether to relocate or add network printers for better efficiency as well as forecast the need for replacement.

CPCONSOL can also set up default (safe) environment parameters which ensure that the printer is configured the same way prior to each print job (see section 4m below). The user, of course, can modify that configuration within the print job itself.

Figure 15:
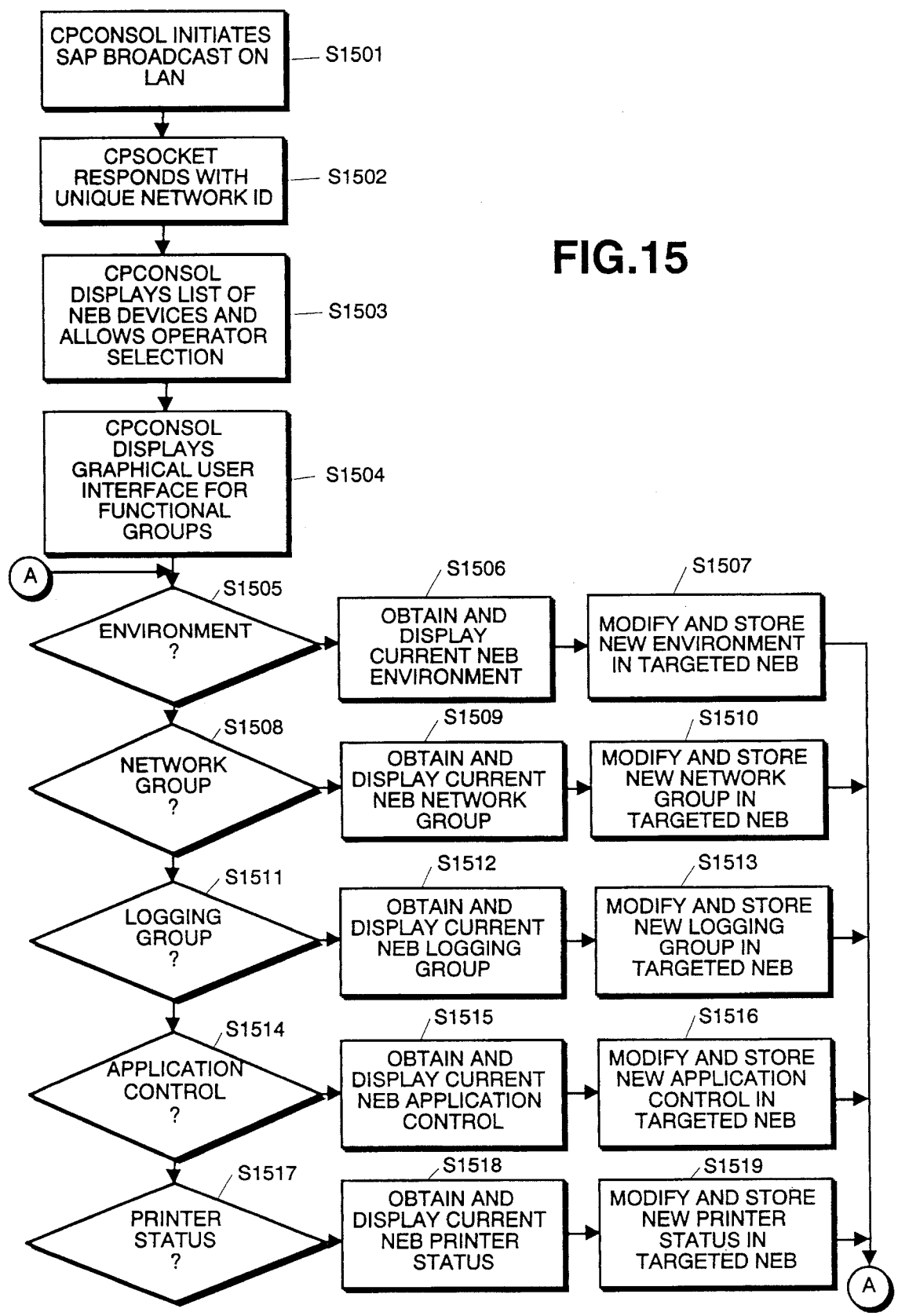
FIG. 15 is a flowchart showing the operation of a CPCONSOL program.

FIG. 15 is a detailed flow chart showing operation of CPCONSOL. Like CPINIT, CPCONSOL first broadcasts on the LAN to request identification of all NEB devices attached to the LAN (Step S1501). At the NEB's, CPSOCKET responds with the unique network ID's and the communication socket numbers assigned to the NEB (Step S1502). CPCONSOL collects this response information for all NEB's and displays a list of responding NEB's to the administrator (Step S1503). The administrator selects one of the NEB's whereupon CPCONSOL establishes direct network communication with the selected NEB by means of LAN broadcasts to the network ID and socket numbers.

Once direct LAN communication is established with the target NEB, CPCONSOL operates by means of a user interface such as a menu display (Step S1504). The menu divides the functions of CPCONSOL into five groups: Environment, Network, Logging, Application Control, and Printer Status. These functional groups are detailed in the following sections.

Environment Group (Step S1505)

The environment selection allows CPCONSOL to display the current environment of the selected printer (Step S1506), and to modify and store the new environment (Step S1507). The environment is subdivided into four groups: Common Environment, Interface, Control, and Quality.

Upon selecting Common Environment, CPCONSOL will initiate a LAN request to the target NEB for the settings for Emulation Mode, Feeder, and Total Page Count. CPSOCKET at the target NEB will receive the LAN request, obtain the desired information from its attached printer via the bi-directional SCSI interface, and send the information to CPCONSOL at the administrator's PC 14 via the LAN interface. There, CPCONSOL displays a listing showing the emulation mode, the feeder, and the total page count.

Upon selecting the Interface menu CPCONSOL will initiate a LAN request to the targeted NEB for interface information. When the NEB responds, CPCONSOL causes the interface listing to display the interface that is currently set for the selected printer.

Selecting the Control menu likewise causes CPCONSOL to initiate a LAN request to the targeted NEB which in turn interrogates its printer via the bi-directional SCSI bus for printer settings. The printer settings are returned to CPCONSOL over the LAN interface which displays the current settings of the printer in accordance with Table 3.

TABLE 3

| Control Information | Description |
|---|---|
| Contrast | Printer contrast setting. |
| Timeout | This is the setting of the job time-out set in the printer. |
| Message | Language in which messages are displayed. |
| Copy | Number of copies of each page to be printed. |
| Offset X | The offset, if any, in the horizontal direction from the upper left corner of the page, in millimeters. |
| Offset Y | The offset, if any, in the vertical direction from the upper left corner of the page in millimeters. |
| Error Skip | Displays whether the printer is set for automatic or manual error skipping. |
| Buzzer | On or Off setting of the printer buzzer. |
| Toner Low | If the toner low, a WARNING is displayed. |
| 28-Error | Detection of Memory Full error can be turned on or off. |
| Paper | Paper sizes that are available in the printer. |
| Current Paper | Paper cassette that is currently selected in the printer. |

Upon selecting the Quality group, CPCONSOL, after requesting and receiving information from the targeted NEB via the LAN interface, displays the settings for Selection Mode, Refine, Memory Usage and Low Resolution mode.

Network Group (Step S1508)

The network selection allows CPCONSOL to display the compiled statistics about the networked printer performance on the network (Step S1509), and to modify and store the new network group (Step S1510). These are subdivided into media-dependent and media-independent related transmit and receive statistics. CPCONSOL can also clear all statistics.

When the system administrator selects the Network group, CPCONSOL initiates a network request via the LAN interface to the targeted NEB. At the NEB, CPSOCKET, responds to the request and obtains the needed performance information. The information is collected by CPSOCKET and returned to CPCONSOL at the administrator's PC 14 via the LAN interface. At the administrator's PC 14, CPCONSOL displays the media-dependent and media-independent transmit and receive information.

Media-dependent receive and transmit statistics are summarized in Tables 4 and 5.

TABLE 4

| Media-Dependent Receive Statistic | Description |
|---|---|
| CRC | Total number of Cyclic Redundancy Check errors detected by the LBP-Remote |
| Missed Frames | Number of packets missed due to lack of space in the receive buffer, or the controller is in the monitor mode. |
| Align Errors | Indicates that the incoming packet did not end on a byte boundary. |
| Received Disabled | Controller was in the monitor mode. |
| Deferring | Set when internal Carrier Sense or Collision signals are generated in the encoder/decoder. |
| Overflow | Buffer ran out of space while data was being received from the network. |
| Overruns | The buffer did not respond fast enough to keep data from flowing from the network. |

TABLE 5

| Media-Dependent Transmit Statistic | Description |
|---|---|
| Collisions | Packet Collision Total |
| Heartbeat | Number of failures of the transceiver to transmit a collision signal after transmission of a packet with this bit set. |
| Out of Window Call | Set for the number of collisions that occurred after slot time. |
| Underruns | The buffer did not respond fast enough to keep data from flowing to the network. |

Media independent statistics display the network statistics that aren't related to the transmission media. Such statistics are a good summary of overall printer activity on the network, and are summarized Table 6.

TABLE 6

| Media Independent Parameter | Description |
|---|---|
| Abort Rx Frame | General receive problems. |
| Total Rx Frame | Total number of received frames. |
| Rx Too Big | Receive frame larger than expected. |
| Rx Too Small | Receive frame smaller than expected. |
| Abort Tx Frame | General transmit problems. |
| Total Tx Frame | Total number of transmitted frames. |

Logging Group (Step S1511)

The logging group selection allows CPCONSOL to display the set of job-related statistics that the NEB compiles (Step S1512), and to modify and store the new logging group (Step S1573). The displayed data include job averages, page averages, and performance data. CPCONSOL can reset the totals to zero with this menu as well. In addition to statistics, the NEB can create a log for every print job, write the log to a work station disk, or clear the log file, as configured by CPINIT.

If the system administrator selects the Logging Group option, then CPCONSOL directs a LAN request for the log file to the targeted NEB via the LAN interface. At the NEB, CPSOCKET receives the request and, since CPSOCKET stores the log file on the printer, requests the log file from the printer via the bi-directional SCSI interface. The NEB retrieves the log file from wherever it is stored (such as its disk 114) and provides the file to CPSOCKET via the bi-directional SCSI interface. CPSOCKET then puts the log file onto the network via the LAN interface for receipt by CPCONSOL.

The log file includes values for the statistics which are divided into three categories: Daily, Cumulative, and Average. Daily shows the values for the current day. Cumulative shows the totals for all days since last reset, or since power-on for a printer without a disk drive. Average is the cumulative totals divided by the number of days since the last reset. For each of the three categories, the NEB maintains totals for the following values (unless CPINIT has set the logging level to "NONE"): days (number of days since a reset was issued or since power-on), pages printed, print jobs processed, off-line time, and printing time.

CPCONSOL also retrieves the stored log file to the screen for viewing and printing. The log file is in reverse chronological order and includes the following record types. The precise content of the log file varies in accordance with the logging level set by CPINIT, as summarized in Table 7.

TABLE 7

| Type | Data | Description |
|---|---|---|
| STD | <Days><Pages><Jobs><Offline><Printing> | daily statistics |
| STC | <Days><Pages><Jobs><Offline><Printing> | cumulative statistics |
| STA | <Days><Pages><Jobs><Offline><Printing> | average statistics |
| SOJ | <Application><User><Job><File server><Queue><Form> | start of job |
| INI | <NEB Type><ROM/MAC Address><Printer Name> | Initialization record |
| POW | <NEB Type><ROM/MAC Address> | power on |

TABLE 7-continued

| Type | Data | Description |
|---|---|---|
| | <Printer Name> | record |
| RBT | <NEB Type><ROM/MAC Address> | reboot |
| | <Printer Name> | record |
| WAR | <Application><Warning> | warning |
| EOJ | <Application><User><Job><Disposition> | end of job |
| ERR | <Application><Error> | error |

Application Control (Step S1514)

Application control allows CPCONSOL to view the current configuration of the NEB within the network (as either CPSERVER or CRPRINTER) (Step S1515) and to activate/deactivate or modify and store that application (Step S1516). Access to the targeted NEB is provided via the LAN interface which responds to the CPCONSOL request by putting a result code on the LAN interface.

Printer Status (Step S1517)

This menu allows CPCONSOL to display the current status of the printer attached to the NEB (Step S1518), and to modify and store the new printer status (Step S1519). CPCONSOL directs a status request to the targeted NEB via the LAN interface. At the targeted NEB, CPSOCKET receives the status request and sends a request for the needed status information to the printer via the bi-directional SCSI interface. CPSOCKET receives the status information from the printer over the bi-directional SCSI interface and directs the information back to CPCONSOL where it is displayed on the system administrator's PC 14.

There are 29 possible status conditions, "NORMAL" being the most common, as summarized in Table 8.

TABLE 8

| Status | Meaning |
|---|---|
| NORMAL | On-line, ready to print or printing |
| OFFLINE | Off-line, not ready to print- |
| ENGINETEST | Engine test detected |
| MAINTRUNNING | Maintenance program running |
| PAPEROUT | Paper tray is empty |
| PRINTEROPEN | The printer top is open |
| PAPERJAMx | Paper is jammed at location "x" |
| NOEPCART | No EP cartridge is present |
| TONERLOW | The toner cartridge is low |
| ULFEED | U-L feed |
| LOADx | Your paper is loading |
| LOADnn | Load paper "nn" |
| FEEDx | Feed Paper [x = message] |
| FEEDnn | Feed paper "nn" |
| OCx | CaPSL output call [n = message] |
| SETUPPER | Set to upper tray |
| TRAYFULL | Paper output tray is full |
| PAGEFULL | The page is full |
| LINEERROR22 | 22 line error (see printer manual) |
| LINEERROR40 | 40 line error (see printer manual) |
| DLMEMORYFULL | Download memory full |
| WKMEMORYFULL | Working memory full |
| JOBREJECT | Job has been rejected |
| PRINTCHECK | Print check error |
| OPTREMOVAL | Option removal |
| FONTFULL | Font configuration are full |
| WARMINGUP | Printer is in warmup |

TABLE 8-continued

| Status | Meaning |
|---|---|
| SERVICE CALL | Service call is needed |
| TRANSIENT | A transient, unidentified error occurred |

4j. NEB Responses to Status Inquiry Using CPSOCKET

CPSOCKET is an application program which runs out of DRAM 220 on the NEB 2 in the multi-tasking soft-time environment provided by the non-preemptive MONITOR. CPSOCKET causes SAPSERVER to monitor the NEB's broadcast socket on the LAN for broadcasts from client programs such as CPINIT, CPCONSOL and DOWN-LOADER.

CPSOCKET is responsible for the internal configuration of the NEB, such as configuration as either a PSERVER or an RPRINTER. Configurations are set at the request of CPINIT, as described above, but it is CPSOCKET that receives those configuration commands and physically alters NVRAM 228.

CPSOCKET also maintains a table of default settings for the device environment (that is, a guaranteed safe environment, see section 4m below), downloads the basic configuration information for the printer and for the NEB (for example, fonts and emulations) at device power-up (see section 4d above), provides device status information, statistics, and log information in response to CPCONSOL requests, and provides reset, re-boot, and firmware download capabilities.

Figure 16A:
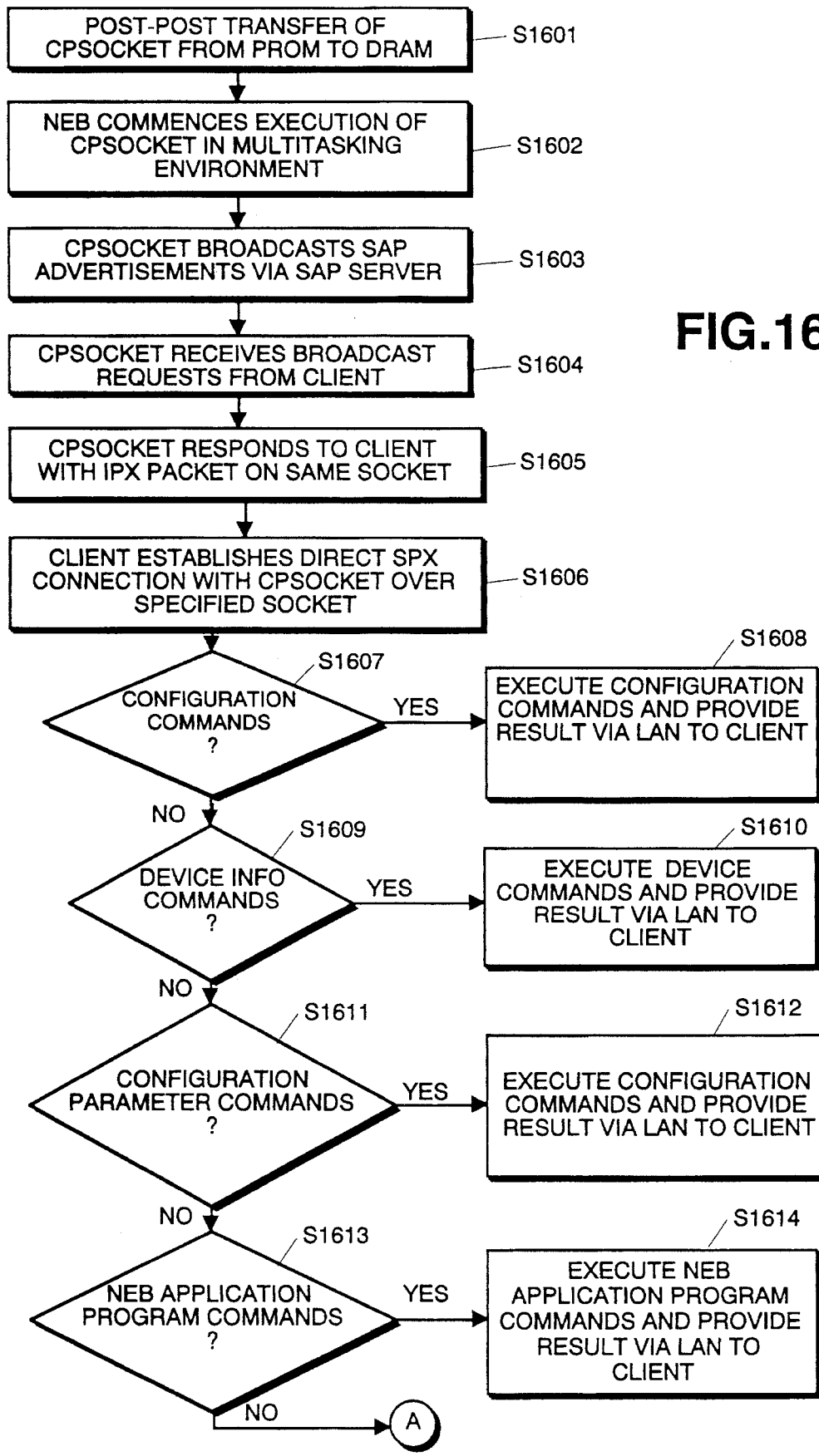
FIGS. 16A and 16B comprise a flowchart showing the operation of a CPSOCKET program.
Figure 16B:
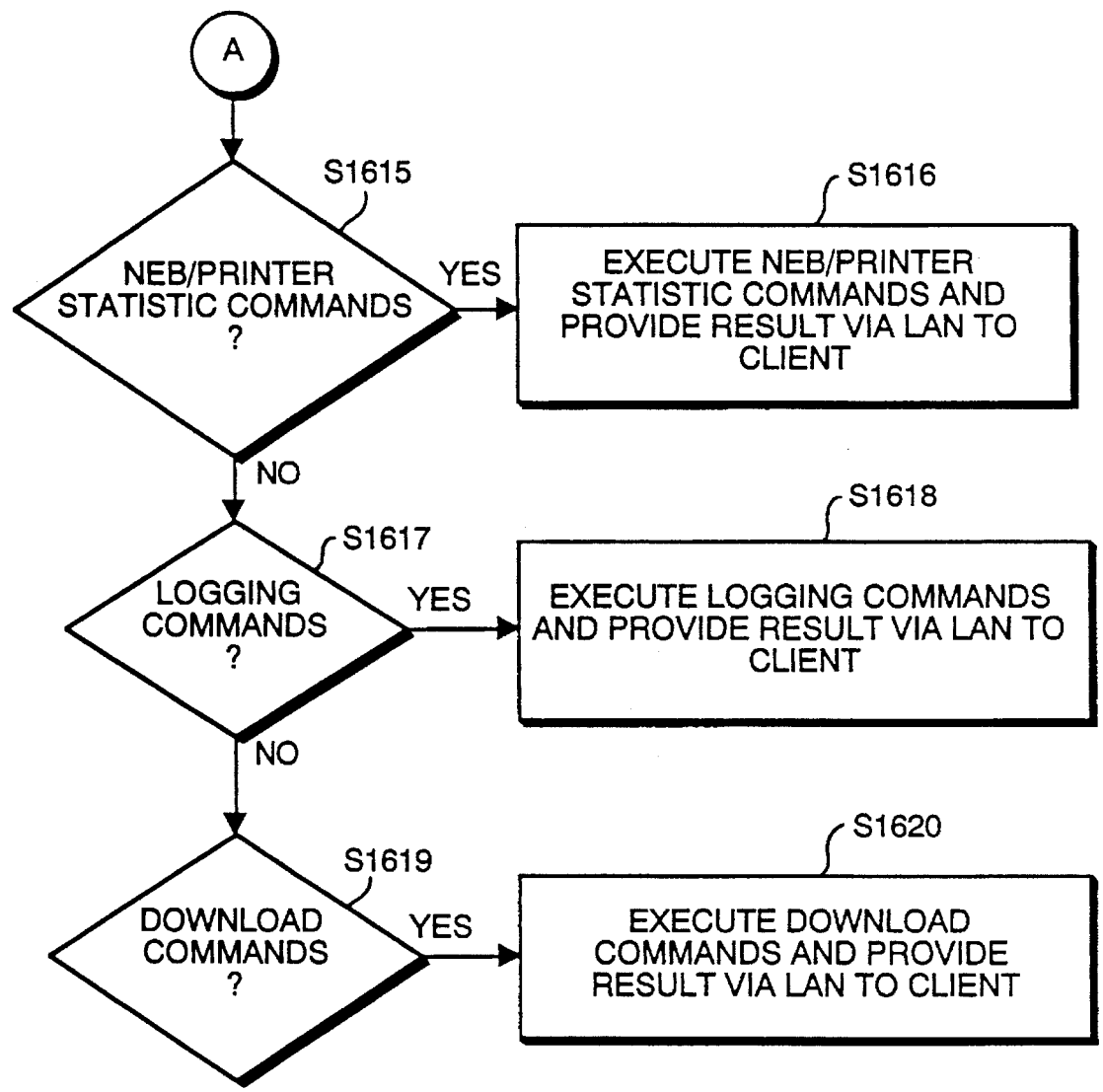

FIGS. 16A and 16B comprise a detailed flow diagram showing operation of the CPSOCKET program. In Step S1601, after successful power-on-self-test (POST), microprocessor 216 transfers the CPSOCKET program module from its storage locations in EPROM 222 into appropriate storage locations in DRAM 220. During transfer, microprocessor 216 configures the CPSOCKET program in accordance with the configuration information for the CPSOCKET program stored in NVRAM 228. Thus, for example, it is possible to selectively activate certain portions of the CPSOCKET program module in accordance with desired levels of complexity, those desired levels of complexity being stored in NVRAM 228.

In Step S1602, the NEB commences execution of the CPSOCKET from DRAM 220. CPSOCKET is executed in a multi-tasking soft-time environment by the non-preemptive MONITOR which permits non-preemptive execution of other application programs such as CPSERVER without letting one application program seize control of the microprocessor to the exclusion of other application programs.

In Step S1603, CPSOCKET broadcasts its existence over the LAN interface via service advertising protocol broadcasts (SAPSERVER) which contain a proprietary socket number (see sectoin 4g above). Because other servers are operating in the multi-tasking environment established in Step S1602, and because the Netware®-compatible software only permits a single non-fileserver server to advertise from a single network node such as the NEB, CPSOCKET broadcasts its SAP advertisements via the SAPSERVER program. As described more fully above in paragraph 4g, the SAPSERVER program permits two network servers to broadcast from a single network node even when the network supports only single servers for each network node.

In Step S1604, CPSOCKET receives a broadcast request from a client, for example, CPINIT or CPCONSOL on proprietary socket 453. CPSOCKET responds to the client (Step S1605) with an IPX packet on the same socket.

In Step S1606, the client establishes direct SPX communication with CPSOCKET over a socket number that is pre-assigned to CPSOCKET, here socket number 83B4 for communication or 83B5 for connection. In accordance with that direct connection, CPSOCKET receives and interprets client requests and/or commands that are received over the LAN interface, monitors the status of the printer over the bi-directional SCSI interface, receives and sends status commands and/or inquiries to the printer via the bi-directional SCSI interface, reconfigures the NEB and the NEB configuration parameters, and sends requested information to the client via the LAN interface. These steps are described more fully below in connection with Steps S1607 through S1620 of FIGS. 16A and 16B.

In more detail, in Step S1607, if CPSOCKET determines that a configuration command has been received, then flow advances to Step S1608 in which the configuration commands are executed and the result provided via the LAN to the client. Configuration commands are listed in Table 9 and generally pertain to the configuration of the NEB board as either a CPSERVER or an CRPRINTER in accordance with configuration commands initiated by the CPINIT program.

TABLE 9

Configuration Commands

| Command | Data (CPINIT → CPSOCKET) | Reference (CPSOCKET → CPINIT) |
| --- | --- | --- |
| request for current configuration | none | current NEB settings (CPSERVER/ RPRINTER/LPR) |
| reconfigure/ deconfigure | Desired Configuration | new configuration confirmation |
| activate/ deactivate application | none | confirmation |
| reset | none | confirmation |
| re-boot | none | none |

If in Step S1609, CPSOCKET determines that a device information command has been received, then flow advances to Step S1610 in which those device information commands are executed and the results provided to the LAN interface. In general, device information pertains to the interface, control status, font set and environmental settings of the printer 4 attached to NEB 2. Device information commands in Step S1610 permit reading printer device information, setting printer device information, reading default settings for that information, and resetting the default settings to desired values. Device information commands are detailed in Table 10.

TABLE 10

Device Information Commands

| Command | Data (CPCONSOL → CPSOCKET) | Response (CPSOCKET → CPCONSOL) |
| --- | --- | --- |
| request for interface status | none | interface status |
| request for control status | none | printer control information for CPCONSOL "control" menu |
| request for font status | none | printer font set |
| request for layout status | none | printer layout (portrait/land scape, etc.) |
| request for quality and common environment status | none | printer macros |
| request for duplex status | none | printer duplex mode |
| request for miscellaneous | none | miscellaneous printer info (collation, stapling, paper folding, paper trays, etc.) |
| request for default control status | none | default printer control information for CPCONSOL "control" menu |
| request for default font status | none | default printer font set |
| request for default layout status | none | default printer layout (portrait/ landscape, etc.) |
| request for default quality and environment status | none | default printer macros |
| request for default duplex status | none | default printer duplex mode |
| request for default miscellaneous printer info | none | default miscellaneous printer info (collation, stapling, paper folding, paper trays, etc.) |
| set control | new printer control information for CPCONSOL "control" menu | confirmation |
| set font | new printer layout (portrait/landscap e, etc.) | confirmation |
| set quality and common environment | new printer macros | confirmation |
| set duplex | new printer duplex mode | confirmation |
| set miscellaneous printer info | new miscellaneous printer info (collation, stapling, paper hold, paper trays, etc.) | confirmation |
| set default control | default printer control information for CPCONSOL "control" menu | confirmation |

TABLE 10-continued

Device Information Commands

| Command | Data (CPCONSOL → CPSOCKET) | Response (CPSOCKET → CPCONSOL) |
|---|---|---|
| set default layout | default printer layout (portrait/landscape, etc.) | confirmation |
| set default quality and common environment | default printer macros | confirmation |
| set default duplex | default printer duplex mode | confirmation |
| set default miscellaneous printer info | default miscellaneous printer info (collation, stapling, paper holding, paper trays, etc.) | confirmation |

If in Step S1611, CPSOCKET determines that a configuration parameter command has been received, then flow advances to Step S1612 in which CPSOCKET executes the received command and provides the result via the LAN to the client. As shown in Table 11, configuration parameter commands pertain generally to parameter values stored in the NEB concerning time, date, safe printer environment information, logging options, log file size, etc.

TABLE 11

Configuration Parameter Commands

| Command | Data (CPINIT → CPSOCKET) | Response (CPSOCKET → CPINIT) |
|---|---|---|
| request for current configuration parameters | none | configuration parameters (e.g. time, data, safe printer environment info, logging options, etc.) |
| set new configuration parameters | configuration parameters (e.g. time, data, safe printer envirorment info, logging options, etc.) | confirmation |

If in Step S1613 CPSOCKET determines that a NEB application program command has been received, then flow advances to Step S1614 in which CPSOCKET provides information on the current application program, namely RPRINTER, PSERVER, or LPR (for UNIX). Application program information generally includes server name, file server queue, device ID, etc., as detailed in Table 12.

TABLE 12

Application Program Information

| Command | Data (CPINIT → CPSOCKET) | Response (CPSOCKET → CPINIT) |
|---|---|---|
| request for CRPRINTER info | none | CRPRINTER info |
| set CRPRINTER | new CRPRINTER info | confirmation |

TABLE 12-continued

Application Program Information

| Command | Data (CPINIT → CPSOCKET) | Response (CPSOCKET → CPINIT) |
|---|---|---|
| info request for CPSERVER info | none | CPSERVER info |
| set CPSERVER info | new CPSERVER info | confirmation |
| request for CLPR info | none | CLPR info |
| set CLPR info | new CLPR info | confirmation |

If in Step S1615 (FIG. 16B) CPSOCKET determined that a NEB/printer statistic command has been issued, then flow advances to Step S1616 in which CPSOCKET interrogates the printer through the bi-directional SCSI interface to obtain needed printer statistics. The statistics correspond to the network group displays described above in connection with CPCONSOL, as well as to print job statistics such as the total number of pages printed, the total number of jobs, the total number of off-line time, etc. The job statistics correspond to the logging group described above in connection with the CPCONSOL program. Specific examples of the commands executed in the NEB/printer statistics commands are set forth in Table 13.

TABLE 13

Statistics Commands

| Command | Data (CPCONSOL → CPSOCKET) | Response (CPSOCKET → CPCONSOL) |
|---|---|---|
| request network statistics | none | network statistics for CPCONSOL "NETWORK" menu |
| clear network statistics | none | confirmation |
| request job statistics | none | job statistics for CPCONSOL "LOGGING" menu |
| clear job statistics | none | confirmation |

If in Step S1617 CPSOCKET determines that a logging command has been received, then flow advances to Step S1618 in which CPSOCKET obtains the log file from the printer disk 114 via the bi-directional SCSI interface, and sends the log file to the client via the LAN interface. Logging commands are summarized Table 14.

TABLE 14

Logging Commands

| Command | Data (CPCONSOL → CPSOCKET) | Response (CPSOCKET → CPCONSOL) |
|---|---|---|
| request log file | block # | next block number of log file and log data |
| clear log request | none | confirmation |

If in Step S1619 CPSOCKET determines that a download command has been received from the LAN interface, then flow advances to Step S1620 in which CPSOCKET executes the download request, for example, by receiving downloadable code and storing it in specified locations in DRAM 220, by providing checksum data for the downloadable code, and by flashing the downloadable code into EPROM 222. Some of the more important download commands are summarized in Table 15.

TABLE 15

| | Download Commands | |
|---|---|---|
| Command | Data (DOWNLOAD → CPSOCKET) | Response (CPSOCKET → DOWNLOAD) |
| download request | code | confirmation |
| call request | checksum, starting address | confirmation |
| flash EPROM | checksum | confirmation |

4k. Logging Peripheral Statistics

As described earlier with respect to FIG. 5A, Steps S9 through S12 comprise an automatic logging function in which peripheral statistics (e.g. number of pages printed per day) and error events are automatically logged (stored) for later retrieval; and wherein the logging level (statistical resolution) may be varied by the network administrator. In general, the network administrator may select a logging level, and then extract printer statistics and error events from the log file at any time. The network administrator's portion of such functions has been described above in paragraph 4i, and reference may be had to the discussion and tables set forth therein, especially Table 7 which indicates the content of the log file depending upon the logging level set by CPINIT.

As background, few LAN peripherals maintain their own statistics, but the NEB 2 includes the capability of logging the current status and daily statistics of printer 4 at midnight of each day. This relieves the system administrator from having to remember to do this on a daily basis. The status and statistics data may be stored in printer hard disk 114, printer NVRAM 111, NEB DRAM 220, or in the NEB NVRAM 228. The location of the stored log file may be selected by the network administrator depending upon the remaining memory capacity of each of those memories, and the statistics required by the logging level selected by the network administrator. For example, if the printer has a hard disk, the network administrator may choose the fairly-detailed "JOB", logging level so that voluminous statistics may be retained. On the other hand, if the printer has no hard disk, the network administrator may choose the less-detailed "ERROR" logging level so that less storage space is required. If the log file is filled, new error data will merely wrap around in the memory replacing old error data with new error data.

The NEB will automatically store printer statistics such as pages printed, jobs printed, off-line time, and print time each night for access for the system administrator at a later time. The statistics can be used to anticipate replacement of consumable printer supplies, such as toner, and to monitor user behavior such as leaving the printer off-line for extended periods of time.

In general, the logging function is accomplished by the printer controller board always knowing what time it is. When a printer/controller board is first powered on, the board finds the nearest server and requests the time. The board continues to do this every minute. When the day of the week changes, the board automatically requests the printer to report its page count. The board then calculates the daily statistics and stores them either to the printer hard disk or to the board NVRAM. These statistics are stored and available to the external network program CPCONSOL that can display them to a screen or save them to an external file.

As described above in paragraph 4i, the network administrator may select four logging levels: NONE; AUTO; ERROR; and JOB. At the NONE level, no logging statistics are maintained (although they may still be calculated every minute and temproarily kept in NEB DRAM 220). At the AUTO level, daily statistics are maintained for printer features such as printing days, pages, jobs, off-line time, and print time. The number of cumulative pages printed is determined by the printer, but the other statistics are determined by the NEB.

The ERROR logging level maintains the daily statistics discussed above, and also error conditions in the printer and also errors that occur in an application (i.e. CPSERVER). The NEB queries the printer every minute for such error conditions. Such printer error conditions may include: off-line; out-of-paper; printer-is-open; paper-jam; no-toner-cartridge; toner-is-low; printer feed and load errors; tray-is-full; line errors; print-job-rejected; font-is-full; service call; etc. Application errors may include: fileserver down; primary fileserver unavailable; CPSERVER running elsewhere; IPX not installed; etc.

The JOB logging level maintains the daily statistics and error conditions noted above and also maintains job start and job end information, which are determined by the NEB. Of course, the number and types of logging levels, and the data retained in each logging level may be varied according to the particular peripheral and the particular LAN in which the NEB is installed.

Figure 17A:
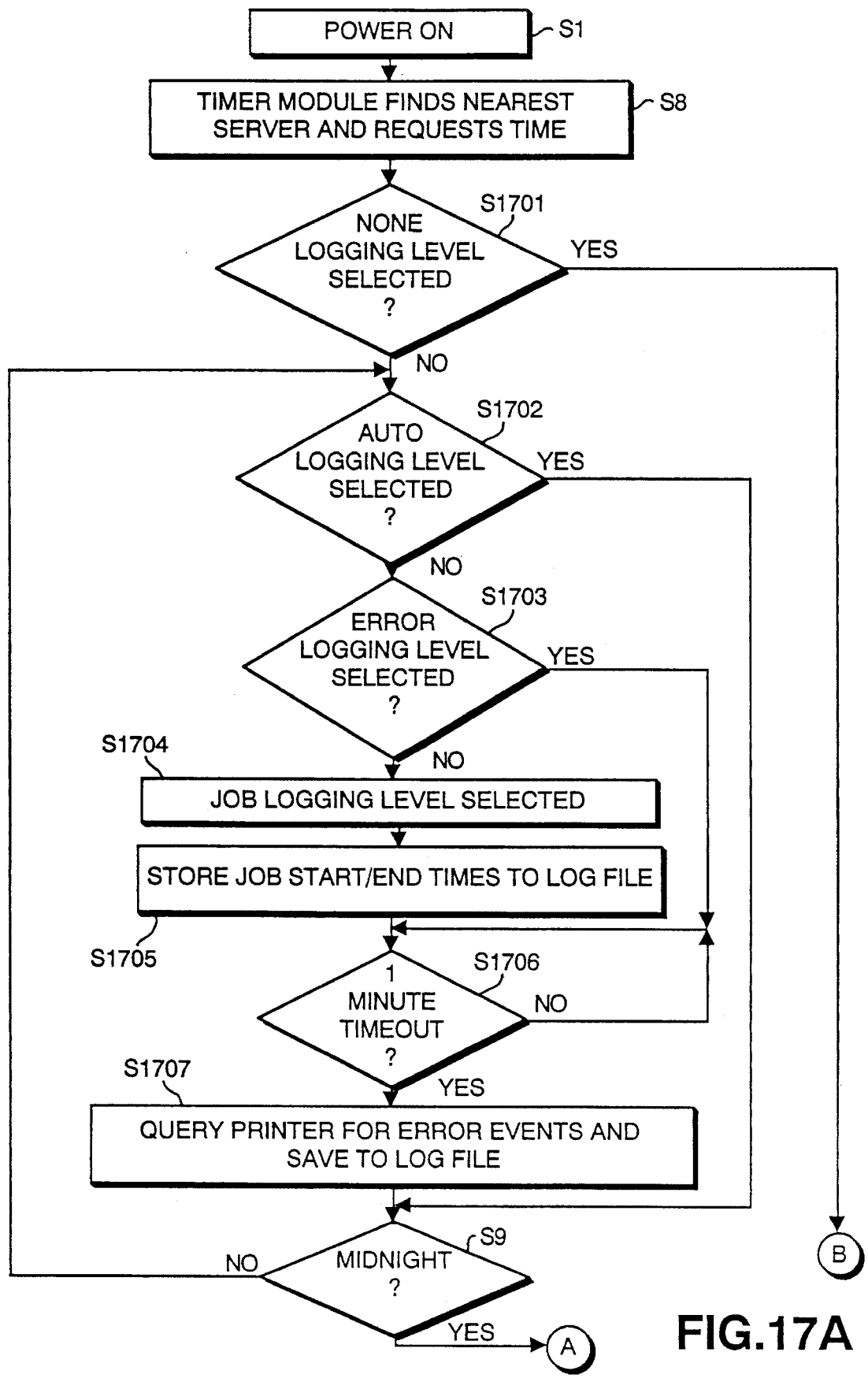
FIGS. 17A and 17B comprise a flowchart showing the automatic logging of peripheral statistics.
Figure 17B:
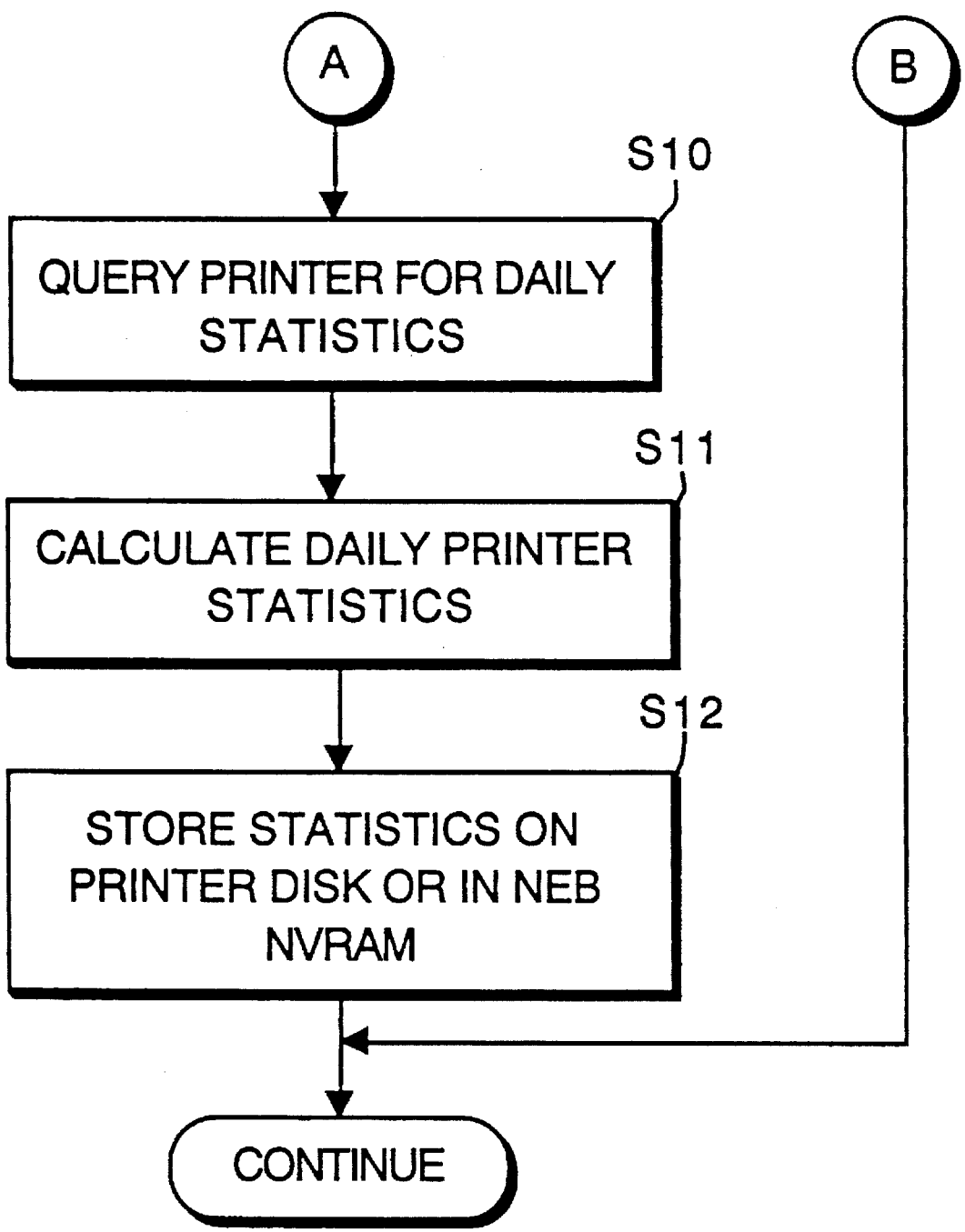

FIGS. 17A and 17B comprise a flow chart showing the overall operation of the automatic logging function within the NEB. Reference may also be had to FIG. 5A and Table 7 noted above. At Step S1, power is applied to the NEB and at Step S8, the timer module finds the nearest server and requests the time. At Step S1701, it is determined whether the NONE logging level has been selected. If the NONE logging level has been selected, the process skips to the end of the flowchart where a return is made to the overall flow diagram of FIGS. 5A, 5B and 5C.

If the NONE logging level has not been chosen in Step S1701, Step S1702 determines whether the AUTO logging level has been selected. If the AUTO logging level has been selected, the process proceeds to Step S9 where midnight is awaited. However, if the AUTO logging level has not been selected, Step S1703 determines whether the ERROR logging level has been selected. Where the ERROR logging level has been selected, the process skips to Step S1706 where a one minute timeout is awaited. However, if the ERROR logging level has not been selected, it is determined in Step S1704 that the JOB logging level has been selected. In this case, Step S1705 stores the job start and job end times to the log file. At Step S1706, a one minute timeout is awaited whereafter Step S1707 queries the printer for error events and saves such events to the log file. Thus, when either the ERROR or JOB logging levels have been selected, the board queries the printer every minute for error events and stores such error events in the log file.

Step S9 waits for midnight whereupon the NEB queries the printer for its daily statistics at Step S10 FIG. 15B). If midnight has not been reached in Step S9, the procedure returns to Step S1702 where it is determined which logging level has been selected.

In Step S11, the daily printer statistics are calculated utilizing the printer statistics received in Step S10. Thereafter, in Step S12, the daily statistics and the error events are stored in the printer hard disk 114 and/or the printer NVRAM 111, and/or the NEB NVRAM 228. Note here that the network administrator may select to store logging statistics and error events in any combination of memories, providing further flexibility to the LAN.

The logging functions discussed above are quite significant in making the printer an interactive and responsive member of the LAN since the SCSI connection between the NEB and the printer is capable of extracting volumes of specific data from the printer.

4l. Multi-tasking Independently Executable Programs

As briefly described earlier with respect to Step S20 of FIG. 5B, the NEB EPROM 222 stores a MONITOR program which is a mechanism which supports multi-tasking in the run-time environment while permitting synchronous operation in a de-bug environment. MONITOR permits currently-called tasks to be performed on a non-preemptive basis while the NEB awaits real-time interrupts from either the LAN (for CPSERVER or CPSOCKET) or through the SCSI interface (e.g., when status information is being provided from the printer to the NEB in response to a previously-received status request from the LAN). Thus, MONITOR permits all currently-executing tasks to be performed simultaneously by sharing use of the microprocessor 216. Of course, all soft-time applications, including MONITOR itself, are interruptable by real-time events.

Figure 18:
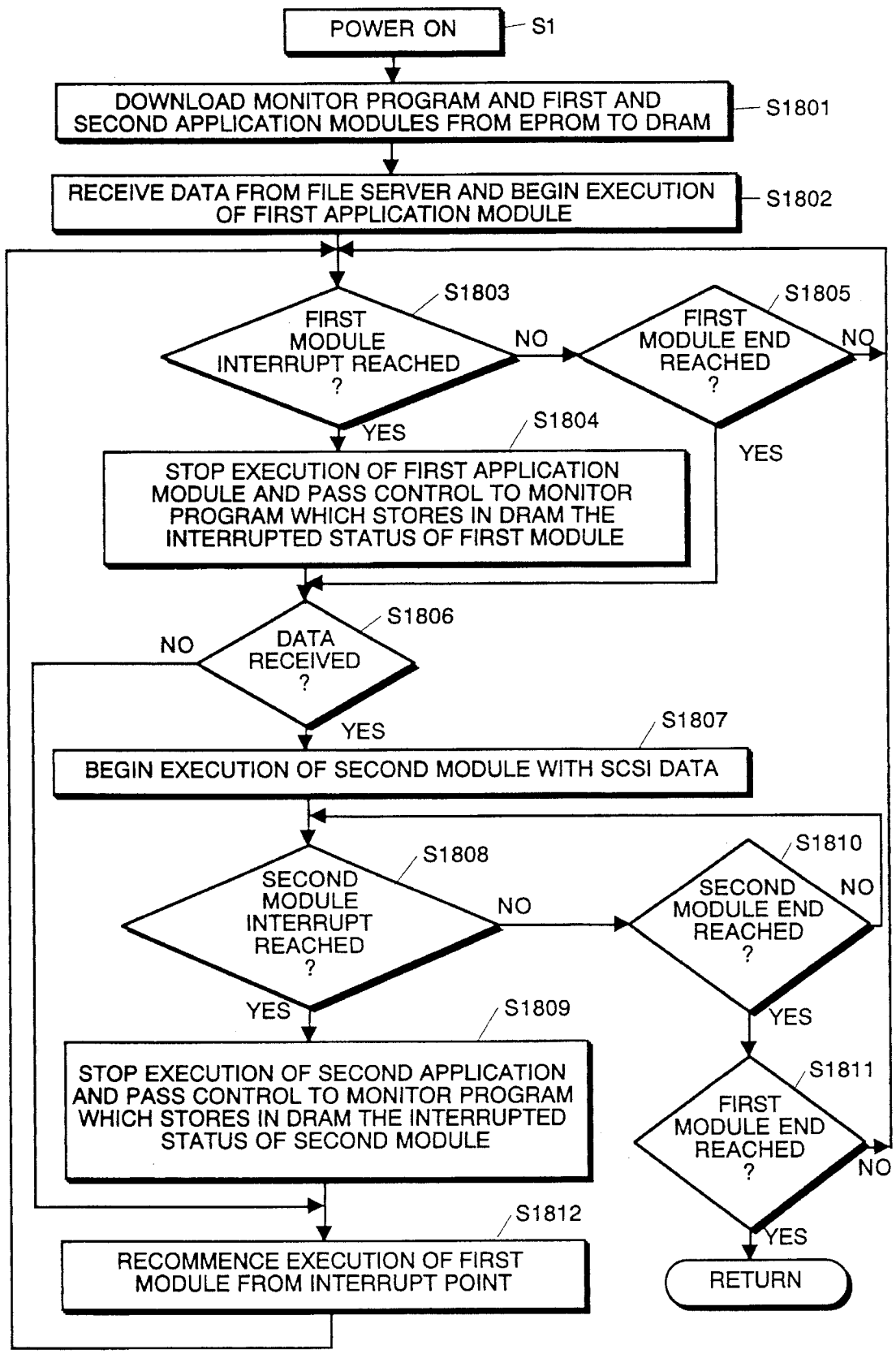
FIG. 18 is a flowchart showing how multi-tasking processing is performed.

FIG. 18 is a notional flowchart of a sequence of events which may occur in order to illustrate the multi-tasking operation within the NEB. At Step S1, power is applied to the NEB, and the MONITOR program is downloaded from EPROM 222 to DRAM 220 in Step S1801. For example, the following modules are downloaded together with MONITOR: SCSI Driver; Link Support Layer; Network Driver; Prescan; IPX/SPX; Customized NETX; SAPSERVER; CPSOCKET; and Print Applications (see FIG. 6).

If, at Step S1802, print data is received from file server 30, CPSERVER will begin processing the received job data in preparation for transmission to the printer 4. Processing of such print information is now in the "soft-time" environment, and Step S1803 determines whether a relinquish interrupt has been received from the program processing the print data. If a relinquish interrupt has been reached at Step S1803, execution of the currently-executing module is stopped and control is returned to MONITOR at Step S1804. MONITOR saves the state of the interrupted task in DRAM 220. However, if the relinquish interrupt has not been reached at Step S1803, the process proceeds to Step S1805 where it is determined whether the currently-executing module has reached an end. If the end has not been reached in Step S1805, the program waits until another relinquish interrupt is reached in Step S1803.

If the currently-executing module has been stopped at Step S1804, or if the currently-executing module has reached an end at Step S1805, it is determined at Step S1806 whether data has been received which requires the execution of another software module, e.g., where data is received over the SCSI interface in response to a previously-issued request for printer status. If it is determined in Step S1806 that such data has been received, Step S1807 begins execution of another application module using the newly-received data.

At Step 1808, it is determined whether a relinquish interrupt has been reached in the second application module. If such an interrupt has been reached, the second application will stop execution and pass control to MONITOR which stores in DRAM 220 the state of the just-interrupted second module at Step S1809. However, if the relinquish interrupt in the second module has not been reached at Step S1808, it is determined at Step S1810 whether the end of the second module has been reached. If the end has not been reached, the program merely awaits the relinquish interrupt at Step S1808. If it is determined that the second module end has been reached in Step S1810, Step S1811 determines whether the first module end has been reached. Where the end of the first module has not been reached, but the end of the second module has been reached, the process returns to waiting for a relinquish interrupt in the first application module at Step S1803. If both the first and second modules have reached their end at Step S1811, control will return to the MONITOR program in order to execute other newly-received soft-time tasks.

After the second application module has stopped executing due to reaching a relinquish interrupt therein, control is passed to MONITOR which, after storing the state of the interrupted module in DRAM 220 (Step S1809), will recommence execution of the first module in Step S1812, and continue execution of the first module until another first module relinquish interrupt is reached at Step S1803.

Thus, the non-preemptive multi-tasking allocation of the microprocessor resources allows processing of a number of tasks in parallel on a near real-time basis.

4m. Placing the Printer in a Default Configuration

As discussed above with respect to Step S25 in FIG. 5C, the NEB will ensure that the printer is set to a known, default configuration at the beginning or end of a print job. The NEB does this by downloading to the printer's non-volatile memory (either hard disk 114 or NVRAM 111) a default configuration code which indicates the default environment (e.g. portrait mode, 10 point type, Roman lettering, etc.) in which the printer should be left at the conclusion of a print job. Upon receiving a print data stream from the LAN, the NEB retrieves the configuration code from the printer's non-volatile memory, appends the configuration code to a block of print data as an escape sequence, and then downloads the print job block with appended escape sequence to the printer. The printer will then conduct a printing operation, and (based on the escape sequence) will leave the printer in the desired default configuration.

Novell NetWare® software includes the ability to reset a network printer in a default environment after every print job. It does this by having the file server 30 install what amounts to a fake print job at the head of the print job itself. However, the exact printer escape sequences necessary to set particular printer default configurations reside in a database on the network, and not within the printer itself. Therefore, if it is desired to operate UNIX on the LAN, or where there is a problem with the file server itself, the printer may not be restored to a default configuration which ensures that the next print job will be printed with the printer in a known configuration.

A method of guaranteeing a printer default environment using the NEB operates on the difference that the printer reset state configuration and requisite escape sequence instructions reside within the printer itself, and the printer itself is responsible for resetting its own environment within print jobs. Thus, the printer reset feature is available without depending upon any device external to the printer. Furthermore, the initial default configuration may be loaded and subsequently modified from a remote location over the LAN through the NEB's serial or parallel interfaces.

The configuration code may be sent to the NEB through the CPCONSOL program, as discussed above in section 4i.

It may be convenient to store a plurality of default configuration codes in the printer non-volatile memory in order to allow the network administrator great flexibility for printer usage on the LAN. For example, print jobs received from an engineering source may require the printer to default to a portrait mode, whereas print jobs received from accounting may require that the printer be left in a spread sheet mode. Thus, by ensuring a known default environment, any of a number of LAN sources may utilize the printer for their specific jobs.

Figure 19:
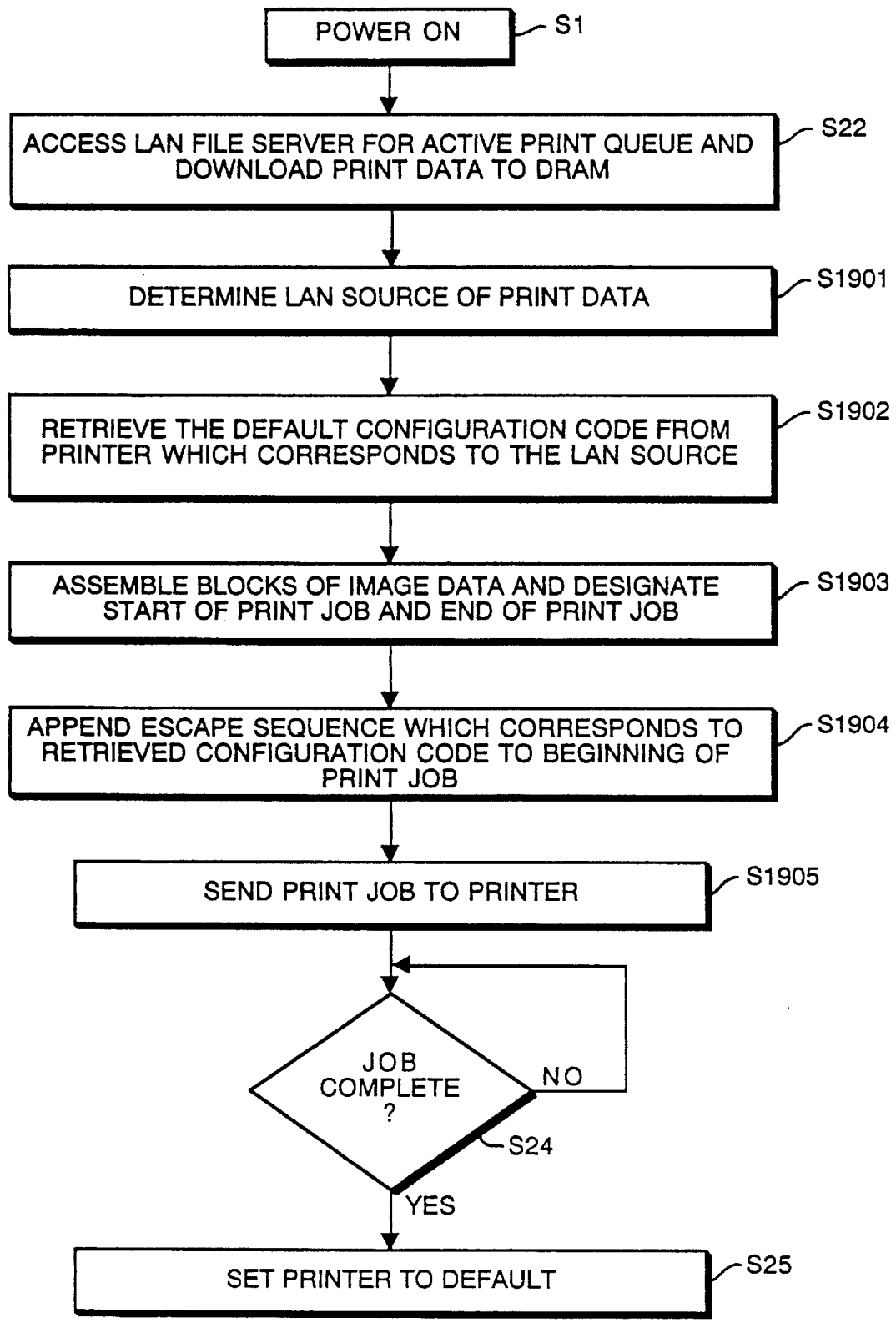
FIG. 19 is a flowchart showing how to place the printer in a safe, default configuration.

FIG. 19 depicts a more detailed flowchart for setting the printer default configuration. At Step S1, power is applied to the NEB, and at Step S22, the NEB accesses the LAN file server for active print queues and downloads print data to the DRAM 220.

If the printer non-volatile memory stores more than one default configuration code, it may be necessary to first determine what type of data is being transmitted from the LAN in order to determine which default configuration the printer should be left in. Therefore, Step S9101 determines the LAN source of the print job, and Step S1902 retrieves the appropriate default configuration code from the printer, which code corresponds to the determined LAN source.

At Step S1903, the NEB assembles blocks of image data and designates a start-of-print-job and an end-of-print-job for each print job. At Step S1904, the NEB microprocessor 216 appends to a print job an escape sequence which corresponds to the retrieved configuration code. Preferably, the escape sequence is appended to the beginning of the print job, but it may be appended to the end of the print job, or to both the beginning and end of the job. Then, at Step S1905, the print job, with appended escape sequence, is transferred to the printer, and the printer then renders print according to the received print job. When a print job is completed after Step S24, the printer will set itself to a default environment at Step S25, which environment corresponds to the default configuration code retrieved in Step S1902. Therefore, the printer will be left in a default environment which ensures that the next print job will begin with the printer in a known configuration.

Thus, a robust and efficient hardware and software solution has been found for ensuring that the printer itself stores a default configuration and is responsible for placing itself in a default condition at the end of every print job.

4n. Downloading Executable Files into the NEB from a Remote LAN Location

Figure 20:
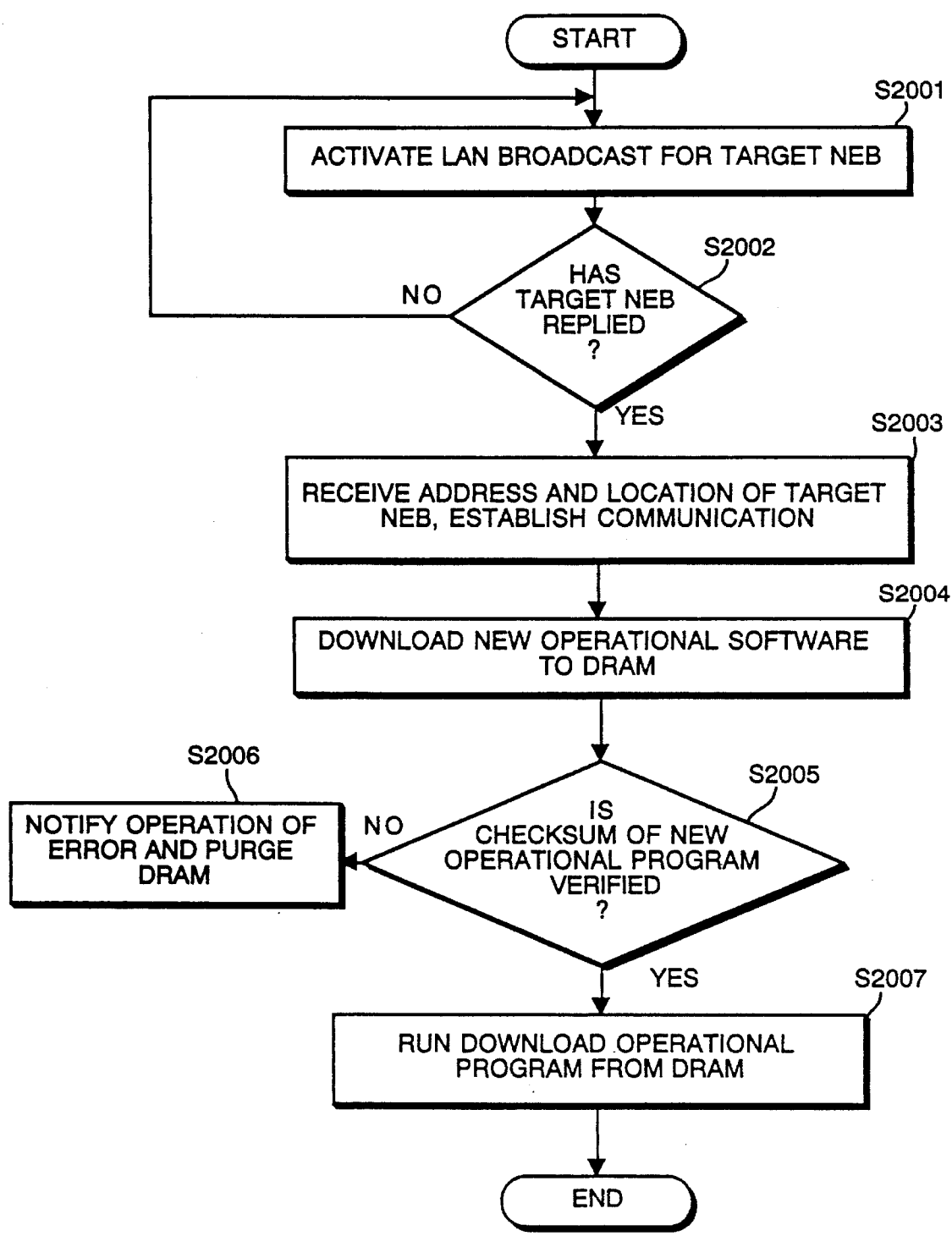
FIG. 20 is a flowchart showing the downloading of executable files to the Network Expansion Board from the local area network.

The downloading of executable files from the LAN to DRAM 220 will be discussed in more detail with respect to the flow diagram in FIG. 20, and with respect to the discussion above of Step S30 in FIG. 5C.

NEB 2 is configured initially prior to shipping. However, NEB 2 can be reconfigured subsequently by sending updated executable files across the LAN from the network administrator's PC 14 to the NEB 2. Furthermore, network administrator can remotely alter the executable files stored in DRAM 220 of NEB 2, as desired.

The process by which executable files can be altered in DRAM 220 will be discussed in detail with respect to FIG. 20.

After the board has been powered-up at Step S1, the flow proceeds to Step S2001 at which point the network administrator activates a DOWNLOADER program to broadcast over the LAN a request for identification of all NEB devices having a particular configuration whereupon flow advances to Step S2002.

In Step S2002, the DOWNLOAD program determines whether any target NEBs have responded. If in Step S2002 it is determined that no target NEBs have responded, flow returns to Step S2001 in which the DOWNLOAD program rebroadcasts the request with new target information and then flow advances to Step S2002.

If in Step S2002 a target NEB responds, flow advances to Step S2003.

In Step S2003, the SAPSERVER program responds with the unique network IDs and the unique socket numbers assigned to each NEB (see section 4g above). This location information is collected, the network administrator selects a particular NEB to download an executable file, and communication is established with the target NEB.

Upon selecting the target NEB, the network administrator downloads new operational files and a spetial packet containing a checksum value to DRAM 220 across the LAN in Step S2004 whereupon flow advances to Step S2005.

In Step S2005, microprocessor 216 performs a checksum operation on the newly loaded operational files and compares the checksum value with a checksum value sent in the special packet which is stored in DRAM 220 after the operational files have been stored.

If the checksum value does not equal the checksum value in the special packet, then flow advances to Step S2006 at which point microprocessor 216 notifies the network administrator that the checksum value for the new operational files is incorrect and at which point microprocessor 216 may purge the files from DRAM 220.

If in Step S2006 the checksum value is verified, then flow advances to Step S2007 at which point the executable files are acted on by microprocessor 216.

Thus, the network administrator can alter the operation of NEB 2 by remotely sending new operational files to be stored and to be executed from DRAM 220.

4o. Loading Independently Executable Modules in ROM

As described above in FIG. 5C with respect to Step S32, when a binary ROM image is to be loaded into EPROM 222, a plurality of independently-executable modules are assembled, ordered, and prepared for flash to EPROM 222. The assembly and ordering of the modules is presently carried out on a DOS PC, but may be carried out in the NEB itself. An advantage of assembling the independently executable modules in a PC is that the modules may be constructed and/or modified in a DOS environment.

NEB firmware comprises a number of separately linked modules, one of which contains permanently ROM-resident code which receives control at power-up and provides self-test, loading of other modules into DRAM 220, and basic I/O services. The other modules residing in the EPROM 222 must be copied to DRAM 220 before execution. There are two types of such modules, the first of which includes programs which are essentially drivers which receive control when loaded, initialize, and then exit, remaining resident. The second type of such modules are application programs, each of which executes a specific set of functions.

Figure 21:
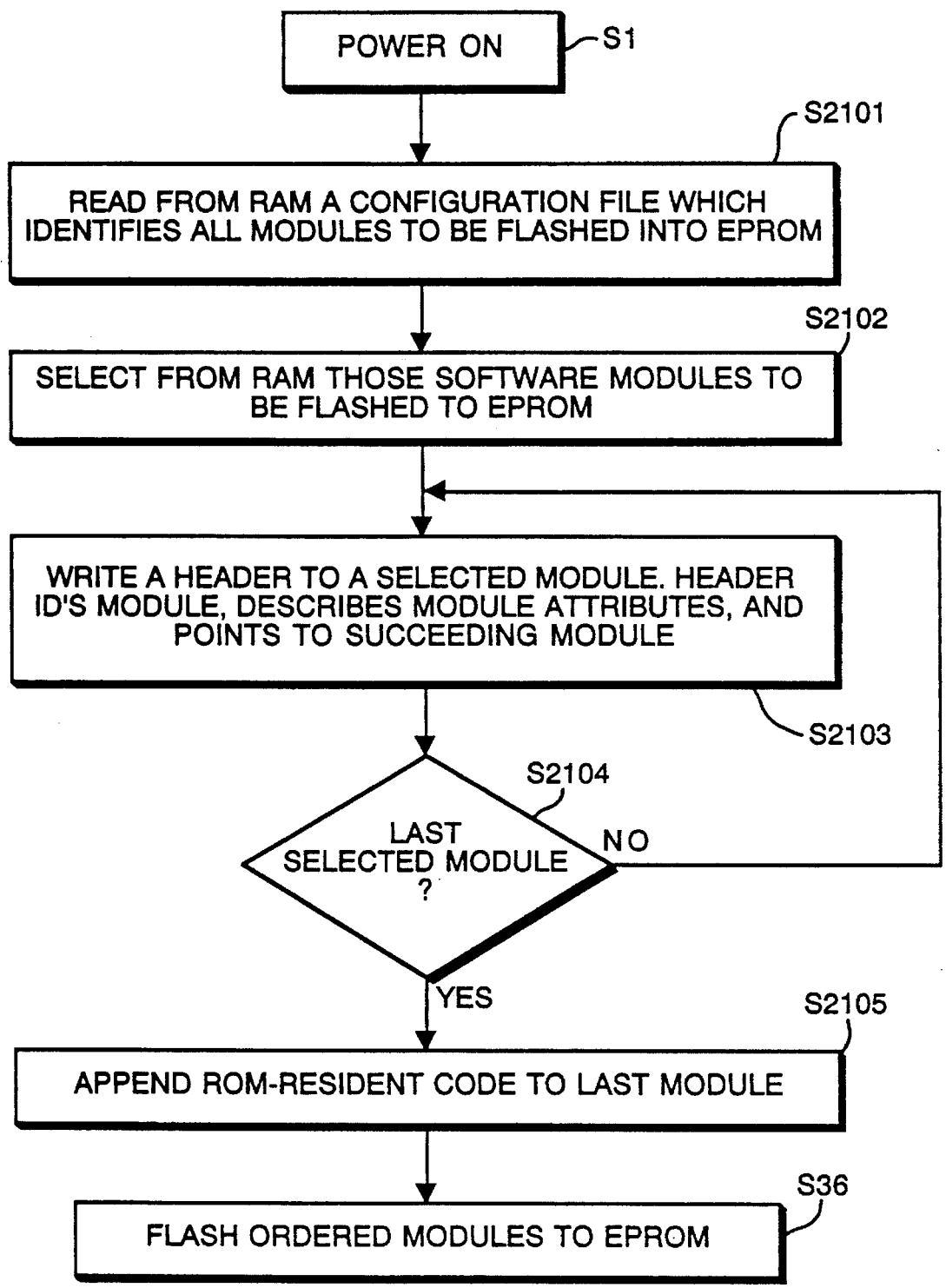
FIG. 21 is a flowchart showing the loading of independently-executable modules in the EPROM of the Network Expansion Board.

In FIG. 21, the NEB is powered-up at Step S1. At Step S2101, a utility resident in the PC reads from its RAM a configuration file containing the names of all modules to be placed in the ROM image. The configuration file is used to select from RAM, at Step S2102, those modules which are going to be flashed to EPROM 222.

At Step S2103, the utility writes a header for the first module, the header identifying that module, describing the module attributes, and including a pointer which points to the immediately succeeding module. This pointer aides in the ordering of the modules in a specific order prior to loading. At Step S2104, it is determined whether the last module identified by the configuration file has been selected. If the last module has not been selected, the process loops to Step S2103, where the header is written for the next module.

When the last module has been selected in Step S2104, the utility appends the ROM-resident code to the end of the image program (at Step S2105) so that upon power-up, the initialization code resides at the address expected by microprocessor 216.

When the ROM binary image is thus constructed, the image may be downloaded to one portion of the memory area of NEB DRAM 220, and then flashed to EPROM 222, as will be discussed in greater detail in section 4q below and with respect to the detailed discussion of FIG. 5C, Step S36.

4p. Protecting the EPROM During a Flash Operation

Figure 22:
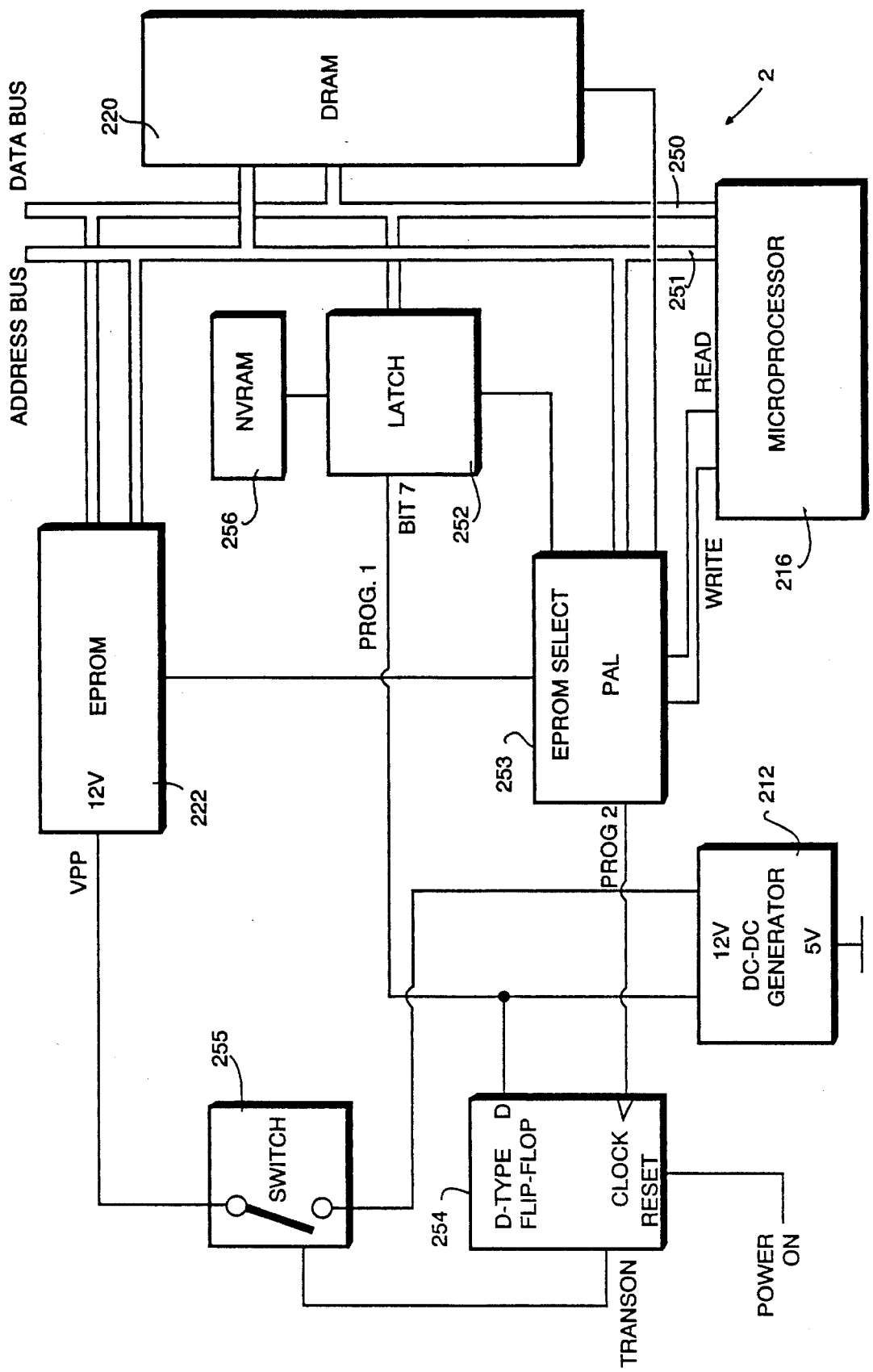
FIG. 22 is a block diagram showing Network Expansion Board EPROM flash protection circuitry.

FIG. 22 is a block diagram showing the functional construction of the EPROM flash protection circuitry resident on the NEB. The EPROM flash protection circuit includes microprocessor 216 coupled to data bus 250 and address bus 251. Also connected to data bus 250 and address bus 251 is DRAM 220. DRAM 220 is capable of storing a ROM firmware image downloaded from a remote LAN device into one portion of its memory area (see section 4o above), and application process steps into another portion of its memory area. Also coupled to data bus 250 and address bus 251 are EPROM 222, latch 252, and PAL 253. D-type flip-flop 254 is connected to latch 252 and PAL 253. During operation, flip-flop 254 receives as its clock input an output signal from PAL 253 and as its data input, an output signal from latch 252. Latch 252 and PAL 253 are also connected to DC—DC converter 212, and DC—DC converter 212 is connected to transistor switch 255. When activated by latch 252, DC—DC converter 212 sends +12 volts to the input emitter of transistor switch 255. Flip-flop 254 is also connected to transistor switch 255 to provide the necessary input to open/close switch 255.

The operation of the EPROM flash protect circuitry will now be explained in more detail with reference to FIG. 22. Upon power-up, output of latch 252 will be low and flip-flop 254 will be reset. In this manner, the output signal PROG1 from latch 252 will be low and voltage from DC—DC converter 212 will be directed to sink current to a ground state. At power-up, flip-flop 254 is reset so that its output is set low thereby opening transistor switch 255.

With transistor switch 255 in an open state, Vpp pin of EPROM 222 will be held at 0 volts preventing any data from being accepted or a flash operation from being performed. That is, for a flash operation to occur in EPROM 222, the Vpp pin must reach a level of at least +11.4 volts, which is a requirement set by the EPROM manufacturer's specifications. However, in order to achieve this voltage level, the following two programming steps are required.

First, when a new ROM firmware package is received in DRAM 220, microprocessor 216 receives a command to flash EPROM 222, by generating an I/O write to address 360 hex with data bit 7 high (80 hex). In this manner, DC—DC converter 212 can be first turned on.

As shown in Tables 16 and 17, address 360 hex corresponds to control register 230 which is used to control read/write operations to NVRAM 228. As shown in Table 17 below, when 360 hex is sent with bit 7 high/low, the address corresponds to an operation of DC—DC converter 212.

TABLE 16

| I/O SELECT | ADDRESS |
| --- | --- |
| LAN CHIP | 300 - 30F HEX (R/W) |
| DMA DATA LATCH | 310 - 317 HEX (R/W) |
| LAN CHIP SOFT RESET | 318 - 31F HEX (R) |
| SCSI CHIP REGISTER | 320 - 32B HEX (R/W) |
| STATUS REGISTER | 330 HEX (R) |
| CONTROL REGISTER #1 | 360 HEX (R/W) |

TABLE 17

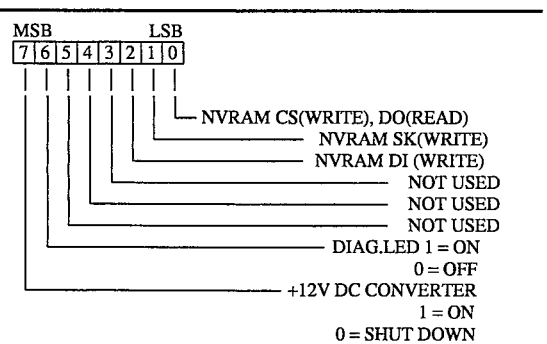

After address 360 hex is output, microprocessor 216 generates an I/O write command and sends a write select to PAL 253. PAL 253 detects a valid address, decodes it and activates latch 252. With bit 7 high in address 360 hex, the PROG1 signal is set high and output from latch 252 to DC—DC converter 212. When the PROG1 signal is received at DC—DC converter 212, it operates DC—DC converter to produce +12 volts. The +12 volts from DC—DC converter 212 is sent to transistor switch 255, and which remains at its emitter until transistor switch 255 is closed.

However, before +12 volts is allowed to pass through transistor switch 255, the second step must be executed. That is, microprocessor 216 outputs an I/O read command and outputs address 366 hex which corresponds to a PAL address. When microprocessor 216 generates both the command and address, PAL 253 decodes the address and generates a PROG2 signal. When the PROG2 signal is high, it will provide a clock input to flip-flop 254.

Upon receiving the clock input, flip-flop 254 will input the PROG1 signal from latch 252 and then generate a TRANSON signal at its output. The TRANSON signal is output to transistor switch 255 which operates to close the switch that allows +12 volts at its emitter to pass through to its collector. At this point, +12 volts is sent from the collector of transistor switch 255 to the Vpp pin of EPROM 222.

With +12 volts placed at the Vpp pin of EPROM 222, microprocessor 216 sends out an EPROM select signal. In order to prevent the new firmware image from being corrupted, EPROM 222 must first be cleared and erased. Then the EPROM 222 is flashed with the new ROM firmware image stored in DRAM 220. Once the new ROM firmware image is stored in EPROM 222, NEB 2 can be re-booted from the new ROM firmware image.

Figure 23:
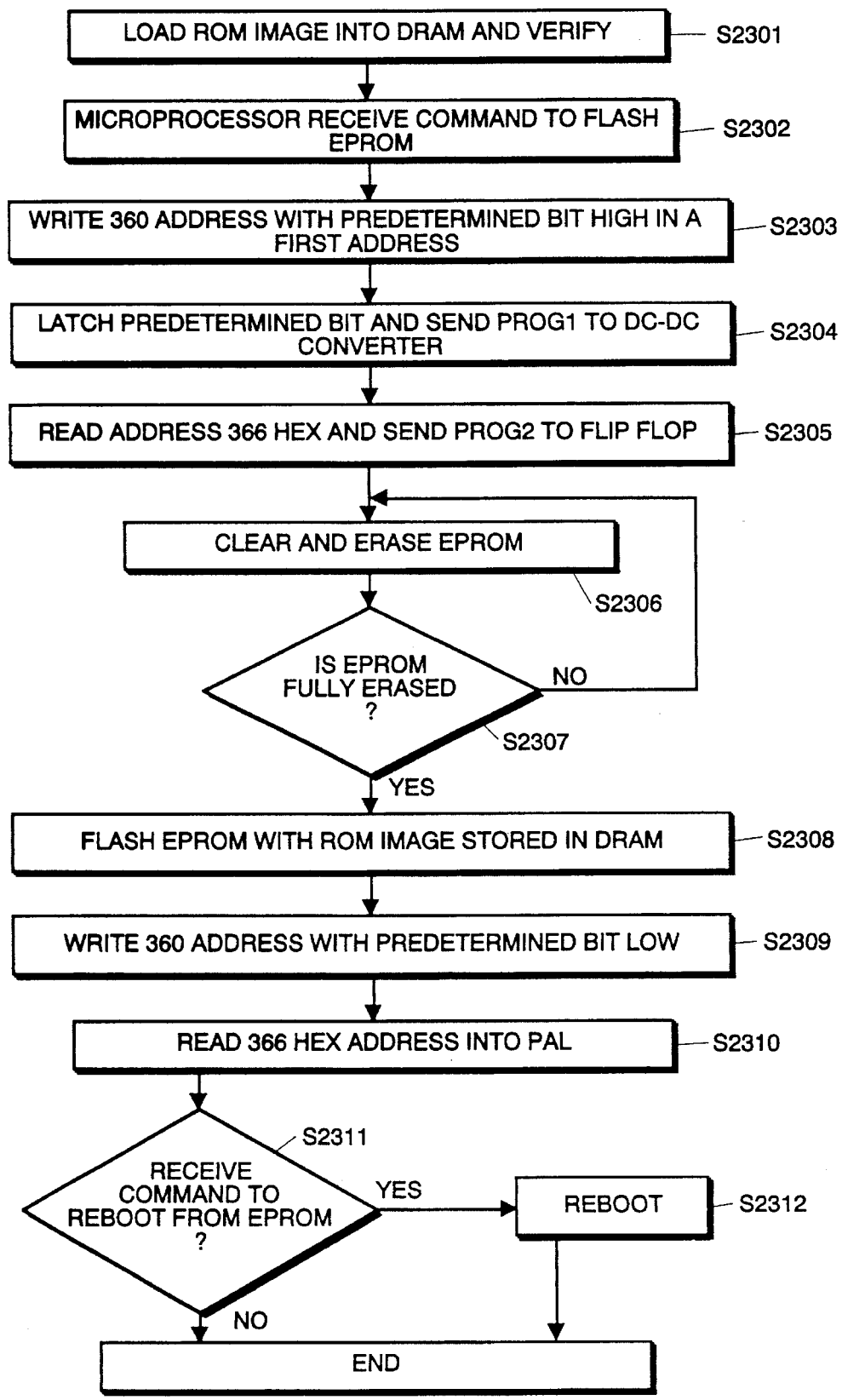
FIG. 23 is a flowchart showing the operation of the circuitry of FIG. 22.

The operation of the EPROM protection circuit will now be explained with reference to FIG. 22 and the flowchart of FIG. 23.

In Step S2301, a new ROM firmware image is received by NEB 2 across the LAN and loaded into DRAM 220. Microprocessor 216 receives a command to flash EPROM 222 in Step S2302. In Step S2303, microprocessor 216 sends out an I/O write command to PAL 253 and outputs address 360 hex with bit 7 high. Flow advances to Step S2304 in which bit 7 high activates latch 252 to output the PROG1 signal. The PROG1 signal turns on DC—DC converter 212 and +12 volts is output to transitor switch 255. In Step S2305, microprocessor 216 sends both an I/O read command to PAL 253 and address 366 which is a PAL address. In response, PAL 253 outputs the PROG2 signal to clock flip-flop 254 which allows the PROG1 signal to be input at its data input. Flip-flop 254 outputs the TRANSON signal to transistor switch 255 which allows +12 volts to pass from the collector of transistor switch 255 to the Vpp pin of EPROM 222. In Step S2306, microprocessor 216 clears and then erases EPROM 222. In Step S2307, microprocessor 216 determines if EPROM 222 has been completely erased. If EPROM 222 is not completely erased, flow returns to Step S2307.

After microprocessor 216 determines that EPROM 222 has been completely erased, in Step S2308, the ROM firmware image is downloaded from DRAM 220 to EPROM 222. Once the ROM firmware image is successfully loaded, in Step S2309 microprocessor 216 writes address 360 hex with bit 7 low. The PROG1 signal from latch 252 goes low and DC—DC converter 212 allows the voltage level to sink current to a ground state.

In Step S2310, microprocessor 216 sends PAL 253 an I/O read command and a 366 hex address which permits the PROG2 signal to go low thereby clocking the flip-flop which outputs a low TRANSON signal which operates to open transistor switch 255.

Thus, in Steps S2309 and S2310, +12 volts is removed from Vpp pin of EPROM 222 and the flash operation is ended. After the flash operation, microprocessor 216 determines if a re-boot command has been received in Step S2311. If the re-boot command has been received, NEB 2 is re-booted in Step S2312 from the new ROM firmware image in EPROM 222. However, if no re-boot command is received, then flow ends.

4q. Remotely Altering Firmware

Figure 24:
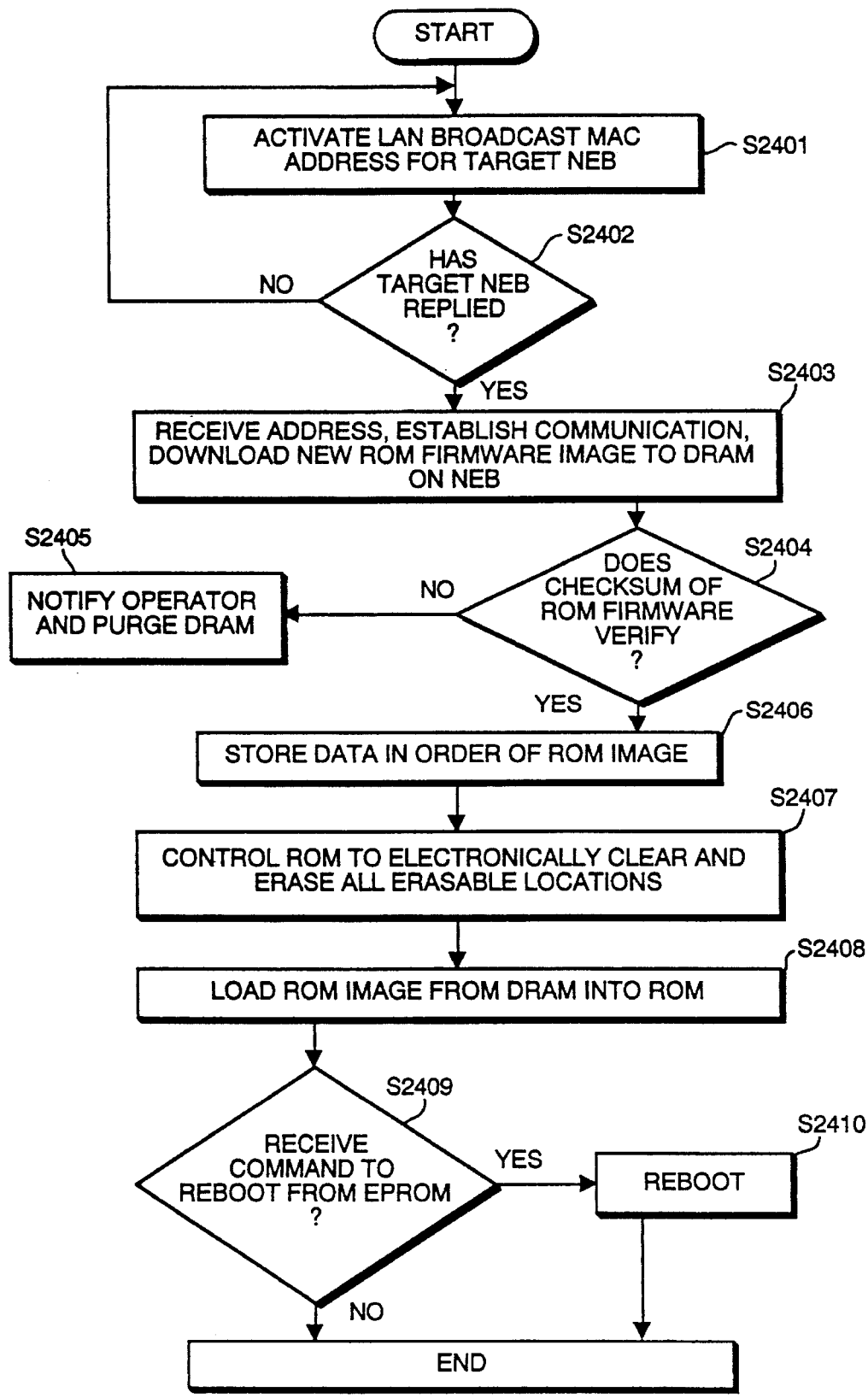
FIG. 24 is a flowchart showing the operation of remotely loading firmware in the Network Expansion Board EPROM.

The method for remotely altering firmware in EPROM 222 will be discussed in more detail below and with reference to the flowchart illustrated in FIG. 24, Step S36 of FIG. 5C, and section 4i above.

Prior to shipping a NEB to a customer, the NEB is configured with the minimum number of executable files which permit the NEB to perform necessary functions. However, the NEB can be reconfigured subsequently by the customer. That is, a network administrator may download data from a remote LAN device, which data may contain anything from a patch code, to manufacturing test routines, to entire firmware updates to be downloaded to the EPROM.

In more detail, NEB2 can be reconfigured by sending executable files across the LAN from the network administrator's PC 14 to NEB 2. The network administrator can remotely alter the ROM firmware image in EPROM 222, as desired.

In Step S2401, the network administrator activates a CPFLASH program that uses a MAC address as a command line parameter to target a specific NEB. CPFLASH issues a SAP broadcast request which is responded to by SAPSERVER running on the NEB. In Step S2402, CPFLASH waits for a response from the targeted NEB. If in the case where the targeted NEB does not respond in approximately 15 seconds, the flow returns to Step S2401 and the broadcast is resent. However, in the case where the targeted server responds, flow advances to Step S2403.

In Step S2403, the address and location of the targeted NEB is received, communication with the NEB having the matching MAC address is established, and a new ROM image firmware is downloaded over the LAN to DRAM 220.

In Step S2404, the validity of the ROM firmware image is checked before proceeding to the next step. The validity of the ROM firmware image is verified against an image checksum which is sent in a special packet along with the download operation in Step S2403. If the checksum value does not match the checksum downloaded with the ROM image, then in Step S2405 the operator is notified of an error and the ROM firmware image in DRAM 220 is purged.

If the checksum value is valid, then flow advances to Step S2406 at which point microprocessor 216 retrieves any data which is to be preserved, such as the MAC address, and stores the data within the proper locations in the new firmware image stored in DRAM 220. In this fashion, if the new ROM firmware image is defective, the NEB may still function since predetermined portions of essential ROM firmware are maintained. Once the essential portions of ROM firmware are preserved, flow advances to Step S2407 at which point EPROM 222 is controlled to be cleared and erased a plurality of times, if requried. After EPROM 222 has been erased, in Step S2408 the new ROM image is loaded into EPROM 222.

After the flash operation, microprocessor 216 determines if a re-boot command has been received in Step S2409. If the re-boot command has been received, NEB2 is re-booted in Step S2410. However, if no re-boot command is received, then flow ends.

In Step S2404, the validity of the ROM firmware image may also be verified by comparing newly received firmware data with data previously stored in EPROM 222. For example, where EPROM 222 stores hardware indicators previously carried by PROM 232 (e.g., board manufacture date, board revision number, manufacturing facility, etc.; to be discussed in greater detail in section 5 below), such indicators may be compared with the same indicators in the newly-received ROM firmware image. This comparison may be made in addition to or in lieu of the checksum comparison discussed above.

It is noted that a new MAC address may also be flashed into EPROM 222 at the same time a ROM firmware image is flashed. However, it is preferable only to flash a MAC address prior to shipping, at the completion of NEB test. This feature is discussed in more detail with respect to Section 5 below.

5. TEST

Figure 25:
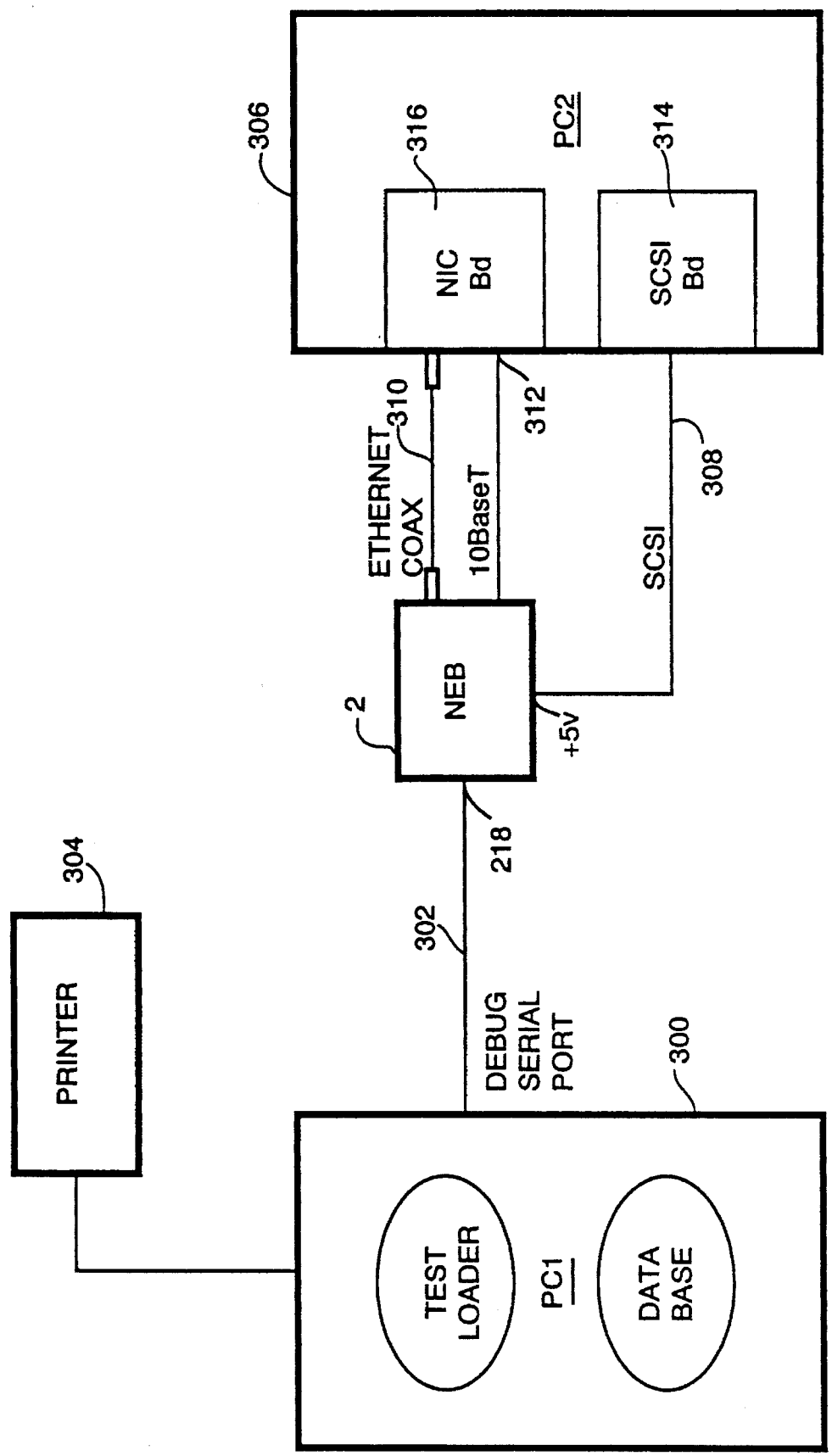
FIG. 25 is a block diagram showing a hardware configuration for testing the Network Expansion Board.

Prior to installing the NEB in the printer, it may be tested to ensure the integrity of its hardware and software components. FIG. 25 depicts one test configuration which may be utilized to test the NEB 2. In FIG. 25, the NEB 2 is coupled to PC1 300 via a cable 302 coupled to the NEB serial port 218. A printer 304 may be coupled to PC1 300 in order to print out test results.

The NEB 2 is coupled to a test driver PC2 306 through an SCSI bus 308 and Ethernet LAN connections 310, 312. The PC2 306 includes an SCSI board 314 and a network controller board 316 so that it may simulate a printer and LAN entities (such as the network administrator's PC 14). The PC2 will act as a transponder, receiving and returning communications to and from the NEB 2, as commanded by the test programs input to the NEB from PC1 300 through the serial port 218.

After power is applied to NEB 2, it performs the power-on-self-test operation. While the NEB 2 is performing each test operation in the POST, PC1 300 receives test checkpoint results across serial cable 302.

Once it is determined that NEB 2 has satisfactorily completed POST, NEB 2 enters a "Ready For Download" state. In this state, NEB 2 waits for a period interval of approximately one second for further input instructions across any one of the input ports.

While the NEB is in the download state, PC1 300 uploads test programs to the NEB through serial port 218. As NEB 2 completes execution of each test program, it sends each test result back to PC1 300 for verification. If the next checkpoint is not received within a timeout period (e.g., 1 second), it is determined that an error has occurred during the NEB test program, and an error signal is output by PC1 300. The error signal may he indicated on a display at PC1 300, or printed out on printer 304.

On the other hand, if the next checkpoint received by PC1 300 is not verified, then PC1 300 rescripts the test program (by adding further, more detailed test modules) in accordance with the received result. In this manner, PC1 300 can locate the problem and debug NEB 2.

Some test programs may require NEB 2 to communicate with PC2 306 over either the SCSI bus 308 or one of the LAN connections 310, 312. For instance, in accordance with the test program, NEB 2 may request data from PC2 over the LAN connection 310. PC2 306 is configured to return appropriate responses to each communication from NEB 2, thereby effectively emulating the printer and the other LAN members. If the correct communication is returned from PC2 306, NEB 2 indicates a successful test by passing another checkpoint to PC1 300 through the serial port 218.

Figure 26A:
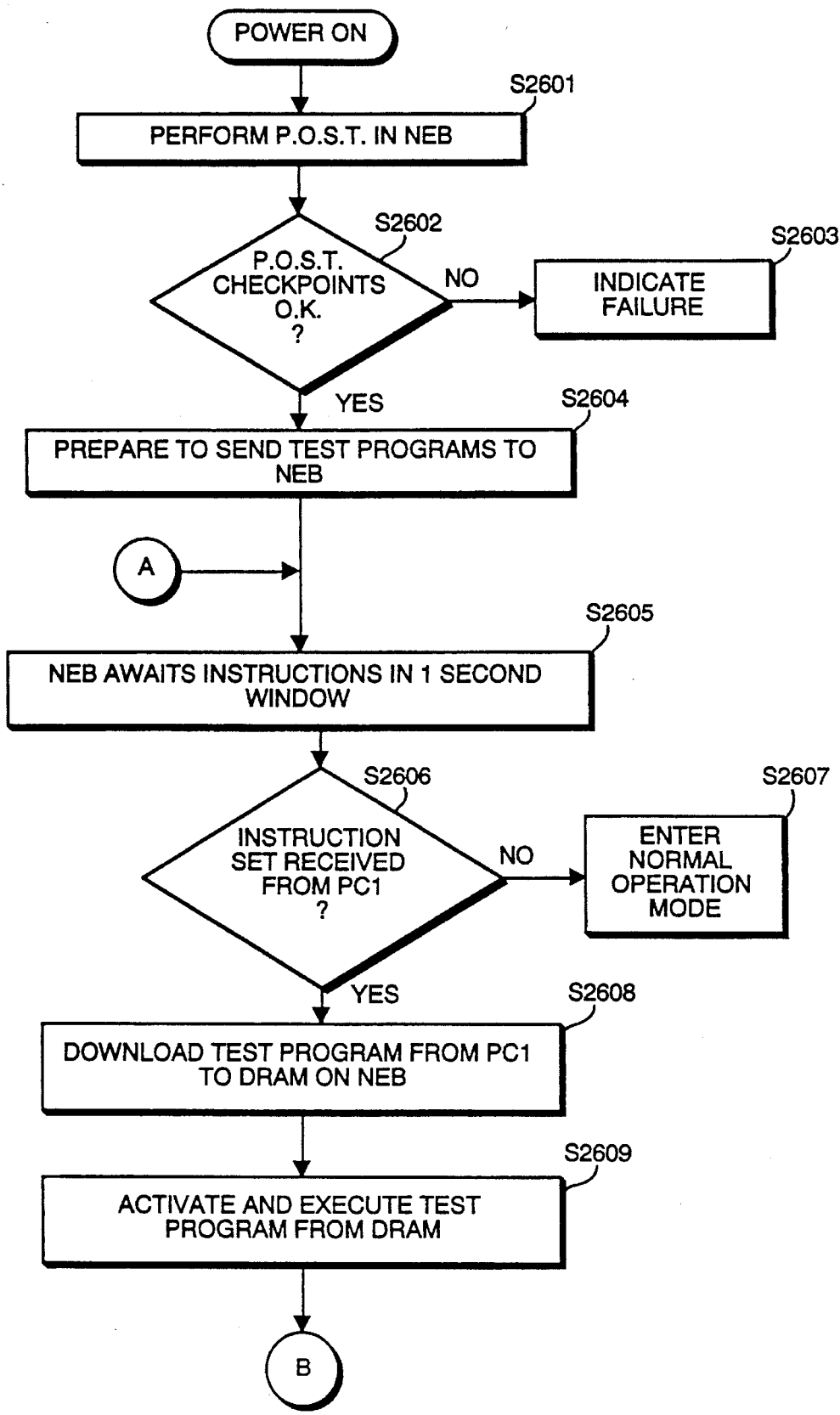
FIGS. 26A and 26B comprise a flowchart showing a method of testing the Network Expansion Board using the test configuration of FIG. 25.

A more detailed discussion of the method for testing NEB 2 will he provided below with reference to the flowchart illustrated in FIGS. 26A and 26B, and in accordance with the test configuration depicted in FIG. 25.

When power is first applied to the NEB 2, NEB 2 executes the POST program from EPROM 222, in Step S2601. The POST program includes individual programs for testing component operation and software programming. After execution of an individual programs within POST, in Step S2602 a checkpoint is sent to PC1 300 to be verified. If a checkpoint is not sent after a predetermined period following the execution of an individual program or a returned checkpoint is incorrect, an error signal is sent out from PC1 300 in Step S2603. However, if all checkpoints are correct and received within a timely fashion, the process advances to Step S2604 where PC1 300 prepares to send test programs to the NEB.

At Step S2605, the POST program is complete and NEB 2 waits for instructions from across any one of the ports, preferably the serial port. The waiting period can be approximately a one second window in which time PC1 300 should respond with the prepared text programs. In Step S2606, if PC1 300 does not respond by sending a test program to NEB 2 within the time window, flow advances to Step S2607 where the NEB enteres its normal operational mode.

When the test program instruction set from PC1 300 is received in Step S2606, the instruction set, which includes further test programs, is stored (in Step S2608) on NEB 2 in DRAM 220. In Step S2609, PC1 300 activates the instruction set and NEB 2 executes each test program within the instruction set.

The test program instruction set may contain, in random order, test programs which require NEB 2 to configure PC2 306 as a LAN peripheral device, or which require NEB 2 to configure PC2 306 as an SCSI peripheral device. In either case, after being configured, PC2 306 will respond to each communication from NEB 2, usually by merely returning data blocks sent by the NEB.

Briefly, in Step S2610 (FIG. 26B) NEB 2 configures PC2 306 as a LAN peripheral and PC2 306 responds by sending a response to NEB 2 which effectively performs a LAN loopback test by returning the data which it has received. NEB 2 will communicate with PC2 and receive simulated print job results. In Step S2611, the result of each block job is sent to PC1 300. PC1 300 determines if the test result is correct. In Step S2611, if it is determined by PC1 300 that the test result is incorrect, PC1 300 sends a re-scripted, branch test program (Step S2612) in accordance with the test result received in Step S2611. However, if no further branch test program exists, then in Step S2612 PC1 300 will stop LAN testing and output an error signal.

Thus, in Step S2611, NEB 2 is tested for LAN communications. Assuming NEB 2 successfully passes each LAN communication test, flow advances to Step S2613 at which point PC2 306 is configured as an SCSI peripheral device and performs SCSI loopback tests by returning the data which it has received. In Step S2614 the results of the tests are sent to PC1 300 and if the results are incorrect, PC1 300 similarly sends a branch test in Step S2615 in accordance with the test result. Of course, if no further branch test exists to further test the peripheral communication, then PC1 300 stops the test, and outputs an error signal.

Assuming that NEB 2 successfully passes each SCSI communication test in Step S2614, then flow advances to Step S2616 at which point NEB 2 requests further instructions from PC1 300. If PC1 300 returns with further instructions, flow returns to Step S2605, but if further testing is not necessary then NEB testing is ended.

In summary, a method for testing an interactive network board having a LAN interface and a test interface comprises the steps of applying power to the board and reading a POST result which was executed out of board ROM via the test interface, and downloading a test program into the board RAM via the test interface. The test program is then activated for execution out of board RAM. The board may then be commanded to configure a peripheral device (through either the LAN or the SCSI interface) to be a LAN driver or an SCSI peripheral. The board then interacts with the LAN driver or SCSI peripheral in accordance with the test program. Results of the test program are then output via the test interface to a test computer which receives these test results. If certain tests fail, additional test programs may be scripted in accordance with the type of failure. The newly scripted test programs will be able to perform fault detection and diagnosis, and these additionally scripted test programs may then be downloaded to the board RAM from the PC1.

Once all of the tests are successfully concluded, it may be convenient (in the factory test environment) to flash the operational firmware into EPROM 222. Specifically, the last step of a testing program may be utilized to load the requisite firmware image into the NEB EPROM 222 prior to delivery (see section 4q above). The firmware flashed to EPROM 222 may also include a unique MAC address for NEB 2.

In the past, MAC addresses were incorporated into circuit boards using a dedicated PROM chip such as PROM 232. However, it has been found that if the MAC address is flashed into EPROM, the PROM chip is not required, while the MAC address can still be stored in a non-volatile way. (Of course, as discussed in paragraph 4q, the MAC address could also be remotely flashed into the EPROM at the same time the RAM firmware image is updated, after NEB 2 is coupled to the LAN.)

Figure 26B:
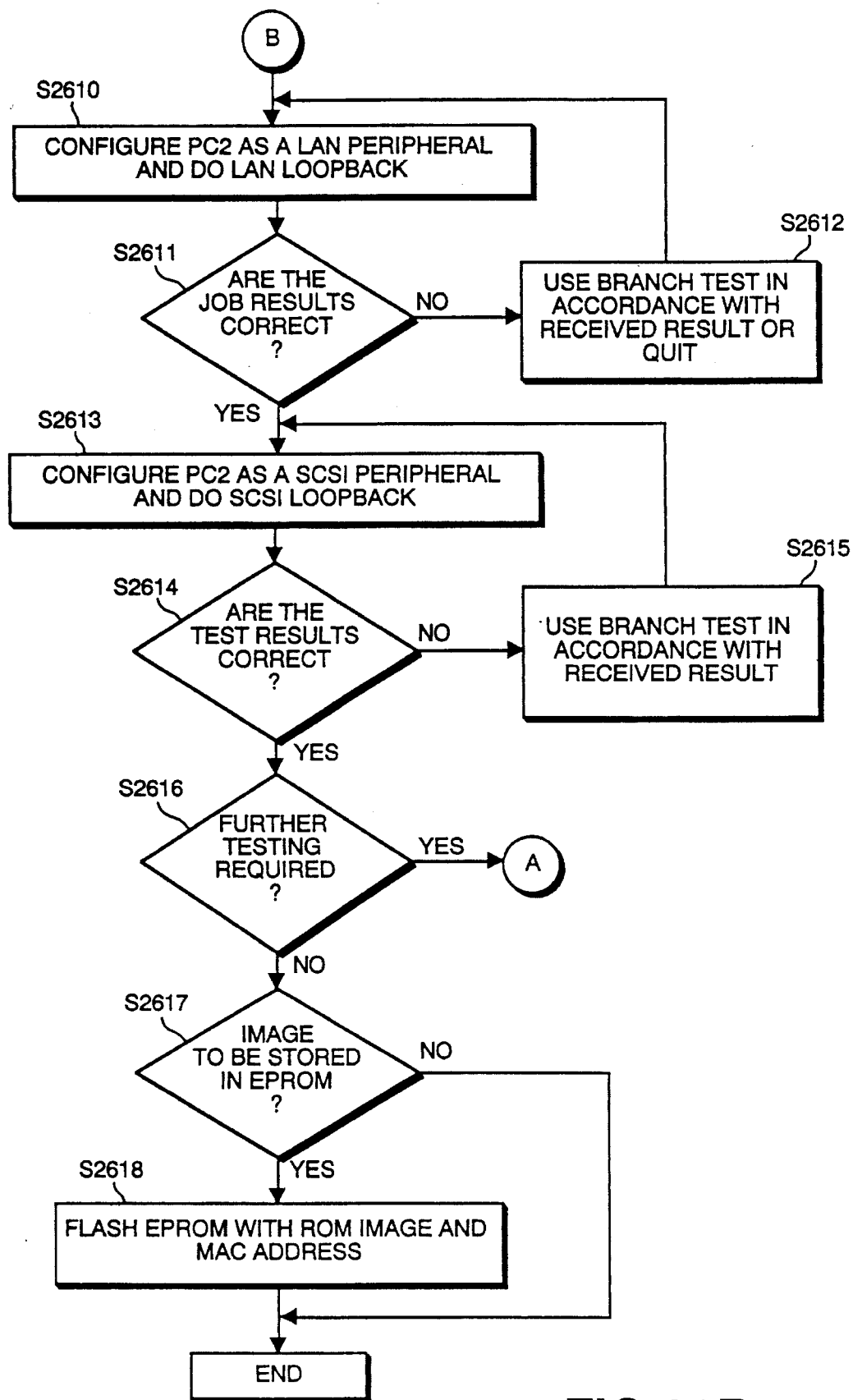

In Step S2617 of FIG. 26B, NEB testing has been completed and each board may be designated with its own individual identifier number, commonly referred to as a MAC address. Thus, in Step S2617 it is determined whetehr a ROM firmware image is to be stored in EPROM 222. If no image is to be stored, testing ends. However, if an image is to be stored, flow advances to Step S2618 where the ROM image (with MAC address) is flashed to EPROM 222. At Step S2618 it may also be desirable to download other data normally stored in PROM 232, such as board revision number, data of manufacture, tester name, etc., together with the MAC address.

Two possible scenarios have been considered for flashing the ROM firmware and MAC address to EPROM 222. In the first case the NEB 2 has been pre-loaded with a sophisticated set of diagnostics for use in manufacturing tests. This approach limits the amount of time needed to download the specific tests since they will be already present in the firmware. In this case, after the tests are successful the final production version of the firmware is loaded into the board and flashed along with the MAC address and other hardware related information such as board revision, manufacturing data, and tester (Step S2618). In the second case the board will be built with the final production version of the firmware. In this case the board specific information area will be left blank and only this area loaded and flashed after a successful test execution in Step S2618.

In summary, a method for post-test loading of programmable firmware into an interactive network board having a LAN interface comprises the step of downloading a ROM firmware image (including the MAC address) to DRAM 220 via the LAN interface. The integrity of the ROM image is then confirmed, and the board is commanded to electronically erase the EPROM. The EPROM is then flashed with the ROM image which includes the MAC address, and the board is then re-booted from EPROM.

Thus, what has been described in detail above is an interactive network circuit board including structure and function for coupling a peripheral to a LAN so that the peripheral is a responsive interactive member of the LAN.

While the present invention has been described with respect to what is considered to be the preferred embodiments, it is to be understood that the present invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for preventing inadvertent re-programming of an EPROM, comprising the steps of:

loading a ROM firmware image into a RAM on an interactive network board;

verifying the integrity of the ROM firmware image in the RAM;

receiving a command to load the EPROM;

closing a switch in response to the command to load the EPROM so as to permit transfer of a load enable signal to a load enable input on the EPROM, the load enable signal permitting the ROM firmware image to be loaded into the EPROM;

erasing the EPROM; and loading the ROM firmware image into the EPROM;

wherein the step of closing the switch is a two-step process which includes steps of (1) writing a predetermined bit pattern to a first address in order to generate a first signal for closing the switch, and (2) reading from a second address in order to generate a second signal for clocking the first signal to the switch so as to close the switch; and wherein, whenever the switch is open, the load enable input on the EPROM is substantially grounded.

2. An apparatus for preventing inadvertent programming of an EPROM, comprising:

an address bus;

a data bus;

an EPROM connected to said address bus and to said data bus, said EPROM including a load enable input;

a switch for switchably providing a load enable signal to the load enable input of said EPROM, the load enable signal for permitting a ROM firmware image to be loaded into said EPROM, the load enable input of the EPROM being substantially grounded whenever said switch is open;

a flip flop for controlling switching actuation of said switch;

a latch responsive to a first predetermined address on the address bus for latching at least one bit from the data bus, said latch pre-loading the flip flop with the latched bit;

means responsive to said latch latching the at least one bit for providing the load enable signal to said switch;

a decoder responsive to a second predetermined address on said address bus for clocking said flip flop; and a processor for outputting a first predetermined bit pattern to the first predetermined address and for accessing the second predetermined address so as to close said switch to permit the load enable signal to be provided to the load enable input of said EPROM, for erasing said EPROM, and for loading the ROM firmware image into said EPROM.

3. An apparatus according to claim 2, wherein said latch is responsive to a write to the first predetermined address.

4. An apparatus according to claim 2, wherein said decoder is responsive to a read from the second predetermined address.

5. An apparatus according to claim 2, wherein said processor, after loading the ROM firmware image into said EPROM, outputs a second predetermined bit pattern, which is different from the first predetermined bit pattern, to the first predetermined address and which again accesses the second predetermined address.

6. An apparatus according to claim 2, wherein the flip flop powers up such that said switch is prevented from providing the load enable signal to the load enable input of said EPROM.

7. An apparatus according to claim 2, wherein, upon power-up, said latch is set such that the flip flop is not pre-loaded.

8. An apparatus according to claim 2, wherein said means responsive is comprised of a DC to DC converter and further includes means for discharge of the load enable signal.

9. An apparatus according to claim 2, further comprising an NVRAM for non-volatively storing data, wherein the latch latches read and write data for the NVRAM.

10. An apparatus according to claim 9, wherein said latch latches a read/write control bit, a clock bit, and a data bit for the NVRAM.

11. An apparatus according to claim 10, wherein said latch utilizes a further bit to activate the means responsive.

12. An apparatus according to claim 2, wherein said EPROM is comprised by a flash EPROM.

13. An apparatus according to claim 2, wherein said apparatus is disposed on an interactive network board.

14. An apparatus according to claim 2, wherein the apparatus is disposed on an interactive network board coupled to a printer.

15. An interactive network board having an EPROM load protection circuit, comprising:

a bi-directional interface disposed on the board;

a LAN interface disposed on the board;

a test interface disposed on the board;

a RAM, disposed on the board, for storing a ROM firmware image received over the LAN interface;

an EPROM, disposed on the board and responsive to an erase command and a load command, for storing the ROM firmware image, said EPROM having a load enable input for receiving a load enable signal, the load enable signal for permitting programming of said EPROM;

a switch for switchably providing the load enable signal to the load enable input of said EPROM; and a processor, disposed on the board, for processing executable files from the ROM firmware image stored in the EPROM, and wherein said processor is responsive to a LAN command from a remote LAN device to store a new ROM firmware image in said RAM, to load the new ROM firmware image from said RAM into said EPROM, and to reboot the interactive network board from the new ROM firmware image in said EPROM, said processor causing said switch to close by (1) issuing a write command to a first address in order to generate a first signal for closing said switch, and (2) issuing a read command to a second address in order to generate a second signal for clocking the first signal to the switch in order to close the switch and to permit a load enable signal to be provided to the load enable input of said EPROM, the load enable signal for permitting programming of the EPROM by loading the ROM firmware image from said RAM into said EPROM;

wherein the load enable input of said EPROM is substantially grounded so as to prevent inadvertent programming of said EPROM whenever the load enable signal is prevented from being provided to the load enable input of said EPROM.

16. An interactive network board according to claim 15, wherein the interactive network board is coupled to a printer.

17. An interactive network board according to claim 15, wherein the RAM is a dynamic RAM.

18. An interactive network board according to claim 15, wherein said EPROM comprises a flash EPROM.

19. An interactive network board having a LAN interface, a bi-directional interface, and a test interface for loading a ROM firmware image into an EPROM disposed on the board, comprising:

an address bus;

a data bus;

an EPROM connected to said address bus and to said data bus, said EPROM including a load enable input;

a switch for switchably providing a load enable signal to the load enable input of said EPROM, the load enable signal for permitting loading of a ROM firmware image into said EPROM;

a flip flop for controlling switching actuation of said switch;

a latch responsive to a first predetermined address on the address bus for latching at least one bit from the data bus, said latch pre-loading the flip flop with the latched at least one bit;

means responsive to said latch latching the at least one bit for providing the load enable signal to said switch;

a decoder responsive to a second predetermined address on said address bus for clocking said flip flop; and a processor for outputting the predetermined bit pattern to the first address and for accessing the second predetermined address so as to close said switch to permit the load enable signal to be provided to the load enable input of said EPROM, for erasing said EPROM, and for loading the ROM firmware image into said EPROM, wherein said processor is responsive to a LAN downloaded command to load the ROM firmware image into a RAM and is responsive to a LAN downloaded command to load said EPROM with the ROM firmware image stored in the RAM; and wherein the load enable input is substantially grounded whenever said switch is open so as to prevent loading of a ROM firmware image into said EPROM.

20. An apparatus according to claim 19, wherein said EPROM comprises a flash EPROM.

21. An interactive network board according to claim 19, wherein the interactive network board is coupled to a printer.

22. An apparatus for preventing inadvertent programming of an EPROM, said apparatus comprising:

an address bus;

a data bus;

an EPROM connected to said address bus and to said data bus, said EPROM including a load enable input;

a switch for switchably providing a load enable signal to the load enable input of said EPROM, the load enable signal for permitting a ROM firmware image to be loaded into said EPROM;

a flip flop for controlling switching actuation of said switch with an output thereof, said flip flop having an output terminal, a data terminal and a trigger terminal for clocking a signal at the data terminal to the output terminal;

a latch responsive to a first predetermined address on the address bus for latching at least one bit from the data bus so as to generate a first signal, the first signal being provided to the data terminal of said flip flop;

a power generator for generating the load enable signal and for providing the load enable signal to said switch, the load enable signal being generated in response to the first signal from said latch;

a decoder responsive to a second predetermined address on said address bus for generating a second signal, the second signal being provided to the trigger terminal of said flip flop so as to clock a signal at the data terminal to the output terminal; and a processor for outputting a first predetermined bit pattern to the data bus to the first predetermined address so as to cause said latch to provide the first signal to the data terminal of said flip flop and to said power generator, and for accessing the second predetermined address so as to activate said decoder to generate the second signal and to provide the second signal to the trigger terminal of said flip flop;

wherein, when the second signal is applied to the trigger terminal of said flip flop, said flip flop transmits the first signal through to the output terminal, the transferred first signal controlling actuation of said switch so as to permit the load enable signal to be provided from said power generator to the load enable input of said EPROM.

23. An apparatus according to claim 20, wherein the apparatus is disposed on an interactive network board coupled to a printer.

24. A printer connected to a local area network (LAN), comprising:

a print engine which forms printed images from print data received from the LAN; and an interactive network board, interfaced to said print engine and to the LAN, for receiving the print data from the LAN and for providing the print data to said print engine, said interactive network board comprising:

an address bus;

a data bus;

an EPROM connected to said address bus and to said data bus, said EPROM including a load enable input;

a switch for switchably providing a load enable signal to the load enable input of said EPROM, the load enable signal for permitting a ROM firmware image to be loaded into said EPROM, the load enable input of the EPROM being substantially grounded whenever said switch is open;

a flip flop for controlling switching actuation of said switch;

a latch responsive to a first predetermined address on the address bus for latching at least one bit from the data bus, said latch pre-loading the flip flop with the latched bit;

means responsive to said latch latching the at least one bit for providing the load enable signal to said switch;

a decoder responsive to a second predetermined address on said address bus for clocking said flip flop; and a processor (1) for outputting a first predetermined bit pattern to the first predetermined address and for accessing the second predetermined address so as to close said switch to permit the load enable signal to be provided to the load enable input of said EPROM, for erasing said EPROM, and for loading the ROM firmware image into said EPROM, and (2) for executing a print server program to transmit the print data received from the LAN to said print engine.

25. A printer connected to a local area network (LAN), comprising:

a print engine which forms printed images from print data received from the LAN; and an interactive network board, interfaced to said print engine and to the LAN, for receiving the print data from the LAN and for providing the print data to said print engine, said interactive network board comprising:

a bi-directional interface disposed on the board;

a LAN interface disposed on the board;

a test interface disposed on the board;

a RAM, disposed on the board, for storing a ROM firmware image received over the LAN interface;

an EPROM, disposed on the board and responsive to an erase command and a load command, for storing the ROM firmware image, said EPROM having a load enable input for receiving a load enable signal, the load enable signal for permitting programming of said EPROM;

a switch for switchably providing the load enable signal to the load enable input of said EPROM; and a processor, disposed on the board, for processing executable files from the ROM firmware image stored in the EPROM and for executing a print server program to transmit the print data to said print engine, and wherein said processor is responsive to a LAN command from a remote LAN device to store a new ROM firmware image in said RAM, to load the new ROM firmware image from said RAM into said EPROM, and to reboot the interactive network board from the new ROM firmware image in said EPROM, said processor causing said switch to close by (1) issuing a write command to a first address in order to generate a first signal for closing said switch, and (2) issuing a read command to a second address in order to generate a second signal for clocking the first signal to the switch in order to close the switch and to permit a load enable signal to be provided to the load enable input of said EPROM, the load enable signal for permitting programming of the EPROM by loading the ROM firmware image from said RAM into said EPROM;

wherein the load enable input of said EPROM is substantially grounded so as to prevent inadvertent programming of said EPROM whenever the load enable signal is prevented from being provided to the load enable input of said EPROM.

26. A printer connected to a local area network (LAN), comprising:

a print engine which forms printed images from print data received from the LAN; and an interactive network board, interfaced to said print engine and to the LAN, for receiving the print data from the LAN and for providing the print data to said print engine, said interactive network board comprising:

an address bus;

a data bus;

an EPROM connected to said address bus and to said data bus, said EPROM including a load enable input;

a switch for switchably providing a load enable signal to the load enable input of said EPROM, the load enable signal for permitting loading of a ROM firmware image into said EPROM;

a flip flop for controlling switching actuation of said switch;

a latch responsive to a first predetermined address on the address bus for latching at least one bit from the data bus, said latch pre-loading the flip flop with the latched at least one bit;

means responsive to said latch latching the at least one bit for providing the load enable signal to said switch;

a decoder responsive to a second predetermined address on said address bus for clocking said flip flop; and a processor (1) for executing a print server program to transmit the print data received from the LAN to said print engine, and (2) for outputting the predetermined bit pattern to the first address and for accessing the second predetermined address so as to close said switch to permit the load enable signal to be provided to the load enable input of said EPROM, for erasing said EPROM, and for loading the ROM firmware image into said EPROM, wherein said processor is responsive to a LAN downloaded command to load the ROM firmware image into a RAM and is responsive to a LAN downloaded command to load said EPROM with the ROM firmware image stored in the RAM; and wherein the load enable input is substantially grounded whenever said switch is open so as to prevent loading of a ROM firmware image into said EPROM.

27. A printer connected to a local area network (LAN), comprising:

a print engine which forms printed images from print data received from the LAN; and an interactive network board, interfaced to said print engine and to the LAN, for receiving the print data from the LAN and for providing the print data to said print engine, said interactive network board comprising:

an address bus;

a data bus;

an EPROM connected to said address bus and to said data bus, said EPROM including a load enable input;

a switch for switchably providing a load enable signal to the load enable input of said EPROM, the load enable signal for permitting a ROM firmware image to be loaded into said EPROM;

a flip flop for controlling switching actuation of said switch with an output thereof, said flip flop having an output terminal, a data terminal and a trigger terminal for clocking a signal at the data terminal to the output terminal;

a latch responsive to a first predetermined address on the address bus for latching at least one bit from the data bus so as to generate a first signal, the first signal being provided to the data terminal of said flip flop;

a power generator for generating the load enable signal and for providing the load enable signal to said switch, the load enable signal being generated in response to the first signal from said latch;

a decoder responsive to a second predetermined address on said address bus for generating a second signal, the second signal being provided to the trigger terminal of said flip flop so as to clock a signal at the data terminal to the output terminal; and a processor (1) for executing a print server program to transmit the print data received from the LAN to said print engine, and (2) for outputting a first predetermined bit pattern to the data bus to the first predetermined address so as to cause said latch to provide the first signal to the data terminal of said flip flop and to said power generator, and for accessing the second predetermined address so as to activate said decoder to generate the second signal and to provide the second signal to the trigger terminal of said flip flop;

wherein, when the second signal is applied to the trigger terminal of said flip flop, said flip flop transmits the first signal through to the output terminal, the transferred first signal controlling actuation of said switch so as to permit the load enable signal to be provided from said power generator to the load enable input of said EPROM.

* * * * *

UNITED STATES PATENT AND TRADEMARK OFFICE
CERTIFICATE OF CORRECTION

PATENT NO. : 5,550,997

DATED : August 27, 1996

INVENTORS : Tony K. Ip, et al.

It is certified that error appears in the above-identified patent and that said Letters Patent is hereby corrected as shown below:

Title page, Item

[56] References Cited

Insert --FOREIGN PATENT DOCUMENTS

```
    4117326    12/1992    Germany
    2070821     9/1981    U.K.
     512454    11/1992    Europe
     326053     8/1989    Europe--
```

Under U.S. PATENT DOCUMENTS, insert

```
--4,742,483    5/1988    Morrell                  395/112
  4,866,664    9/1989    Burkhardt, Jr. et al     395/200
  4,914,576    4/1990    Zelley et al             395/575
  4,974,199   11/1990    Verbanets, Jr. et al     395/275
  5,007,013    4/1991    Elms                     395/200
  5,018,079    5/1991    Shukunami et al.         364/519
  5,075,875   12/1991    Love et al.              395/117--
```

COLUMN 4:

Line 41, "be." should read --be--.

COLUMN 5:

Line 49, "ALAN" should read --A LAN--.

UNITED STATES PATENT AND TRADEMARK OFFICE
CERTIFICATE OF CORRECTION

PATENT NO. : 5,550,997

DATED : August 27, 1996

INVENTORS : Tony K. Ip, et al.

It is certified that error appears in the above-identified patent and that said Letters Patent is hereby corrected as shown below:

COLUMN 16:

Line 31, "hi-directional" should read --bi-directional--.

COLUMN 17:

Line 52, "hi-directional" should read --bi-directional--.

COLUMN 22:

Line 25, "De" should read --be--.

COLUMN 39:

Line 65, "configuration" should read --configurations--.

COLUMN 42:

Line 36, "and" should read --and common--.

COLUMN 52:

Line 24, insert: --CONTROL REGISTER #2    366 HEX (X)
                  NMILCK                  200 HEX (W)
                  LAN ADDR. ROM           340 - 35F HEX (R)--.

UNITED STATES PATENT AND TRADEMARK OFFICE
CERTIFICATE OF CORRECTION

PATENT NO. : 5,550,997

DATED : August 27, 1996

INVENTORS : Tony K. Ip, et al.

It is certified that error appears in the above-identified patent and that said Letters Patent is hereby corrected as shown below:

<u>COLUMN 61</u>:

Line 22, "20," should read --22,--.

Signed and Sealed this

Twenty-second Day of April, 1997

Attest:

Attesting Officer

BRUCE LEHMAN

Commissioner of Patents and Trademarks